United States Patent [19]
Takashima et al.

[11] Patent Number: 5,953,246
[45] Date of Patent: Sep. 14, 1999

[54] SEMICONDUCTOR MEMORY DEVICE SUCH AS A DRAM CAPABLE OF HOLDING DATA WITHOUT REFRESH

[75] Inventors: Daisaburo Takashima; Yukihito Oowaki, both of Yokohama, Japan

[73] Assignee: Kabushiki Kaisha Toshiba, Kawasaki, Japan

[21] Appl. No.: 08/845,035

[22] Filed: Apr. 21, 1997

Related U.S. Application Data

[63] Continuation of application No. 08/580,999, Jan. 3, 1996, abandoned.

[30] Foreign Application Priority Data

Jan. 5, 1995 [JP] Japan .................................. 7-000295
Jun. 2, 1995 [JP] Japan .................................. 7-136857

[51] Int. Cl.⁶ .................................................. G11C 11/24
[52] U.S. Cl. .......................................... 365/149; 365/227
[58] Field of Search .................................. 365/149, 227, 365/228; 257/349, 350

[56] References Cited

U.S. PATENT DOCUMENTS

| | | | |
|---|---|---|---|
| 4,204,277 | 5/1980 | Kinoshita | 365/203 |
| 5,161,121 | 11/1992 | Cho | 365/189.06 |
| 5,229,966 | 7/1993 | Ohsawa et al. | 365/189.09 |
| 5,309,010 | 5/1994 | Kitajima | 257/350 |
| 5,365,487 | 11/1994 | Patel et al. | 365/226 |
| 5,373,463 | 12/1994 | Jones, Jr. | 365/149 |

FOREIGN PATENT DOCUMENTS

| | | |
|---|---|---|
| 0 568 015 A2 | 11/1993 | European Pat. Off. |
| 0 568 015 A3 | 11/1993 | European Pat. Off. |
| 0 599 506 A1 | 6/1994 | European Pat. Off. |

OTHER PUBLICATIONS

T. Tanigawa, et al. "Enhancement of Data Retention Time for Giga–Bit DRAMs Using Simox Technology", *1994 Symposium on VLSI Technology Digest of Technical Papers*, 1994, pp. 37–38.

Hiroyuki Yamauchi, et al. "FA 14.1: A Sub–0.5μ A/MB Data–Retention DRAM", *1995 IEEE International Solid–State Circuits Conference*, ISSCC, 1995, pp. 244–245.

Richard Womack, et al. "FAM 16.3: A 16kb Ferroelectric Nonvolatile Memory with a Bit Parallel Architecture", *IEEE International Solid State Circuits Conference*, ISSCC, 1989, pp. 242–243.

*Primary Examiner*—David Nelms
*Assistant Examiner*—M. Tran
*Attorney, Agent, or Firm*—Oblon, Spivak, McClelland, Maier & Neustadt, P.C.

[57] ABSTRACT

A semiconductor memory device comprises a plurality of word lines, a plurality of bit lines intersecting the word lines, and memory cells selectively arranged at intersections of the word lines and the bit lines, and each consisting of a transistor and a capacitor, the transistor having a gate thereof connected to a corresponding one of the word lines, a drain thereof connected to a corresponding one of the bit lines, and a source thereof connected to an end of the capacitor and serving as a memory node, the capacitor having another end thereof connected to a plate electrode. In the semiconductor memory device, in an active mode assumed when a power supply is in an on state, that transistor of a memory cell which is connected to a selected one of the word lines is turned on, and those transistors of the other memory cells which are connected to non-selected word lines are in an off state. Further, in a standby mode assumed when the power supply is in the on state, when the power supply is in an off state, and when the power supply is turned on and off, the transistors of all the memory cells are in an off state.

21 Claims, 36 Drawing Sheets

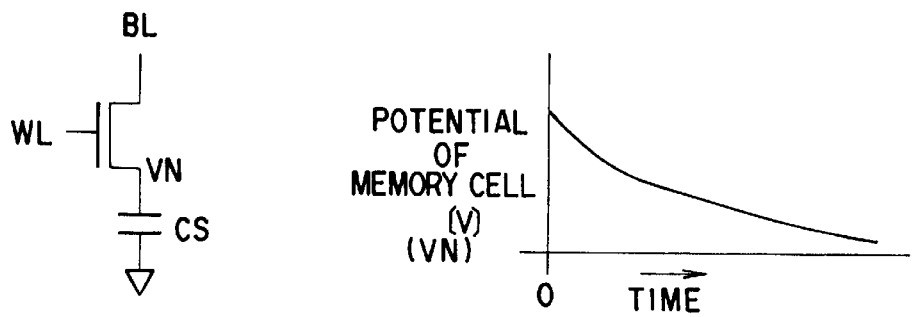
FIG. 1A (PRIOR ART)
FIG. 1B (PRIOR ART)
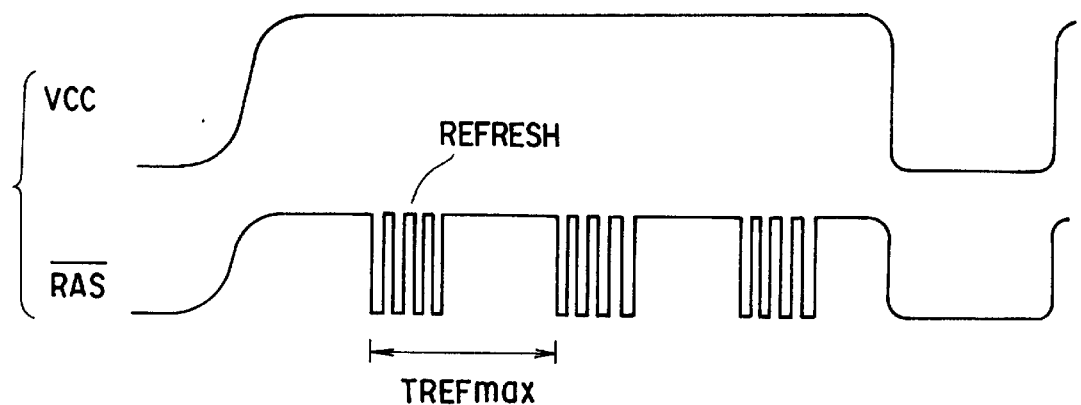
FIG. 1C (PRIOR ART)
| | KIND OF MEMORY | REWRITE TIMES | SPEED |
|---|---|---|---|
| MEMORY DATA IS HELD WHEN POWER OFF<br><br>NONVOLATILE MEMORY | MROM   EPROM<br>EEPROM<br>FRAM (FERROELECTRIC RAM) | FINITE<br>(~$10^5$) | SLOW |
| MEMORY DATA IS NOT HELD WHEN POWER OFF<br><br>VOLATILE MEMORY | DRAM   SRAM | INFINITE | FAST |
FIG. 3 (PRIOR ART)

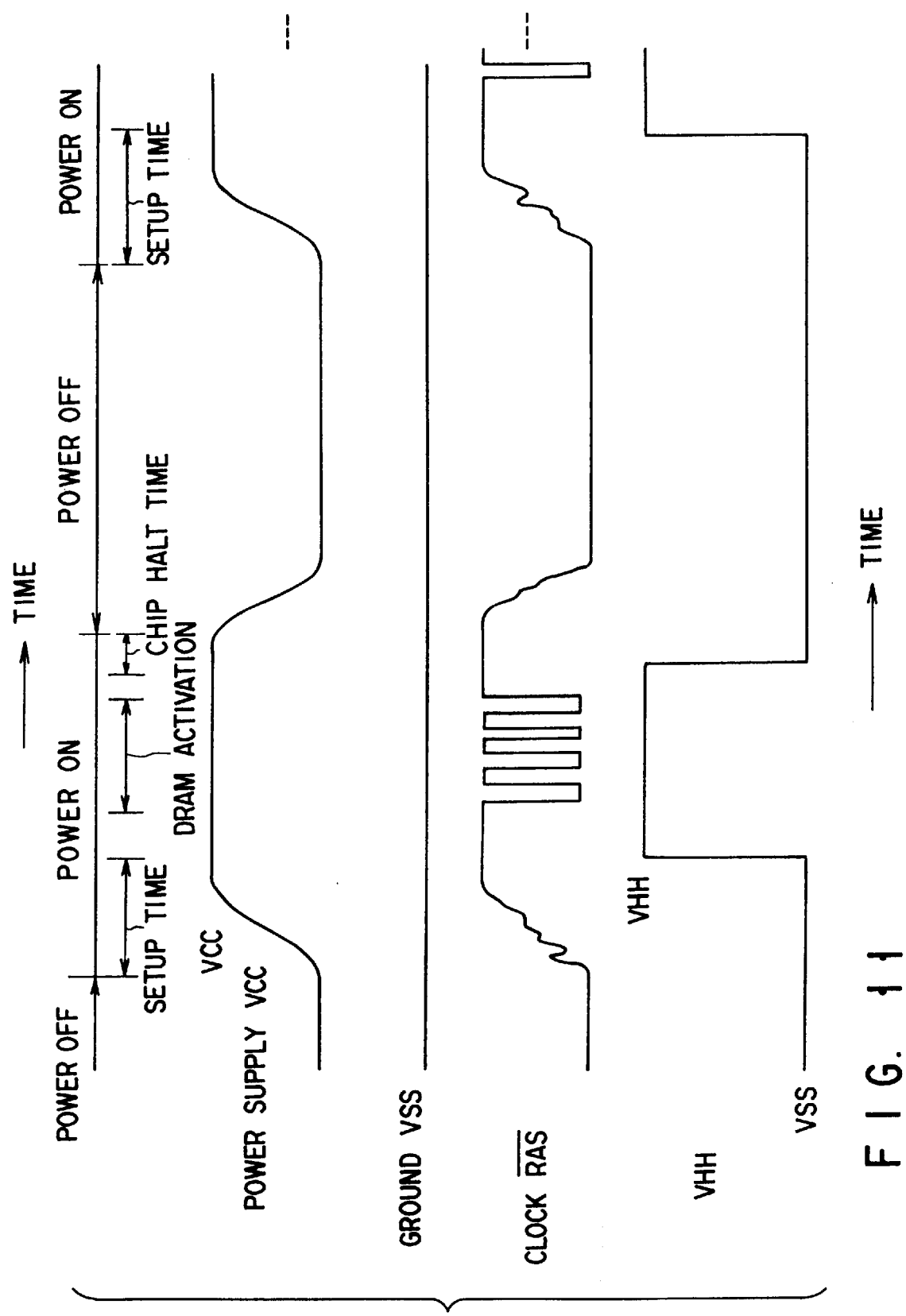
F I G. 11

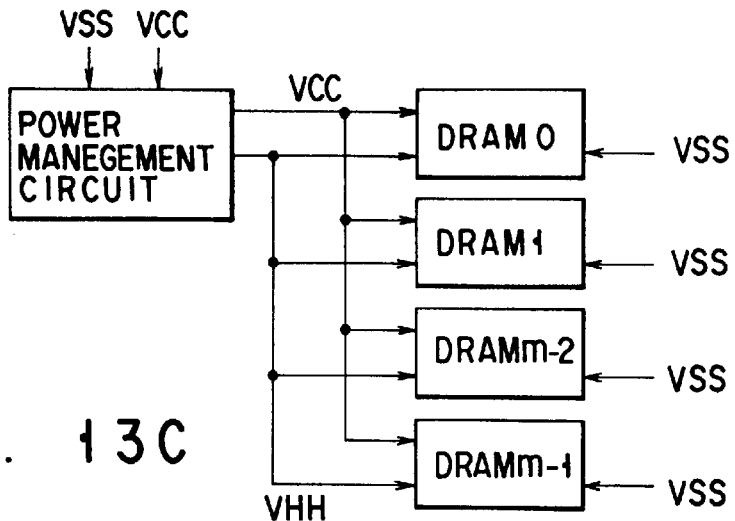
F I G. 13C
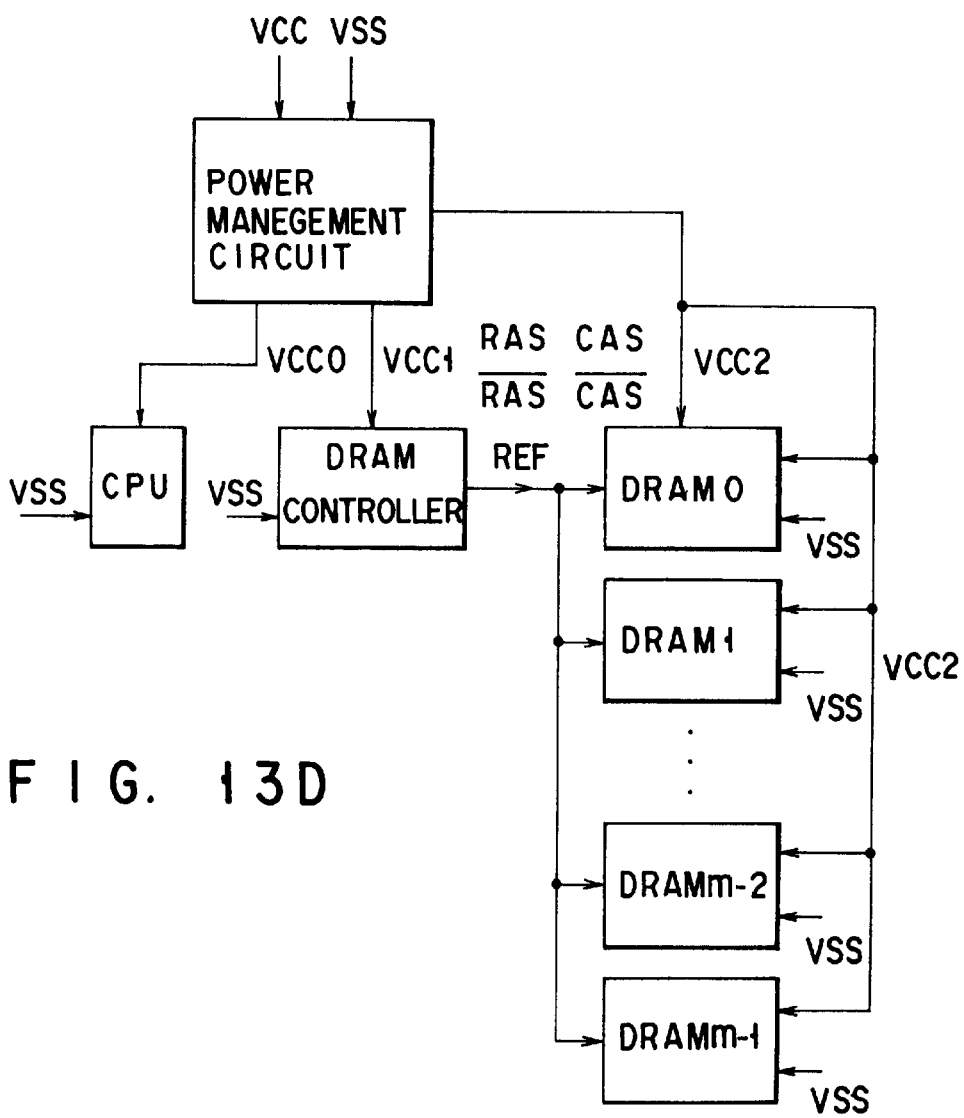
F I G. 13D

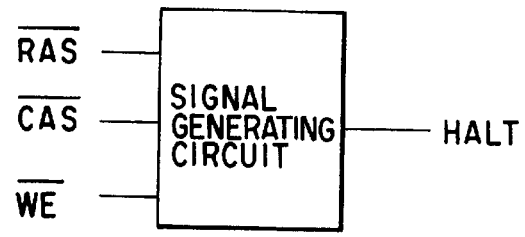
F I G. 16A
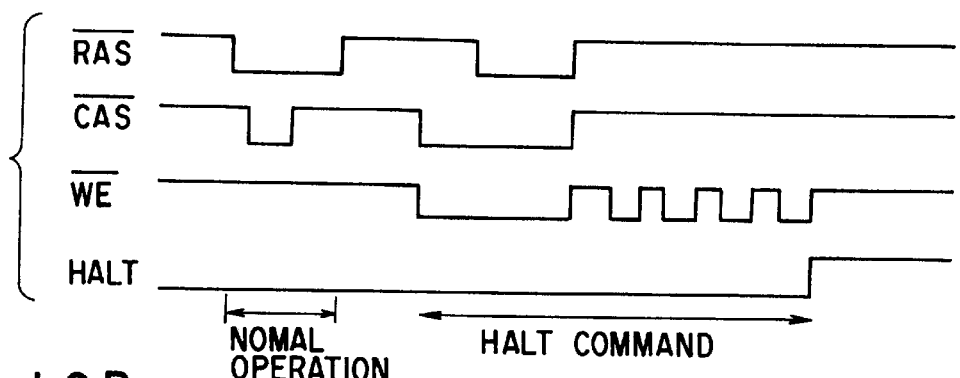
F I G. 16B
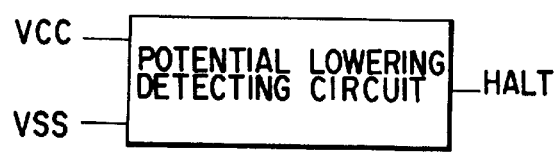
F I G. 17A
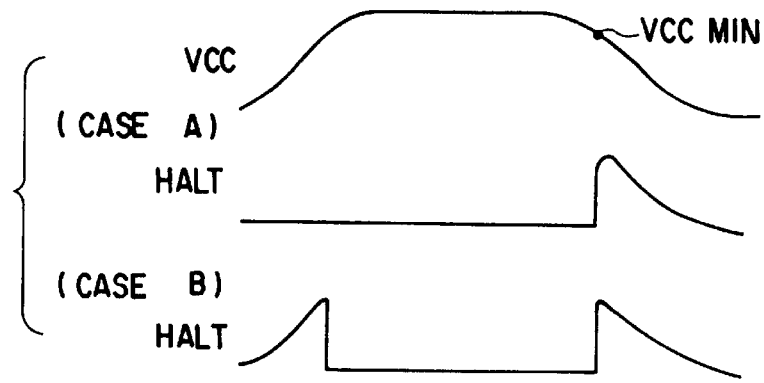
F I G. 17B

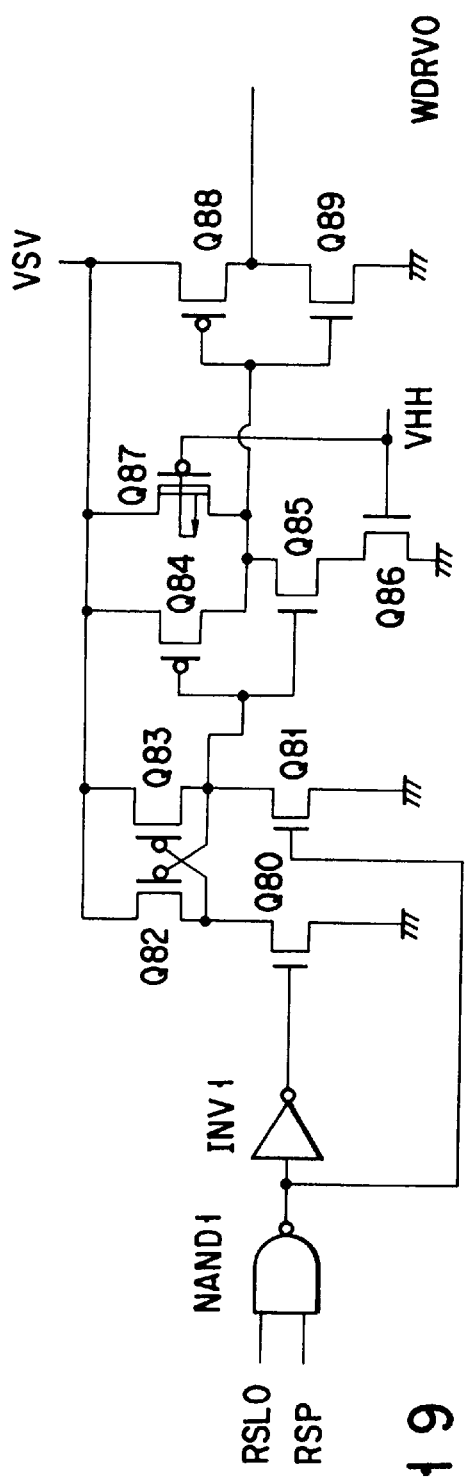
F I G. 19
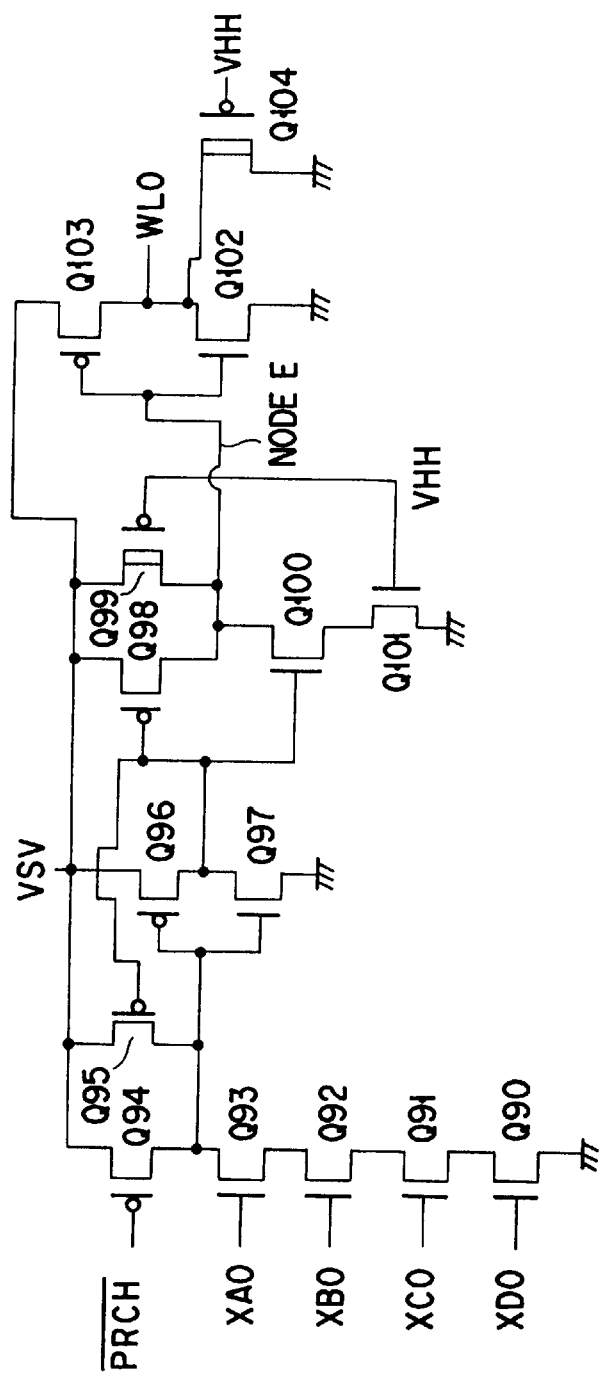
F I G. 20

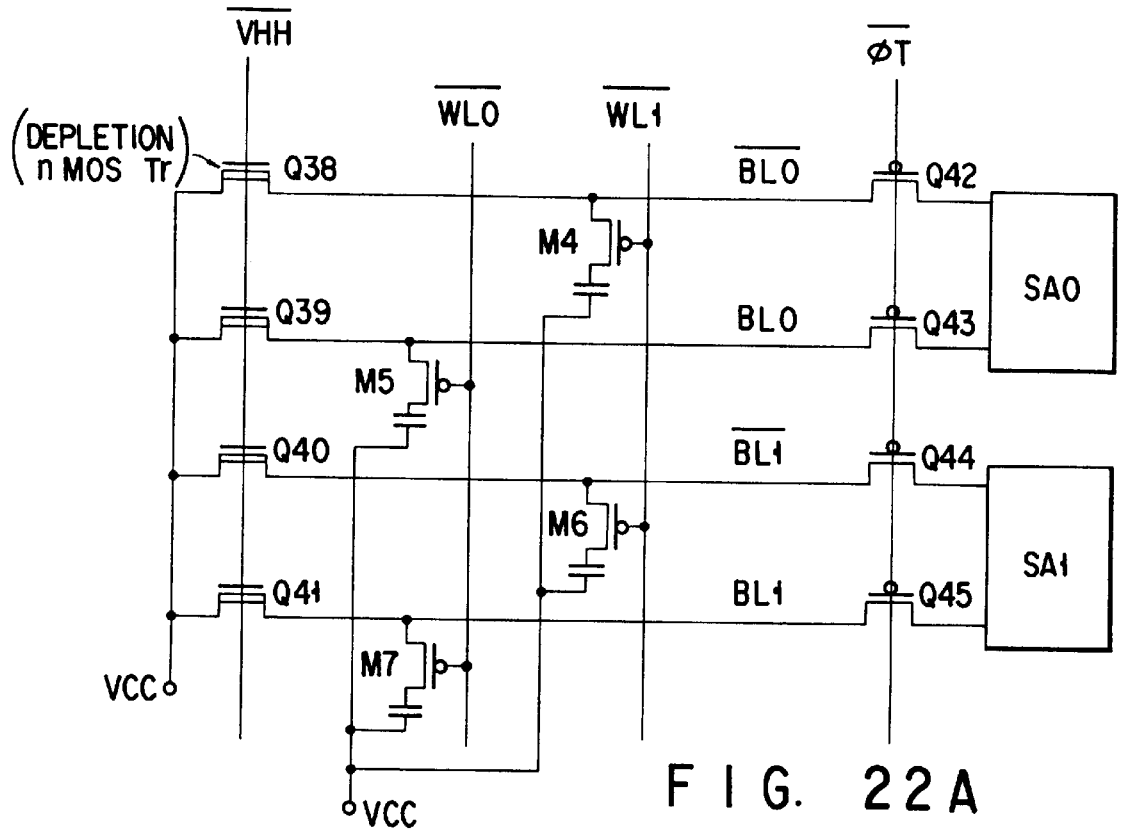
F I G. 22A
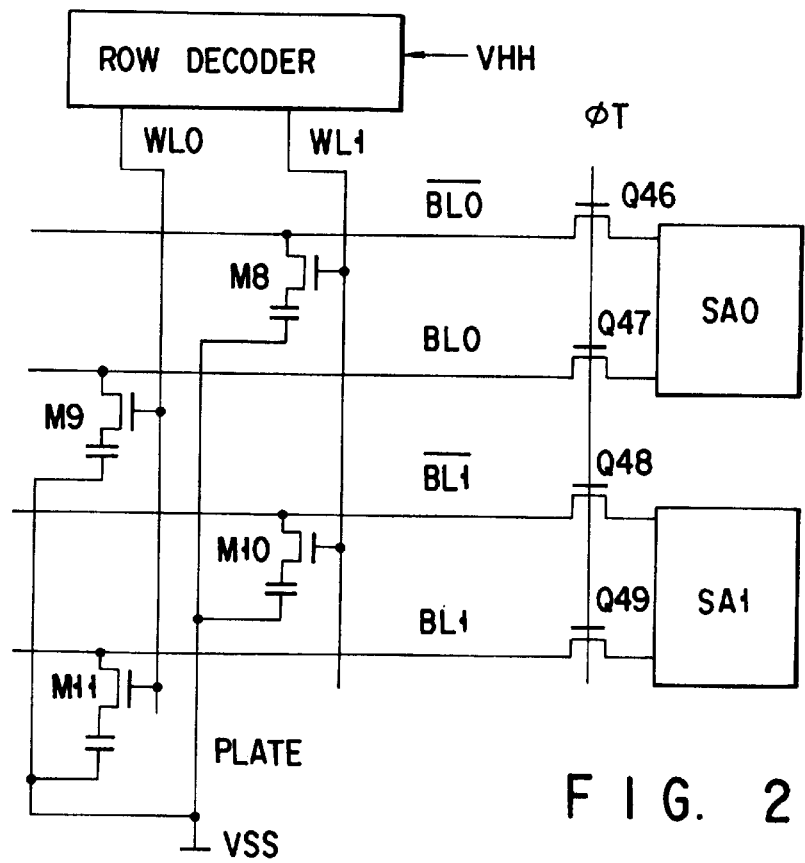
F I G. 23A (CASE A)

(CASE B)

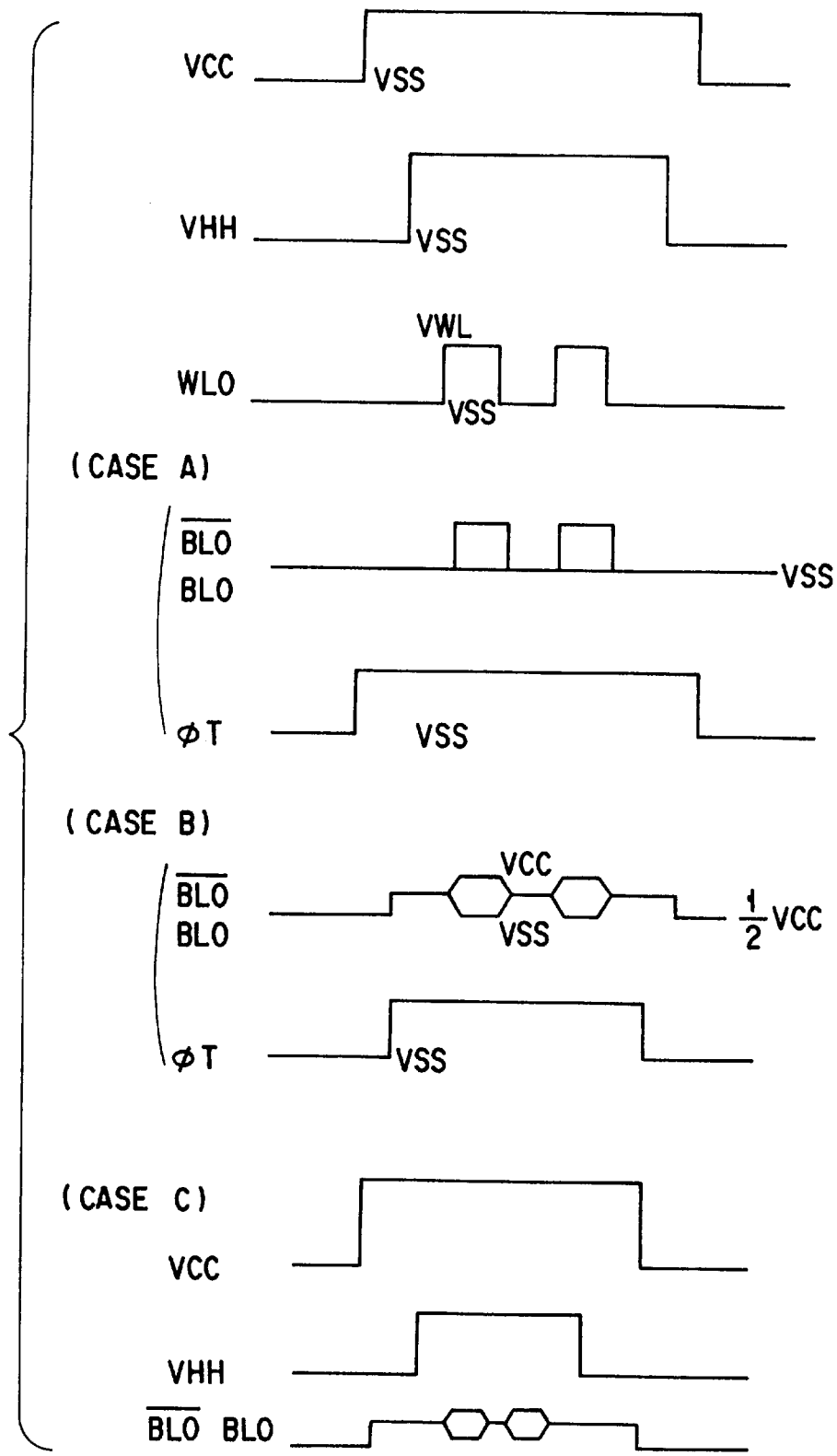
F I G. 23B

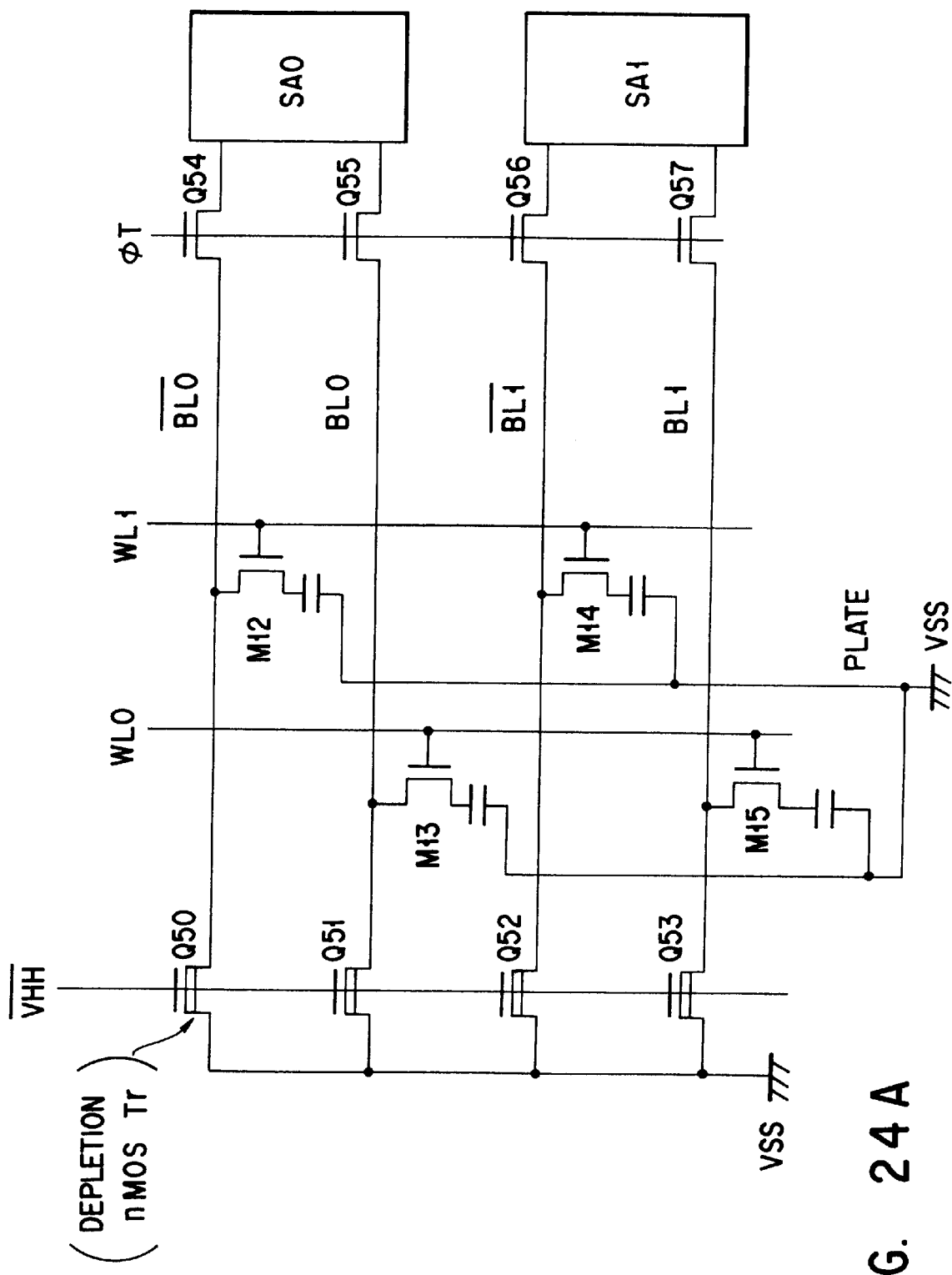
F I G. 24A

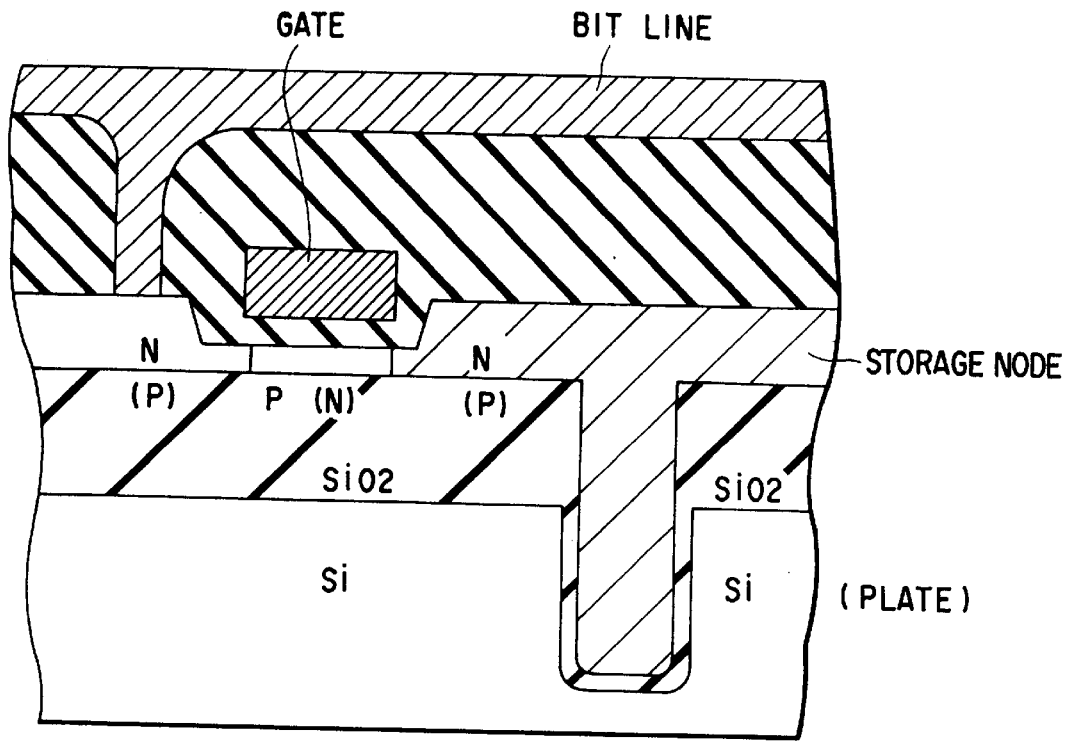
F I G. 28A
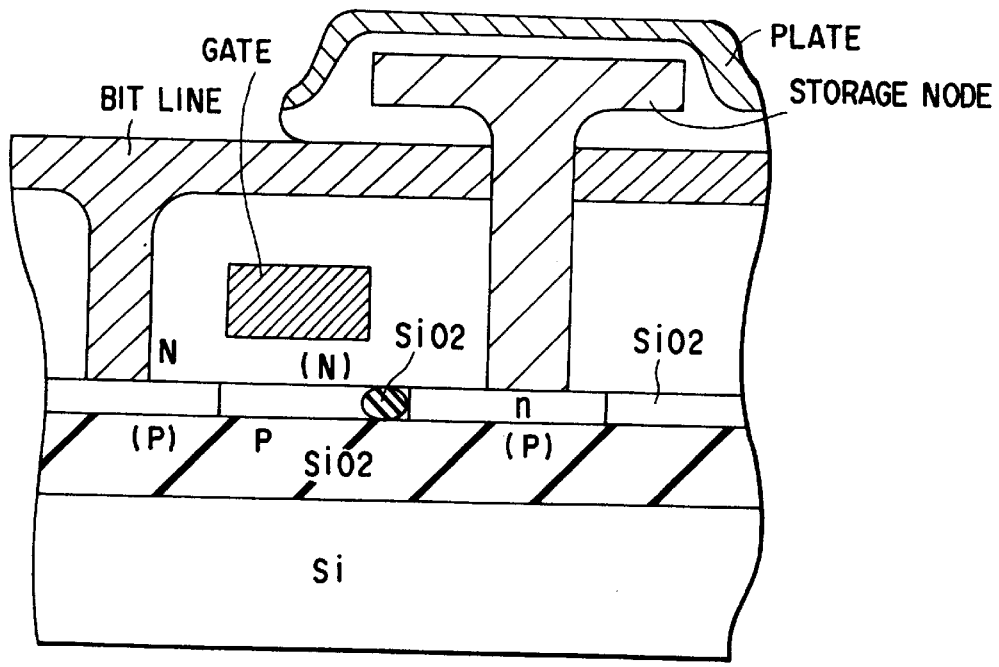
F I G. 28B

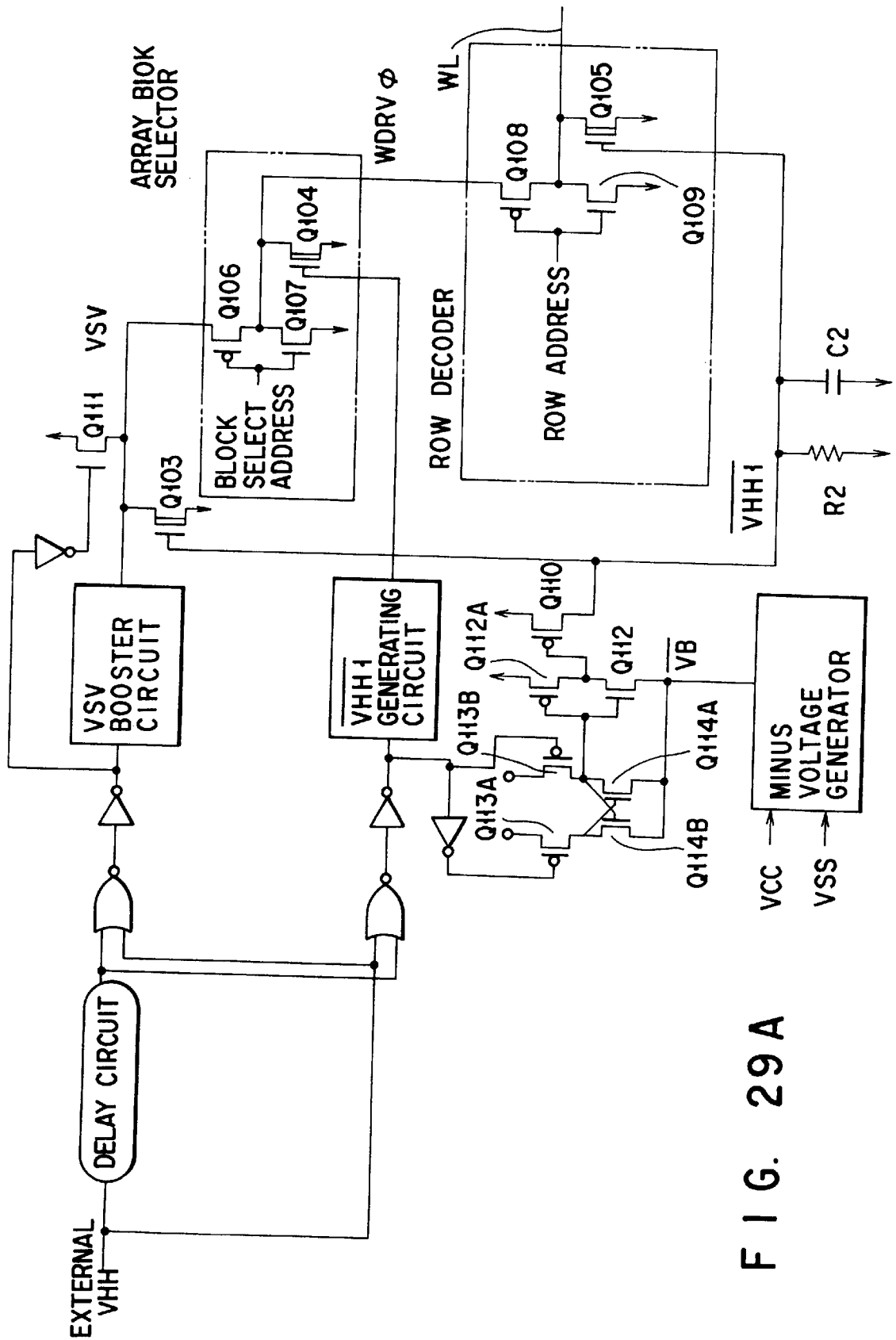
F I G. 29A

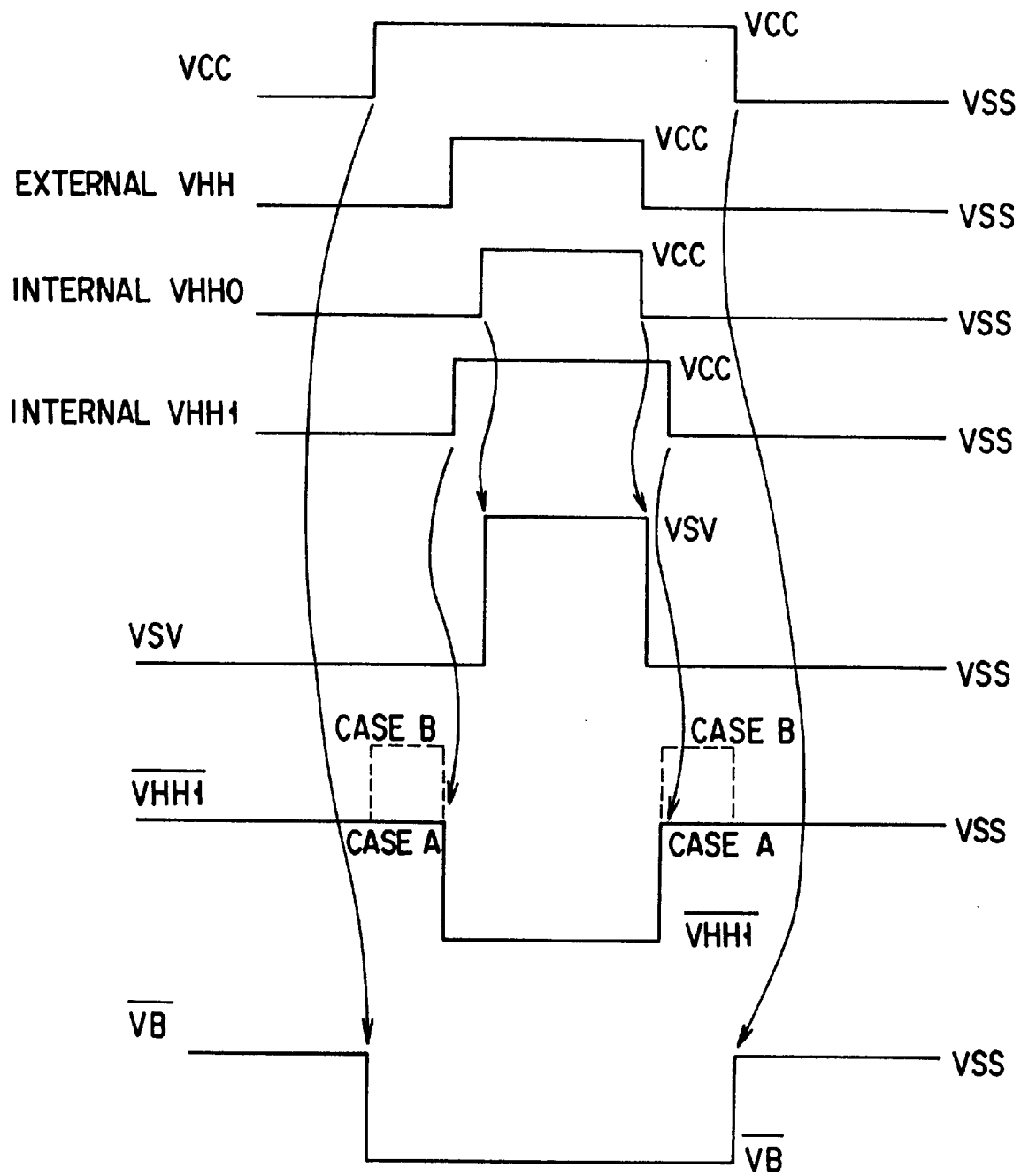
F I G. 29B

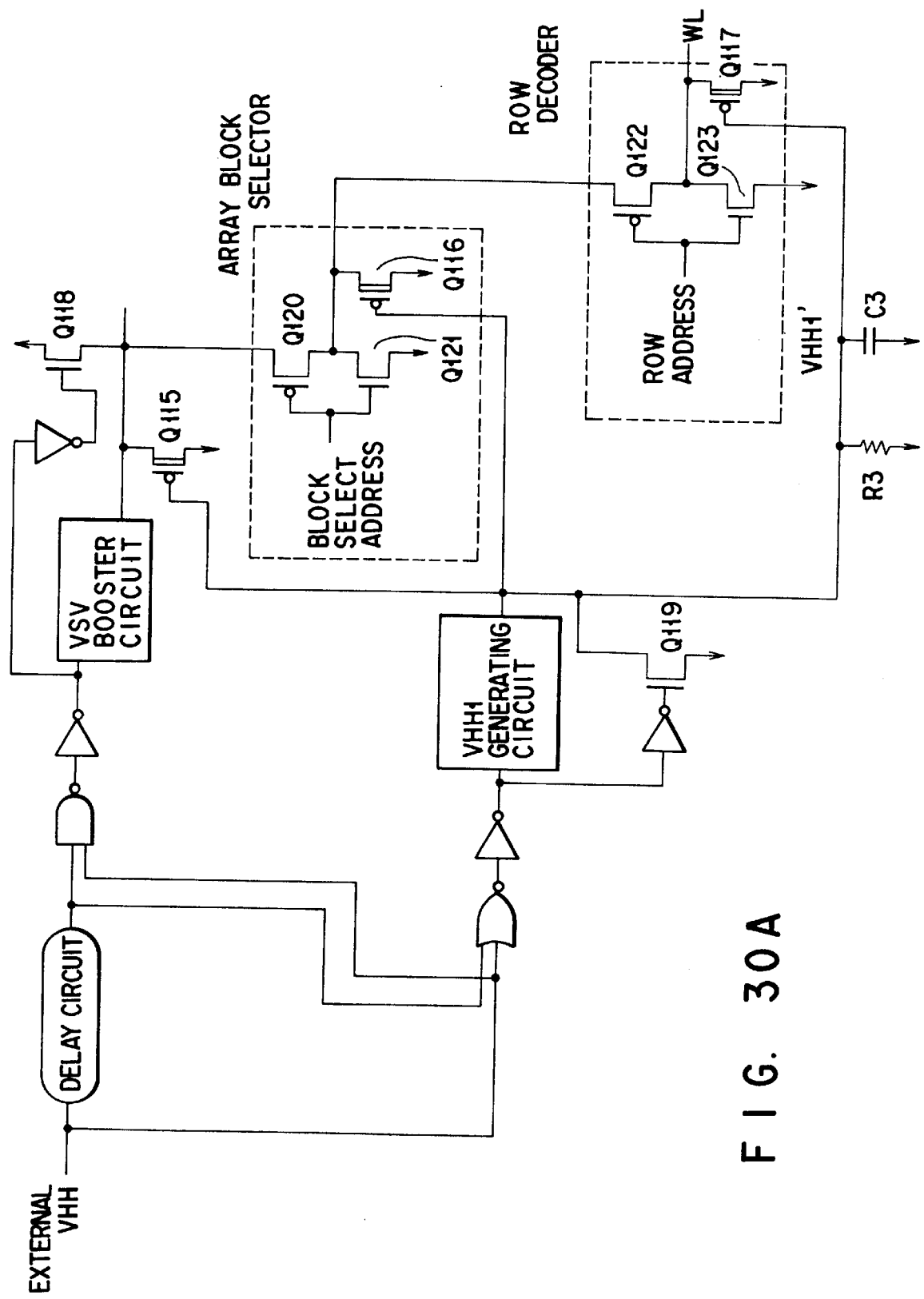
F I G. 30A

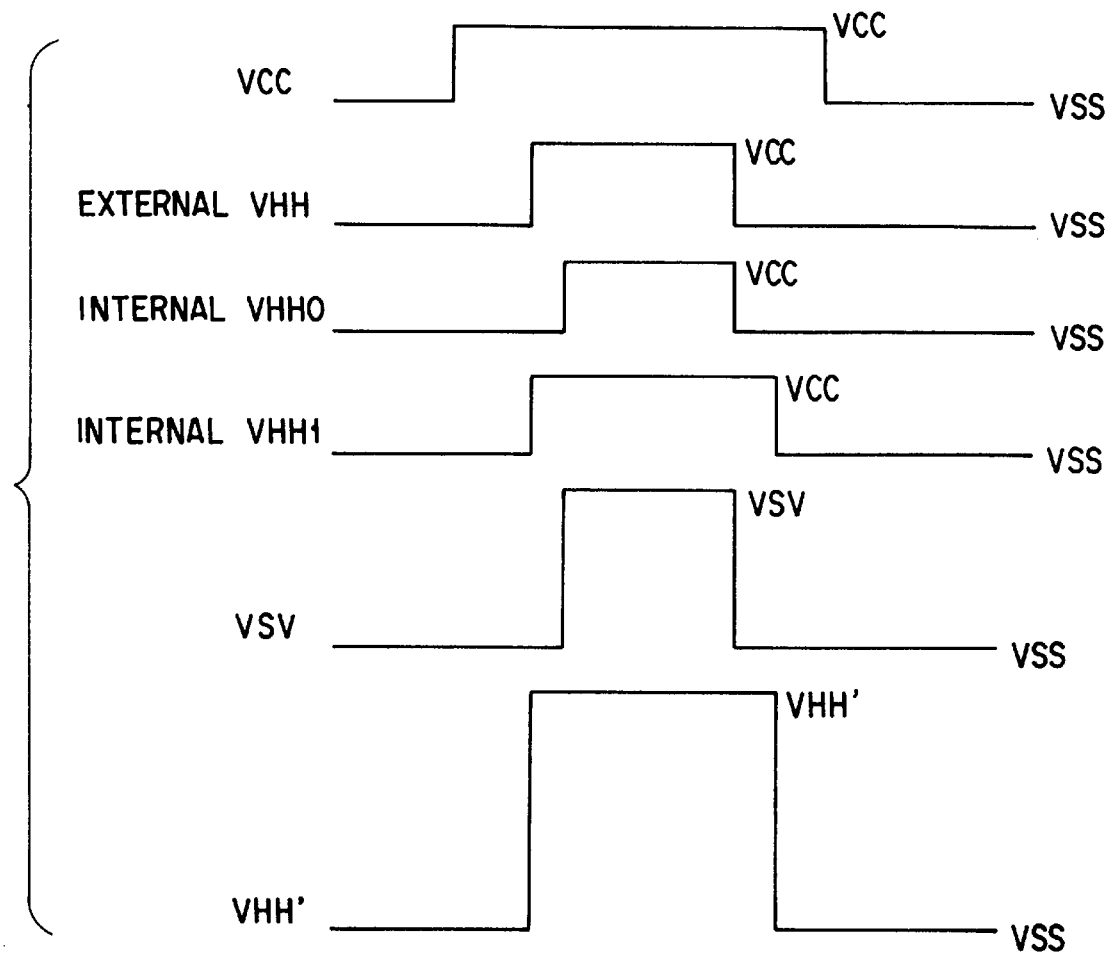
F I G. 30B

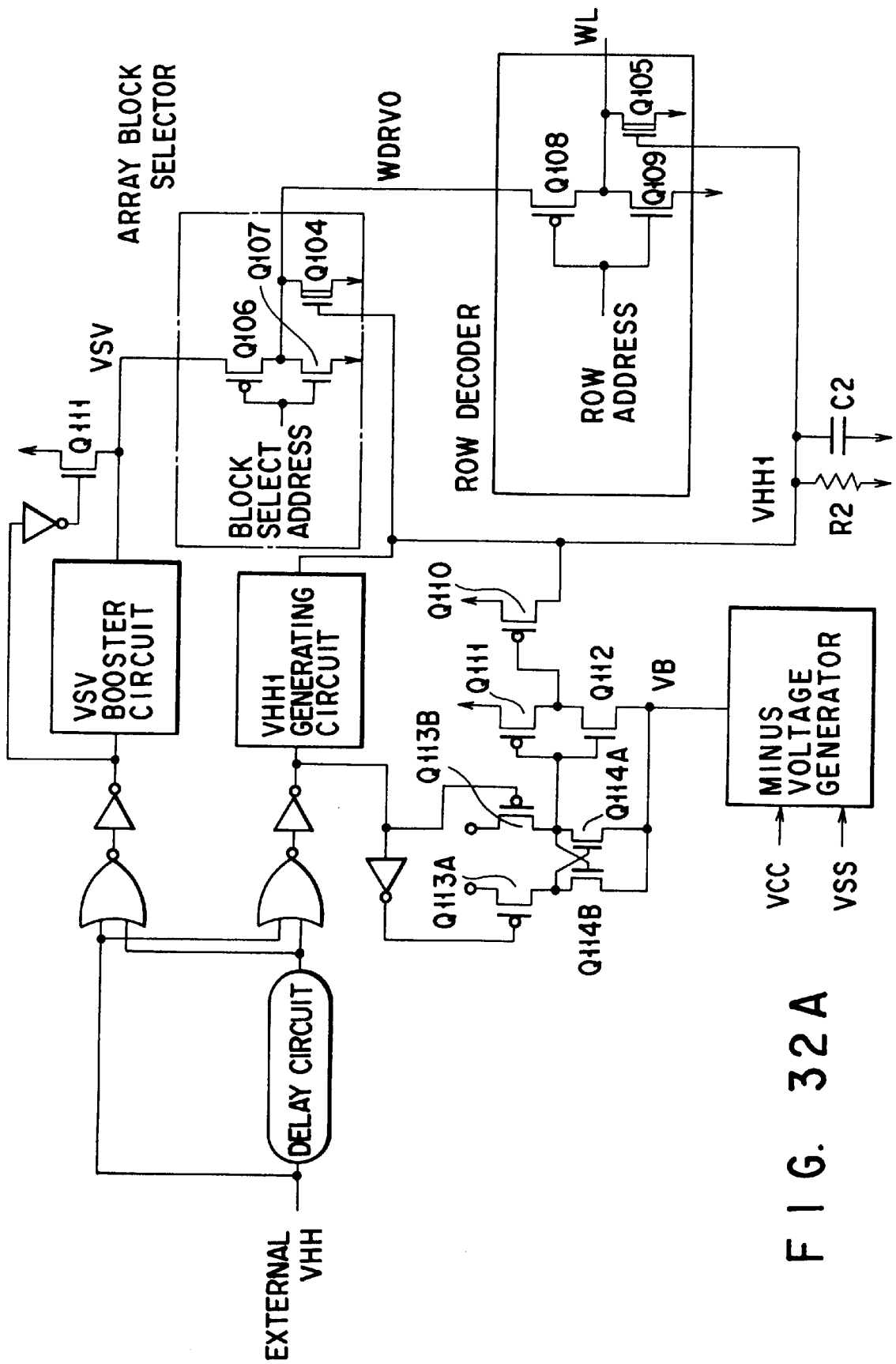
F I G. 32A

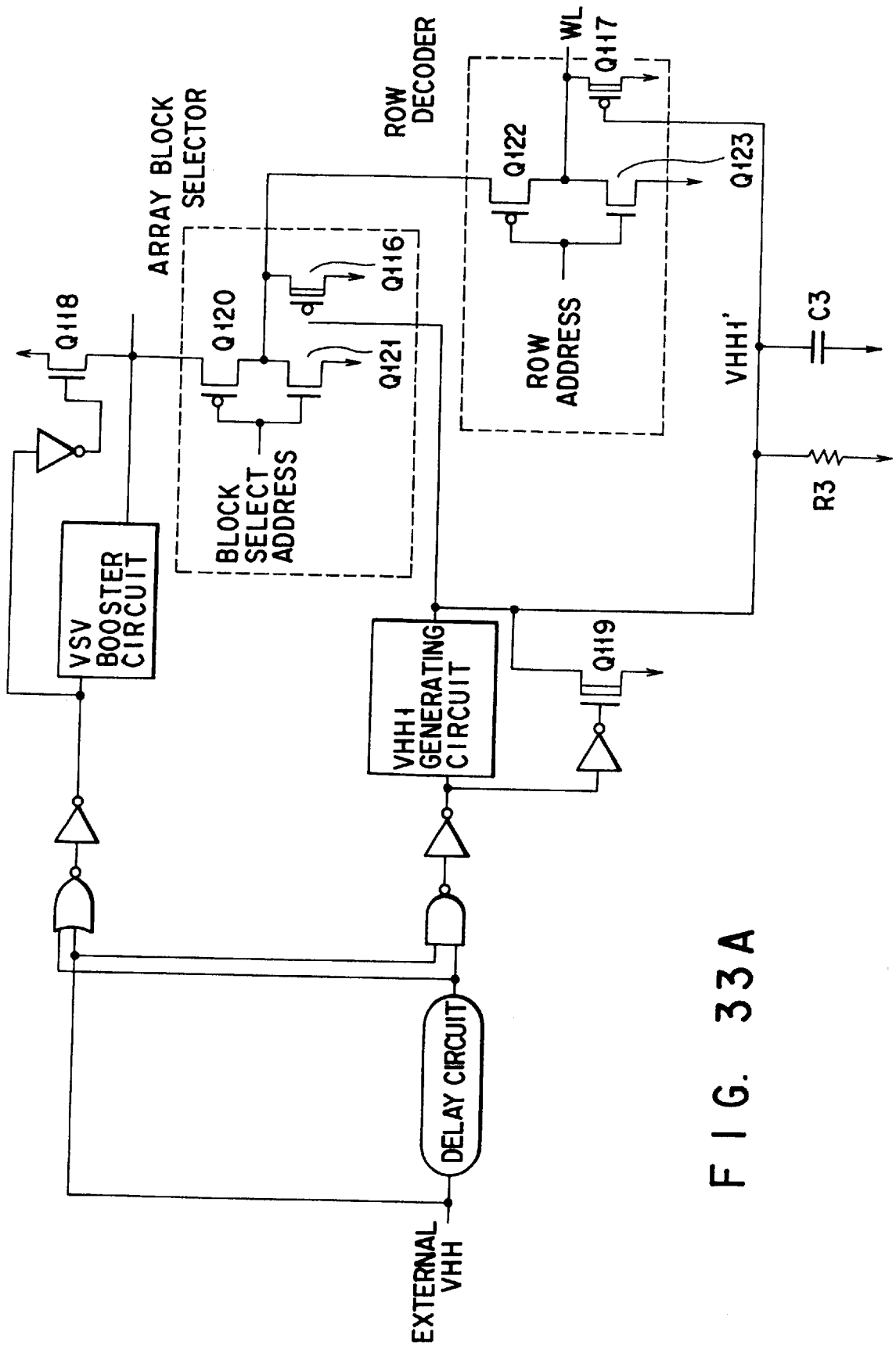
F I G. 33A

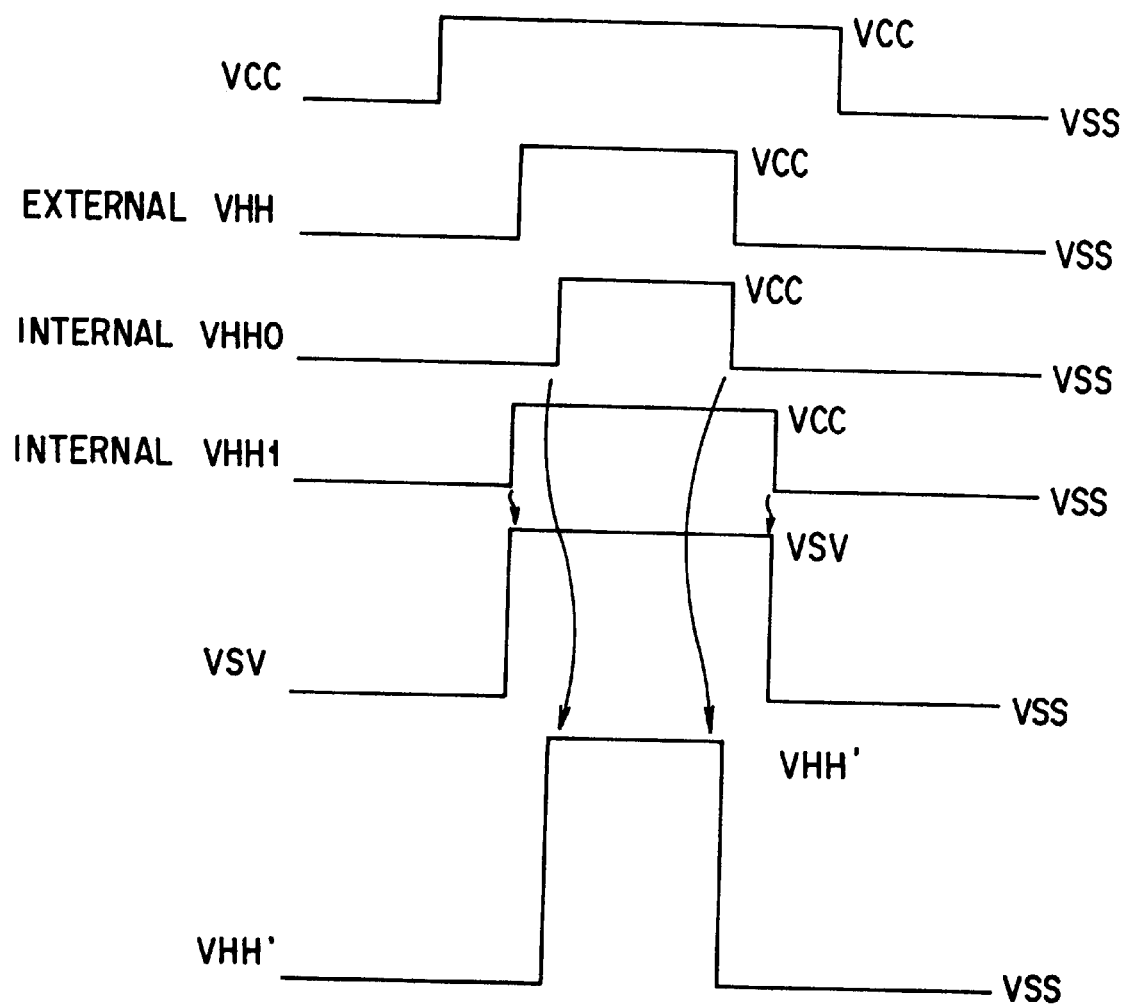
F I G. 33B

SEMICONDUCTOR MEMORY DEVICE SUCH AS A DRAM CAPABLE OF HOLDING DATA WITHOUT REFRESH

This application is a Continuation of application Ser. No. 08/580,999, filed on Jan. 3, 1996, now abandoned.

BACKGROUND OF THE INVENTION

1. Field of the Invention

This invention relates to a semiconductor memory device for storing data in a capacitor, and more particularly to a semiconductor memory device capable of holding stored data even when the power supply is turned off.

2. Description of the Related Art

At present, semiconductor memories are widely used in computers, automobiles, audio systems, videotape recorders, televisions, etc.

In particular, DRAMs (Dynamic RAM) are used more widely than the other types of memories, since each of their memory cells has a simple and small-size structure consisting of a memory cell and a transistor, can be made easily, and has high reliability, especially, in operational speed. 4 Mbit DRAMs and 16 Mbit DRAMs are now available. These DRAMs, however, have the following problems:

As is shown in FIG. 1A, each memory cell of the DRAM consists of a transistor and a capacitor. Cell data "1", for example, written in the capacitor is shifted to "0" with the passing of time, since a junction leak current flows from that diffusion layer on the source side of the transistor, which is mainly connected to a storage node VN, to a substrate or a well, and the potential of the cell lowers, as is shown in FIG. 1B.

As can be understood from the above, the DRAMs are volatile memories from which data will disappear with the passing of time. Therefore, it is necessary to perform a refresh operation for reading data, which is once written in the DRAM after turn-on of the power supply, and rewriting the data within a maximum data holding time. Moreover, when the power supply is turned off, the junction is forwardly biased and the cell transistor is turned on. As a result, the cell data will be lost.

FIGS. 2A and 2B show test results obtained when a conventional 64 Kbit DRAM test device is turned off and then turned on to read cell data.

Specifically, FIG. 2A shows test results obtained when data is written into a memory cell, and read after 0.4 second standby (i.e., after the data is held 0.4 second), with the power supply kept on. The abscissa indicates the plate potential (VPL), while the ordinate indicates the bit line precharge voltage (VBL). As is evident from FIG. 2A, the cell data is held in the conventional DRAM standby system.

FIG. 2B shows test results obtained when data written in a memory cell of the same device is read therefrom after the power supply is turned off 0.4 second and again turned on. In FIG. 2B, the abscissa indicates the plate potential (VPL), and the ordinate indicates the bit line precharge voltage (VBL). FIG. 2B shows that the cell data is lost in the conventional DRAM system, whichever values the VPL and VBL have.

The FIG. 2B results occur from the fact that the plate potential lowers from Vcc/2 to 0V, and also from the fact that the internal circuit erroneously operates when the power supply is in the on and off states, which causes erroneous word line selection and accordingly word line floating when the power supply is on and off states, resulting in memory cell charge leakage so that data is lost.

For example, when the power supply is turned off in a case where the conventional plate potential is Vcc/2 and data "0" is written (i.e. a voltage Vss is written), the plate potential becomes Vss, and the storage node potential becomes −Vcc/2. Then, the transistor serving as an nMOS transfer gate is turned on, and the pn junction is forwardly biased, with the result that data "0" is lost.

FIG. 3 shows various types of semiconductor memories. An SRAM (Static RAM) is a volatile memory, which can operate at high speed as the DRAM and requires no refresh operation, and in which cell data is completely lost after the power supply is turned off.

On the other hand, an MROM (Mask ROM), an EPROM, an EEPROM, an FRAM (Ferroelectric RAM), etc. are included in a non-volatile memory in which data is not lost when the power supply is turned off. These memories are, however, not speedy in reading and writing, and further the number of write cycles is limited therein. For example, the MROM cannot rewrite data, while the EPROM, EEPROM, etc. can rewrite data $10^5$ times at maximum. This is because in these memories, data is written or erased by passing electrons through the gate oxide film by tunneling, etc., in other words, by destructing the memory cells in principle. The EPROM, EEPROM, etc. are not speedy in writing.

The FRAM stores data using polarization created by a ferrodielectric film employed therein. The FRAM is not excellent in film reliability and in the circuit for rewriting (it can perform about $10^5$ to $10^{11}$ times of write cycles).

In addition, the power voltage must be set low in order to enhance the reliability of the highly integrated memory device (DRAM, etc.) and to save its power consumption. On the contrary, the threshold voltage of the memory cell cannot be set so low in order to restrain an increase in the sub-threshold current flowing through the transistor. Accordingly, the DRAM cannot be operated at high speed if it is highly integrated.

If both the power voltage and the threshold voltage are reduced so as to make the speed of the memory device according to the speed of a CPU, etc., the leak current which occurs in the power-on state will increase exponential rate in accordance with the generations of DRAMs, as is shown in FIG. 4. The inventors of the present invention have proposed a method for reducing the amount of the leak current at the time of battery backup mode (sleep mode) or standby mode in order to elongate the life of the battery (Japanese Patent Application KOKAI No. 6-208790). However, there is no method for eliminating the occurrence of the leak current.

As explained above, in the conventional DRAMs, a high speed operation can be performed, and the number of write cycles is limitless. Actually, however, they are disadvantageous in that i) refresh operation must be performed so often even where the power supply is in the on state, that ii) cell data is lost when the power supply is once turned off, and no more exists when the power supply is again turned on, and that iii) power consumption is great because of leak current even in the standby mode or in the sleep mode. On the other hand, the other non-volatile memories are limited in the number of write cycles, and hence cannot be used for various purposes as compared with the DRAM and SRAM.

SUMMARY OF THE INVENTION

It is the object of the invention to provide a semiconductor memory device having a structure similar to that of a DRAM, and capable of holding data without a refresh operation, even when a power supply is again turned on after it is turned off.

According to a first aspect of the invention, there is provided a semiconductor memory device comprising: a plurality of word lines (WL); a plurality of bit lines (BL) intersecting the word lines; and memory cells (M) selectively arranged at intersections of the word lines and the bit lines, and each consisting of a transistor and a capacitor (C), the transistor having a gate thereof connected to a corresponding one of the word lines, a drain thereof connected to a corresponding one of the bit lines, and a source thereof connected to an end of the capacitor and serving as a memory node, the capacitor having another end thereof connected to a plate electrode; wherein in an active mode assumed when a power supply is in an on state, that transistor of a memory cell which is connected to a selected one of the word lines is turned on, and those transistors of the other memory cells which are connected to non-selected word lines are in an off state; and in a standby mode assumed when the power supply is in the on state, when the power supply is in an off state, and when the power supply is turned on and off, the transistors of all the memory cells are in an off state.

In the structure according to the first aspect, the bias conditions between the gate, source and drain of each transistor (serving as a transfer gate) of a memory cell, and further the reverse directional bias conditions between the substrate and the source of the transistor are controlled so that only the transfer gate of the memory cell connected to a word line selected in an active mode in the power-on state can be turned on, the transfer gate transistors of the other memory cells which are not selected in the active mode can be kept in the OFF-state, and the memory cells can be kept in the OFF-state in the standby mode, at the time of turning on and off the power supply and in the OFF-state of the power supply. Thus, until data is again read by turning on the power supply after turning off the same, cell charge is prevented from leaking from the capacitor of the storage node to another node, which means that cell data is prevented from being lost.

Preferably, the semiconductor memory device according to the first aspect of the present invention further comprises the following structures:

(1) Each of the transistors is a pMOS transistor or an nMOS transistor formed on an insulating layer.

Making each memory cell have an SOI structure enables a pn junction connected to the storage node to be formed only by the channel portion of the transistor (in other words, to enable a pn junction between the source of the transistor and a substrate to be omitted), thereby eliminating pn junction current leakage and enables the time period from the turn-off of the power supply to the turn-on of the same to be further elongated. This is because a little channel leak current in the OFF-state of the transistor, or a little leak current in a capacitor insulting film determines the cell charge holding time period.

(2) The difference in potential between the word lines and the plate electrode is constant when the transistors are in the off state, irrespective of whether the power supply is in the on state or in the off state, while the potential of the bit lines is equal to or higher than the potential of the word lines when the transistors are nMOS transistors, and is equal to or lower than the potential of the word lines when the transistors are pMOS transistors.

This structure can provide transistor bias conditions for keeping the transistors off even when the power supply is turned off. The memory cell data can be held even when the power supply is turned off, if the bit line potential can be set equal to or higher than the word line potential in the case of using pMOS transistors, or equal to or lower than the same in the case of using nMOS transistors, while a potential difference therebetween assumed when the transistors are in the OFF-state is kept constant.

(3) The plate electrode is connected to a potential Vss when the transistors are nMOS transistors, irrespective of whether the power supply is in the ON-state or in the OFF-state, and is connected to a power voltage Vcc when the transistors are pMOS transistors, irrespective of whether the power supply is in the ON-state or in the OFF-state.

In the case of using the nMOS transistors, keeping the plate potential at Vss enables the storage node potential to be kept constant even when the power supply is turned off, and keeping the gate potential at Vss in the OFF-state of the transistor enables the potential between the gate and source of the transistor to be kept 0 V, thereby preventing loosing cell data. In the case of using the pMOS transistors, setting the plate potential at Vcc in the ON-state of the power supply, and setting the gate potential of the transistor at Vcc in the OFF-state of the transistor enables the transistor to be kept off even when the power supply is turned off and both the nodes are set to Vss, thereby preventing data being lost.

(4) Supposing that the threshold voltage of the cell transistor is a voltage which will cause a current of 1 $\mu$A to flow therethrough, the threshold voltage is set to (S factor)× 10 or more, and more preferably to (S factor)×18 or more.

If such as an SOI transistor is used in each memory cell, no junction leak current will flow, and main leak current flow through a cell transistor. If the cut-off characteristics of the cell transistor is enhanced, the power supply for the DRAM can be kept off for a long time. If the threshold voltage of the cell transistor is set to a value of 10 times of S factor or more, data can be held even if the power supply is kept off about one minute. If data can be held about one minute, the power-off operation will be very effective. Further, if the threshold voltage is set to a value of 18 times of S factor or more, data can be held for 10 years. Thus, the memory device of the invention can be used as a non-volatile memory although it has the same structure as DRAMs.

In a case where the power-on current is 20 mA, the power-on time period 200 $\mu$s, and the standby current is 100 $\mu$A, the power-off operation is effective if the device has pause characteristics of 40 ms or more. In the case where the pause time period is 1 second and 1 minute, the standby current can be reduced to 1/30 and 1/1800, respectively.

(5) In the off state of the power supply, a node of the word (bit) line is connected to a ground potential by means of depletion type pMOS or nMOS transistors, such that the word (bit) line is set at the ground potential.

By virtue of this structure, a cell transistor in the OFF-state can be prevented from being turned on because of a potential difference between the word line and the plate due to various types of noise which may occur at the time of turning on or off the power supply.

Even in the OFF-state of the power supply in which no power voltage is supplied to all the circuits in the DRAM, the word lines are short-circuited with the plate. Further, depletion type transistors are used to enable the bit line to be short-circuited. Since the depletion type transistor is in the ON-state if its gate is set at 0 V, it can short-circuit nodes even in the OFF-state of the power supply.

(6) In the ON-state of the power supply, the plate potential is set lower than Vss in the case of using the nMOS transistors, and lower than Vcc in the case of using the pMOS transistors.

(7) The plate potential is set lower than Vss in the standby mode or active mode in the ON-state of the power supply, in other words, when the power supply is not in the OFF-state and is not turned on and off.

If in the case of using the nMOS transistors, for example, the plate potential is set to a negative value lower than Vss in the ON-state of the power supply, the storage node is set to a voltage higher than Vss in the OFF-state of the power supply. As a result, a potential difference between the word line and the storage node (a difference between the gate voltage and the source voltage) is set to a negative value to prevent noise at the time of turning on and off the power supply and in the OFF-state of the power supply, thereby making it difficult to turn on the transistor. Moreover, in the case where there is a substrate, a pn junction between the source and the substrate can be kept in a backward bias state even when noise occurs at the time of turning off the power supply.

(8) An Si layer which constitutes at least part of a channel portion of each transistor is thinner than the thickness of an Si layer which constitutes the source or drain of the transistor.

Since in the case of the SOI transistors, current leak is mainly found in a cell transistor, the amount leak current at the time of turning off the cell transistor by making the Si layer which constitutes at least part of a channel portion of each transistor, thinner than an Si layer which constitutes the source or drain of the transistor. Furthermore, the amount of leak current in the OFF-state of the transistor can be further reduced by inserting an insulator between the source or drain and the channel.

(9) An insulator is inserted between the source or drain and the channel, or partially inserted in the channel portion.

(10) A word line driving voltage is equal to the ground potential when the power supply is turned on and off, and is in the off state.

(11) A word line driving power voltage is shifted from low level to high level after the power supply is turned on, and shifted from high level to low level before the power supply is turned off.

(12) Depletion type nMOS transistors or depletion type pMOS transistors have their drains connected parallel to word line driving transistors located in the last stage of the row decoder, and their sources grounded.

(13) Depletion type nMOS transistors or depletion type pMOS transistors have their drains connected to the output terminal of a circuit for selectively supplying a word line driving voltage to the row decoder, and their sources grounded.

(14) The potential of the plate electrode is set, in the on state of the power supply, to a value higher then 0 and lower than a threshold voltage VT of the transistor of each memory cell.

If the plate potential is at the voltage between the threshold voltage of the memory cell VT and 0V when the power supply is an ON-state, the memory cell transistor does not become to the ON-state since the difference between the voltage of storage node and that of the gate (WL) is lower than VT, even if the plate potential drops to 0V when the power supply is at an OFF-state.

According to a second aspect of the invention, there is provided a semiconductor memory device comprising a semiconductor memory chip which includes: a plurality of word lines (WL); a plurality of bit lines (BL) intersecting the word lines; and memory cells (M) selectively arranged at intersections of the word lines and the bit lines, and each consisting of a transistor and a capacitor (C), wherein the semiconductor memory chip has means for receiving, from the outside of the memory chip, a predetermined signal or a predetermined command before turn-on of a power supply, or for detecting the turn-on of the power supply, and means for receiving, from the outside of the memory chip, a predetermined signal or a predetermined command before turn-off of a power supply, or for detecting the turn-off of the power supply, so that data stored in the memory cells before the turn-off of the power supply can be held even when the power supply is again turned on after the turn-off thereof.

In the semiconductor memory device according to the second aspect, an external signal or command indicative of a time period required to stabilize the power supply, the internal circuits, etc. is input from the outside of the memory chip, or a circuit for indicating that a predetermined time period passes after the turn-on of the power supply is incorporated in the chip, so as to prevent turn-on of the memory cell transistor due to noise which will occur at the time of turning on or off the power supply. By virtue of this structure, the potentials of the word lines, the plate, the bit lines, etc. are fixed until the operation mode of the memory device is completely shifted to the standby mode, thereby avoiding lost of data.

In addition, the above signal, the command or the circuit enables the word line, the bit lines, the plate, etc. can be fixed to predetermined potentials irrespective of noise which will occur at the time of turning off the power supply, thereby protecting memory cell data from destruction.

According to a third aspect of the invention, there is provided a semiconductor memory device comprising: a memory cell array including a plurality of memory cells selectively arranged at intersections between a plurality of word lines and a plurality of bit lines, each of the memory cells consisting of a transistor and a capacitor; means for reducing the voltage of an external power supply, or a switch interposed between the external power supply and an internal power supply; and an internal voltage reducing circuit for setting, to a potential Vss, the voltage of the internal power supply or the reduced voltage of the external power supply irrespective of Vcc is supplied from the external power supply.

In the memory device according to the third aspect, in a case where the invention is applied to a DRAM in which an internal power voltage lower than an external power voltage is used, or where an internal power supply is used as well as an external power supply and a switch is interposed therebetween, the operation of the internal power supply is interrupted without turning off the external power supply and only by stopping the operation of a potential reducing circuit or turning off the switch to thereby reduce the internal power voltage to Vss. As a result, the power consumption of the internal circuits of the chip can be saved. Also in this case, the memory cell data can be held.

According to a fourth aspect of the invention, there is provided a semiconductor memory device comprising: a memory cell array including a plurality of memory cells each having a transistor and a capacitor; a controller for controlling the memory cell array; and means for turning off a power supply for the controller, while holding data written in the memory cell array.

According to the fourth aspect of the invention, there is provided another semiconductor memory device comprising: a memory cell array including a plurality of memory cells each having a transistor and a capacitor; a controller for controlling the memory cell array; and means for turning off a power supply for the controller and a power supply for the memory cell array, while holding data written in the memory cell array.

In the memory device according to the fourth aspect, since no DRAM controller is necessary in the sleep mode, the power consumption of the overall system can be saved by stopping the operation of the DRAM controller.

As is described above, the semiconductor memory device of the present invention can correctly read data written in a memory cell, after the power supply is once turned off and turned on again. This differs from the conventional DRAM in which data written in a memory cell is lost when the power supply is turned off. Moreover, since the semiconductor memory device of the present invention has high cut-off characteristics, the power supply can be kept off for a long time.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A to 1C are views, useful in explaining a conventional semiconductor memory device;

FIGS. 2A and 2B are views, showing pause characteristics of a conventional DRAM obtained when a power supply is kept on, and pause characteristics of the DRAM obtained when the power supply is once turned off and again turned on;

FIG. 3 is a table, showing the types of conventional semiconductor memories;

FIG. 11 is a view, showing driving signals employed in a second embodiment of the invention;

FIGS. 13A to 13D are block diagrams, showing a fourth embodiment of the invention;

FIGS. 16A and 16B are views, showing a modification of the sixth embodiment of the invention;

FIGS. 17A and 17B are views, showing another modification of the sixth embodiment of the invention;

FIG. 19 is a circuit diagram, showing an eighth embodiment of the invention;

FIG. 20 is a circuit diagram, showing a ninth embodiment of the invention;

FIGS. 22A and 22B are a circuit diagram and a view of driving signals, respectively, showing an eleventh embodiment of the invention;

FIGS. 23A and 23B are a circuit diagram and a signal waveform view, respectively, showing a twelfth embodiment of the invention;

FIGS. 24A and 24B are a circuit diagram and a view of driving signals, respectively, showing a fifth embodiment of the invention;

FIGS. 28A and 28B are sectional views, showing element structures according to a seventeenth embodiment of the invention;

FIGS. 29A and 29B are a circuit diagram and a signal waveform view, respectively, showing an eighteenth embodiment of the invention;

FIGS. 30A and 30B are a circuit diagram and a signal waveform view, respectively, showing a nineteenth embodiment of the invention;

FIGS. 32A and 32B are a circuit diagram and a signal waveform view, respectively, showing a twenty first embodiment of the invention;

FIGS. 33A and 33B are a circuit diagram and a signal waveform view, respectively, showing a twenty second embodiment of the invention;

DETAILED DESCRIPTION OF THE PREFERRED EMBODIMENTS

The embodiments of the invention will be explained with reference to the accompanying drawings.

First Embodiment

Figure 2A:
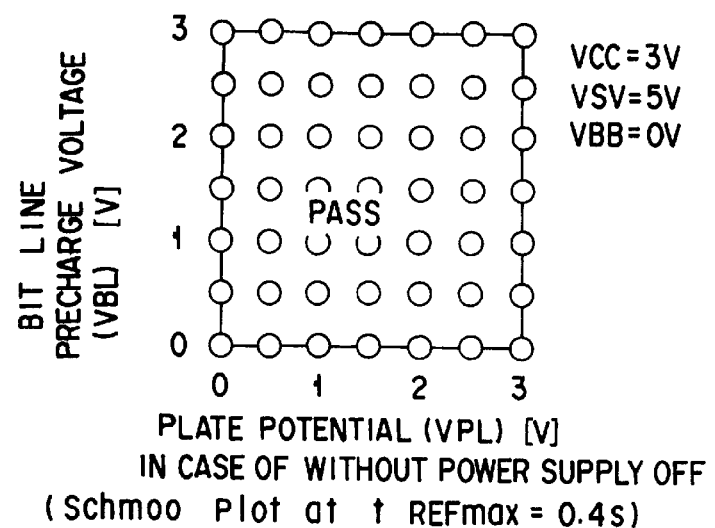
Figure 2B:
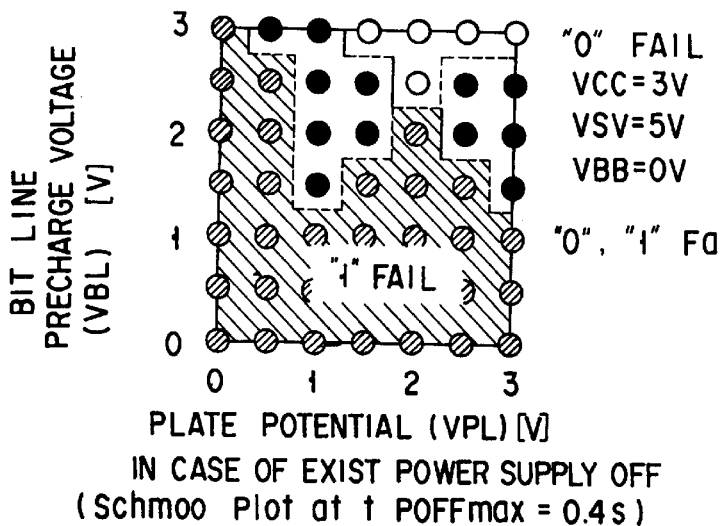
Figure 4:
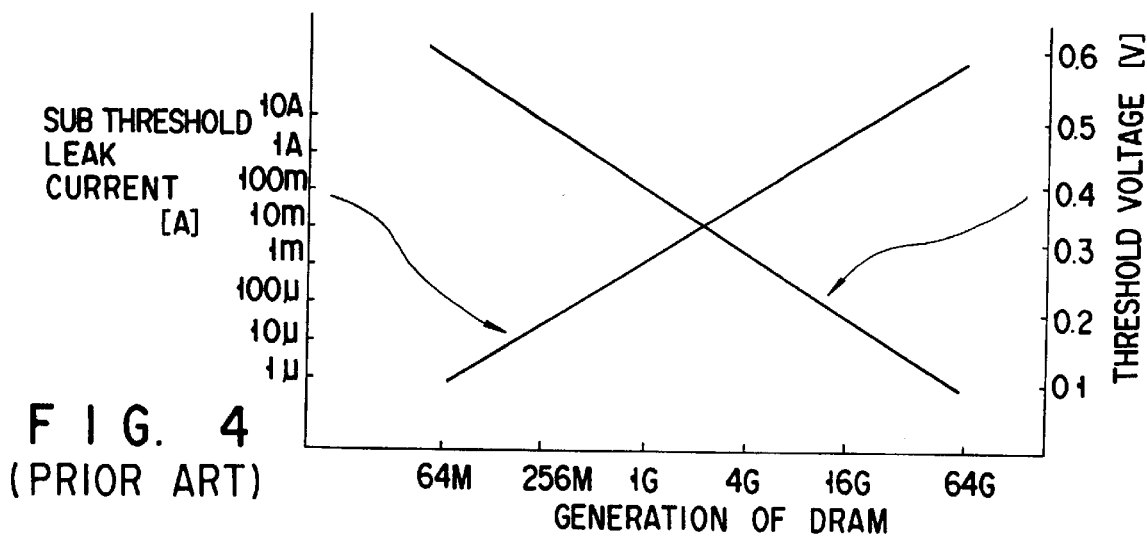
FIG. 4 is a graph, showing the relationship between DRAM generations, the leak current and the threshold voltage.
Figure 5A:
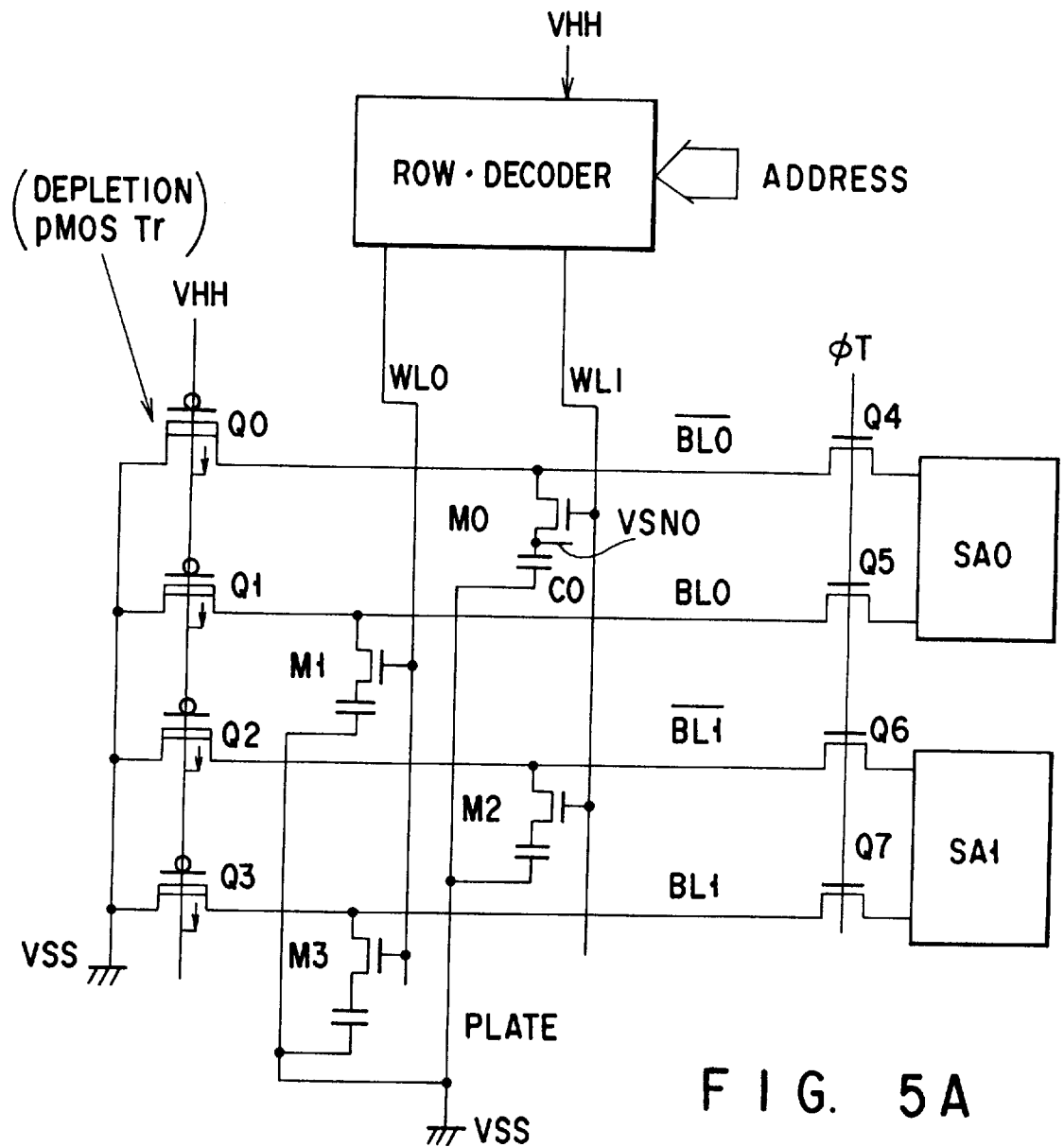
FIGS. 5A and 5B are circuit diagrams, showing a semiconductor memory device according to a first embodiment of the invention.
Figure 5B:
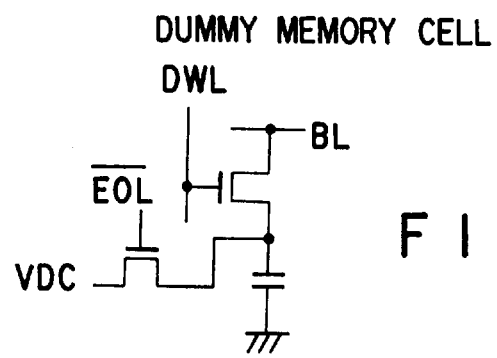

FIGS. 5A and 5B are circuit diagrams, showing a semiconductor memory device according to a first embodiment of the invention. As is shown in FIG. 5A, each of memory cells M0 to M3 consists of one transistor and one capacitor. Bit lines BL0, /BL0, BL1 and /BL1 read cell data. Each of word lines WL0 and WL1 for selecting the memory cells are controlled by a row decoder. Sense amplifiers SA0 and SA1 amplifies the fine potential difference between the bit lines BL0 and /BL0 and between the bit lines BL1 and /BL1. Transistors Q0 to Q3 connect the bit lines to a potential Vss, and is controlled by a VHH signal. Transistors Q4 to Q7 separate the cell array from the sense amplifiers, and is controlled by a $\phi$T clock signal.

In the first embodiment, various measures have been taken to enable data written in a memory cell of the DRAM to be read without destruction after the supply of a power voltage Vcc is once stopped and then started again.

First, the plate electrode is fixed at the potential Vcc/2 in the conventional case. On the other hand, in the embodiment of the invention, it is fixed at the potential Vss.

Suppose a case where the word line WL1 is selected and data "0" is written in the storage node VSN0 of the memory cell M0. The power supply is turned off after the data is written and the word line WL1 is returned to the potential Vss. In the conventional case where the plate electrode is set at the potential Vcc/2, the plate potential Vcc/2 lowers with the passing of time, and reaches Vss at last since the power supply is in the off state. Then, the potential of the storage node VSN0 lowers to −Vcc/2 because of coupling of a cell capacitor C0 of a large capacitance. At this time, both the word line WL1 and the bit line BL0 have the potential Vss.

Since at this time, the source (i.e. storage node) of the transistor of the memory cell M0 is at −Vcc/2, the gate (i.e. word line) of the same at the potential Vss, and the drain (i.e. bit line) of the same at the potential Vss, the transistor is in the on state, and the potential of the storage node is Vss−VT (which is lower than the potential Vss by the threshold voltage of the memory cell). In this state, most part of the memory cell data leaks to the bit line, which means that the memory cell data is lost.

Thereafter, the power supply is again turned on to return the plate potential to Vcc/2. Since at this time, the potential of the storage node is Vcc/2−VT>Vss, and the potential of the data is low, an erroneous operation will easily occur. Further, in a case where the DRAM includes bulk Si transistors, when the power supply is turned off, the pn diode is forwardly biased and the cell charge leaks, since the n-type storage node is at −Vcc/2 and the p-type substrate is at the potential Vss in the bias state of the pn junction of the storage node. As a result, the potential of the storage node becomes Vss−VB (VB represents the built-in voltage of the pn junction). When the power supply is again turned on, the potential of the storage node becomes −VB+Vcc/2>Vss, which means a significant reduction in signal amount and will cause an erroneous operation at the time of reading the data "0".

On the other hand, in the embodiment of the invention, the plate potential is set at Vss even when the power supply is in the on state. Therefore, even if all the bit line /BL0, the word line WL1 and the plate electrode become Vss after the storage node is set to Vss to write the data "0" and then the power supply is turned off, the bias conditions of the transistor of the memory cell M0 do not change, which means that the source, drain and gate of the transistors are all at Vss. Accordingly, the transistor is not turned on, and hence the storage node is kept at Vss even after the power supply is again turned on, which enables the stored data signal to be read without reducing the signal amount.

Moreover, in a case where there is a substrate, both the storage node and the substrate which constitute a pn junction are kept at Vss, and accordingly the pn junction is not forwardly biased. Thus, no large current flows in the pn junction. Therefore, even when the power supply is turned on again, the storage node is kept at Vss, which enables the data signal to be read without reducing the signal amount. As regards the conditions of the plate potential for preventing a reduction in the amount of a signal indicative of the data "0", it is theoretically desirable to set, concerning the memory cell leak, the plate potential lower than the cell transistor threshold voltage VT when the power supply is in the on state. On the other hand, concerning the pn junction leak, it is desirable to set the plate potential lower than the built-in voltage VB of the pn junction when the power supply is in the on state.

Second, leakage of memory cell data is prevented using a VHH signal for detecting the turn-on and -off of the power supply. While the power voltage is lower than 2VT, which falls between 0 V and Vcc (VT represents the threshold voltage of the transistor), after turn on of the power supply, each node of the peripheral circuit, the core circuit, etc. of the DRAM is not fixed to Vss or Vcc, and it is not clear how it operates. The potential of the word line WL1 may exceed Vss, and the bit line /BL0 may be reduced to a value lower than Vss by noise.

In addition, since the DRAM chip includes a plurality of circuits, even when the power voltage exceeds 2VT, the DRAM assumes a correct standby state until the logic is spread over all the circuits, with the result that it is possible that the word line, the bit line, etc. will be adversely affected by noise. It is very important to take measures against the noise since the DRAM will perform an erroneous operation even if only one of signals stored to the cells leaks therefrom. Such noise can occur when the power supply is turned off, too. It is also possible that the DRAM will receive noise through an external pin and perform an erroneous operation while the power supply is in the off state.

The above embodiment and other embodiments, which will be explained later, also take measures against erroneous operations which may occur when the DRAM chip is detached from a socket.

Against bit line noise, depletion type pMOS transistors Q0 to Q3, which have positive threshold voltages (i.e., the transistors are turned on when their gates are at 0 V), are connected and controlled by the VHH signal, as is shown in FIGS. 5A and 5B.

Figure 6:
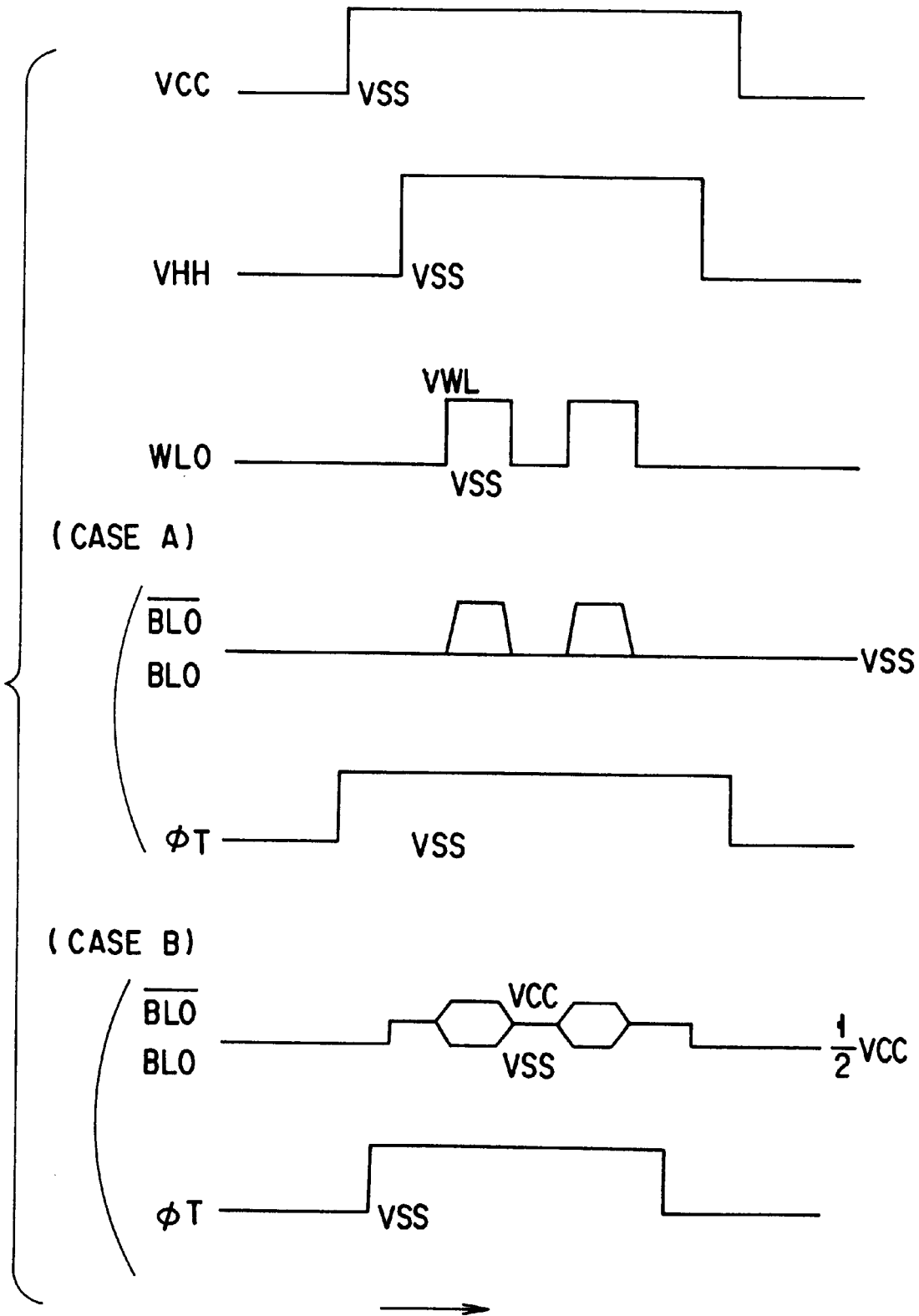
FIG. 6 is a view, showing driving signals used in the first embodiment.

FIG. 6 shows the above-described operation. After the power voltage Vcc is supplied, the VHH signal is kept at low level. Since in this state, the sources of the depletion type transistors Q0 to Q3 are in the on state and can fix the bit lines at Vss, the turn-on of the memory cell transistors due to noise generated when the power supply is turned on can be prevented. Accordingly, the leakage of data "1" written in a memory cell transistor, to a bit line can be prevented, which will occur when the potential of the bit line is lower than Vss because of noise. After the power voltage is fixed to Vcc, the VHH signal is set to high level and the transistors Q0 to Q3 are turned off, thereby setting a usual DRAM operation mode. Also at the time of turn off of the power supply, the VHH signal is set to low level in the standby mode to turn on the transistors Q0 to Q3, and the power supply is turned off a little later.

Similarly, to prevent the leakage of data "1" and "0" from memory cells, which will occur when the potential of the word lines exceed Vss, the VHH signal is applied to the row decoder thereby to prevent an increase in the potential of the word lines at the time of turn-on and -off of the power supply, so as to prevent destruction of cell data. Detailed examples of circuits are shown in FIGS. 18 to 20 and 29A to 33B, etc., which will be explained later.

Since the depletion type pMOS transistor is in the on state when the power supply is in the off state, the bit lines, the word lines and the plate electrode are fixed at Vss in the off state of the power supply. Accordingly, all the memory cell transistors are kept off all the time, and lost of cell data can be prevented.

Where the bit line precharge potential is set to Vcc/2 as in the conventional case, and the bit lines are connected to Vss by means of the depletion type transistors during the activation of the DRAM, the sense amplifiers of Vcc/2 are prevented from short-circuiting with Vss, by setting the bit line potential to Vcc/2, at the time of turning on the power supply, after the VHH signal is set at high level and then φT is turned on, and also by setting the bit line potential to Vss, at the time of turning off the power supply, after φT is turned off and then the VHH signal is set at low level, as shown in the case (B) of FIG. 6.

The case (A) of FIG. 6 shows a bit line Vss precharge method. In this case, the above short-circuiting will not occur even when φT is set to high level when the power supply is turned on, and to low level when the power supply is turned off. In the bit line Vss precharge method, a dummy cell to which data can be written from the external as shown in FIG. 5B is necessary to correctly amplify the bit line potential difference. To turn off the transistors Q0 to Q3 during turn on of the power supply, the VHH signal must be set at a level higher than Vcc since the maximum amplitude of the bit lines is Vcc.

Figure 7A:
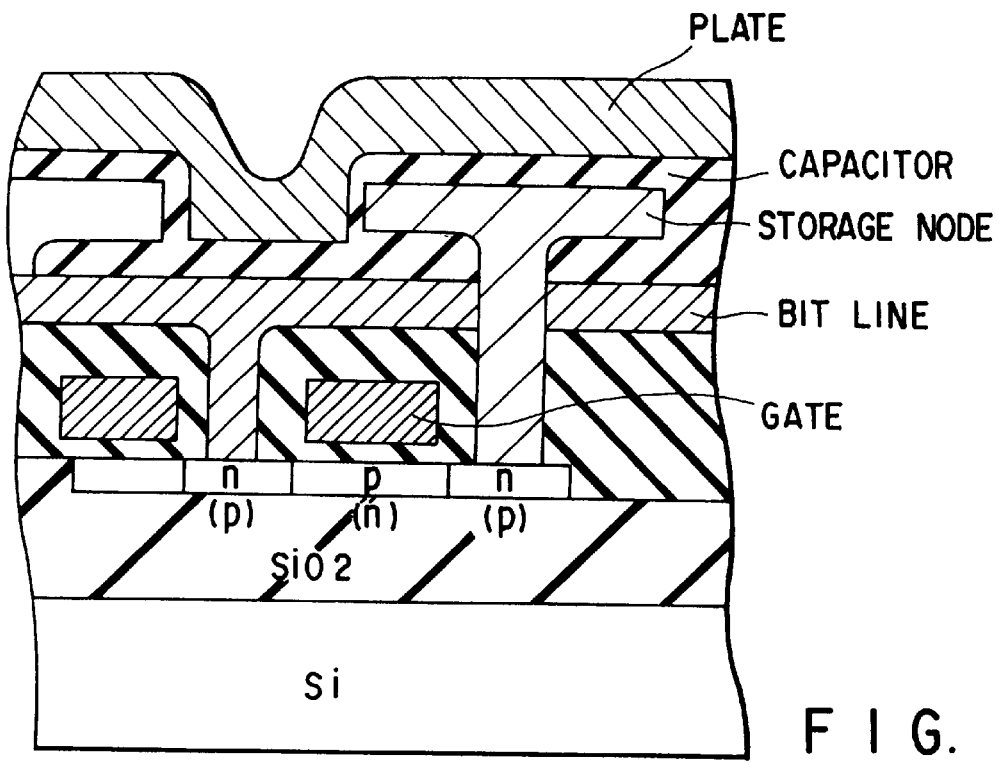
FIGS. 7A and 7B are sectional views, showing element structures employed in the first embodiment.
Figure 7B:
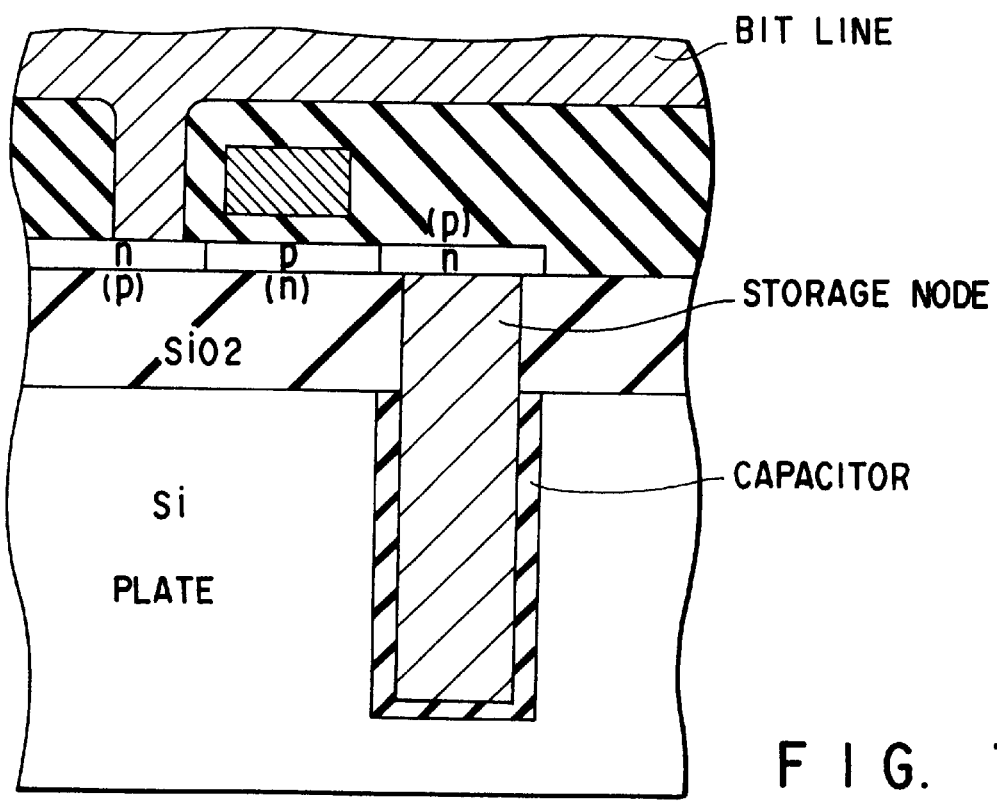

FIGS. 7A and 7B show SOI type memory cells useful in the present invention. Specifically, FIG. 7A shows a stack cell, while FIG. 7B shows a trench cell. FIGS. 7A and 7B show nMOS transistors. However, if pMOS transistors are used in place of the nMOS transistors, the respective conductivity types of the regions which constitute each nMOS transistor are changed to the parenthesized ones.

In both the stack cell and the trench cell, an oxide film is provided on an Si substrate, and an upper Si layer is formed on the resultant structure. The source, drain and channel of the memory cell transistor is formed of the upper Si layer. Further, the storage node connected to the source is surrounded with an insulator such as an oxide film, etc., and also isolated from the plate electrode by means of a capacitor made of an insulator such as a high dielectric film, etc. Thus, a pn junction does not exist between the source (i.e., storage node) and the substrate as exists in the conventional bulk transistor. Therefore, a relatively large amount of a pn junction backward leak current will not occur, but only a small amount of an insulator leak current will occur. In other words, the written data will leak only through the channel of the SOI type memory cell.

Figure 8:
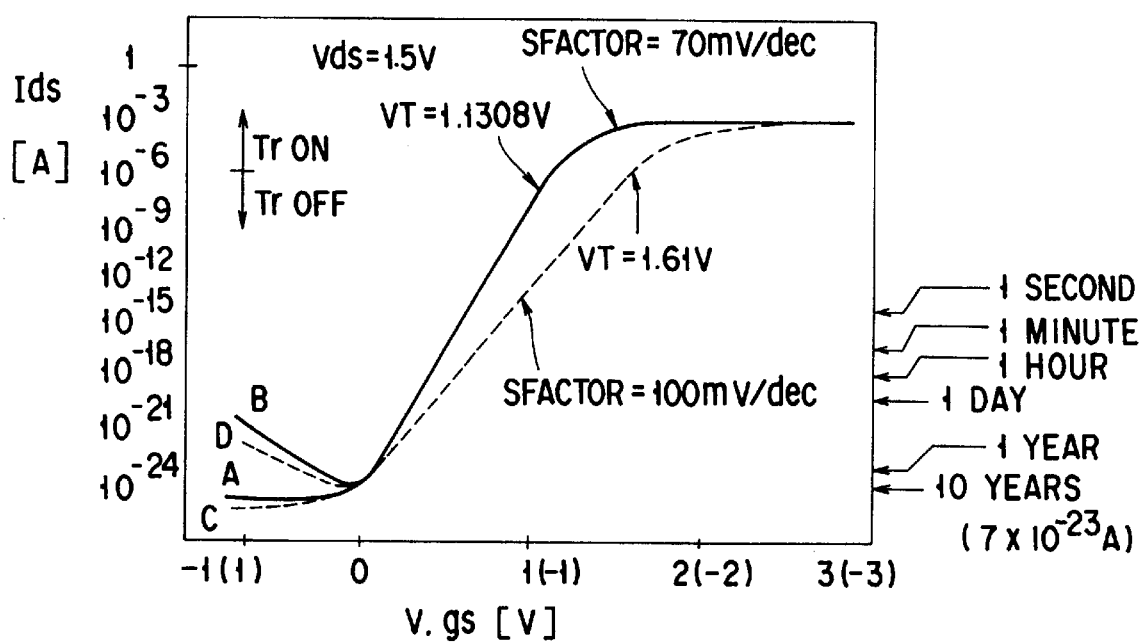
FIG. 8 is a view, illustrating the conditions for elongating the pause characteristics of the DRAM in the first embodiment.

Accordingly, the pause characteristics of the DRAM can remarkably be enhanced only by reducing the leak current which occurs at the time of the turn off of the SOI transistor. FIG. 8 shows the conditions for reducing the leak current.

The graph of FIG. 8 illustrates the characteristics of the SOI cell transistor. In FIG. 8, the abscissa indicates a voltage Vgs applied between the gate and the source of the transistor, while the ordinate indicates a current Ids flowing through the transistor. The transistor is cut off when the current Ids is lower than about 1 $\mu$A. As the voltage Vgs decreases to a negative value side, the current Ids decreases in a LOG scale manner. Accordingly, the inverse number, S factor=$\Delta$Vgs/log (Ids), of the inclination of the cutoff characteristics of the SOI transistor, which is considered as a feature of the transistor, approaches ideal cut-off characteristics (60 mV/decade at the room temperature), since the capacitance between the channel and the substrate becomes 0. Thus, the inclination of the cut-off characteristics becomes steep as the voltage Vgs decreases to the negative value side. In the steep inclination range, the cut-off characteristics can be greatly enhanced by only slightly changing the voltage Vgs.

If the SOI transistor is designed such that S factor=70 mV/decade, and the threshold voltage of the transistor is set to 1.1308 V or more to cause the current Ids of the transistor to 1 $\mu$A or less, the leak current (I leak) can be reduced to:

$$Ileak = 10^{(-1.1308/70\ mV)} \times 10^{-6} = 7 \times 10^{-23}\ A$$

when the word line voltage is set to 0 V, the bit line voltage to 0 V, and the storage node to 0 V or Vcc.

If in this case, 1.5 V is applied to a memory cell which has a cell capacitance Cs of 30 fF, electricity accumulated therein is:

$$(1.5\ V - 1.5V/2) \times 30\ fF = 22.5\ fQ$$

Accordingly, the time necessary to allow the electricity to leak from the memory cell is:

$$t = Q/i = 22.5\ fQ/(7 \times 10^{-23} A)$$

$$= 3.2 \times 10^8\ sec. = 10\ years$$

Thus, the above-described embodiment of the invention can store data for 10 years or more. In other words, the embodiment does not require the refresh operation for 10 years as in the case of nonvolatile memories such as EPROMs, etc. If the circuit of the invention which can store data even when the power supply is turned off is combined with the conventional DRAM, this DRAM can be used as a complete non-volatile memory. Moreover, in a case where the transistor has an S factor of 100 mV/decade, the memory does not require the refresh operation for 10 years if the threshold voltage VT of the transistor is set to 1.61 V or more.

The above-described threshold voltage VT needs to satisfy the following conditions in the case of 1 $\mu$A leak:

$$\begin{aligned}\text{VT} &> \text{S factor} \times \log \\ &\text{(a leak current for allowing data to be stored for 10 years}/10^{-6}) \\ &= \text{S factor} \times \log (7 \times 10^{-23}\text{A}/10^{-6}\text{A}) \\ &= \text{S factor} \times 16.15\end{aligned}$$

Even in a case where data cannot be held 10 years, if the refresh operation is not necessary for 1 minute or so, a sufficient effect can be obtained even after the power supply is turned off, on condition that the threshold voltage VT satisfies the following:

$$\begin{aligned}\text{VT} &> \text{S factor} \times \log (3.75 \times 10^{-6}\text{A}/10^{-6}\text{A}) \\ &= \text{S factor} \times 9.46\end{aligned}$$

Figure 9:
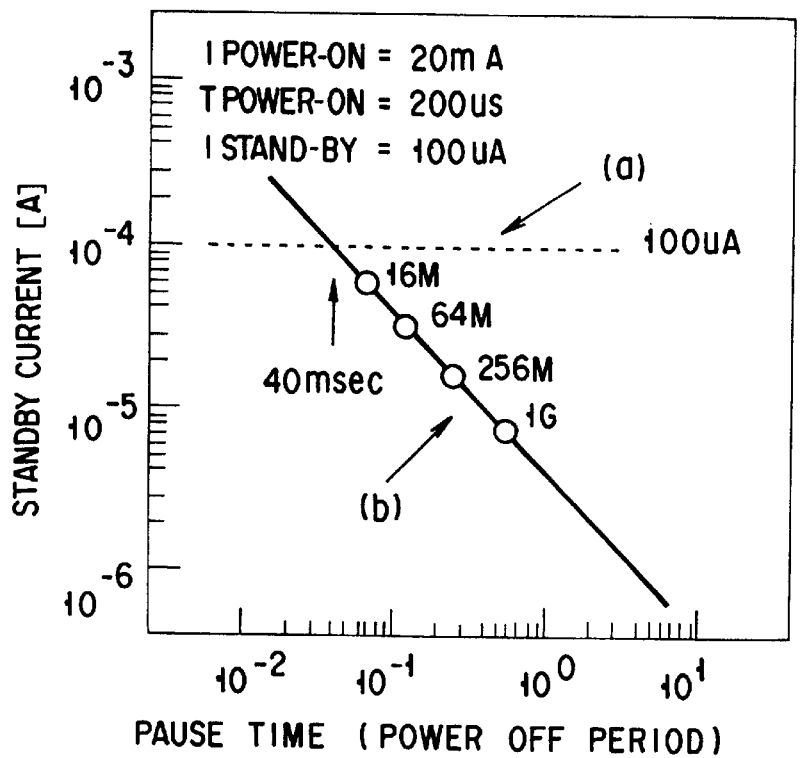
FIG. 9 is a graph, showing the effect of the invention obtained when it is applied to a 16 Mbit DRAM.

The above shows that the higher the pause characteristics of a transistor (irrespective of whether the transistor is of the SOI or bulk type), the more effective the invention. FIG. 9 shows more specific results obtained when the invention is applied to a 16 Mb DRAM.

In FIG. 9, the abscissa indicates the pause time or power-off time, and the ordinate indicates the standby current. The broken line (a) indicates the standby current of the conventional 16 Mb DRAM, which is about 100 $\mu$A independent from the pause time.

On the other hand, the solid line (b) indicates the standby current of the invention, which decreases as the power-off time increases. This is because in the invention, a power-on current flows when the power supply of the DRAM is turned on. Since in the DRAM specification, the power-on current (Ipower-on)=20 mA, the power-on time (Tpower-on)=200 $\mu$s, a predetermined electricity of 20 mA×200 $\mu$s is necessary to turn on the power supply. While the power supply is in the off state, no electricity flows from the power voltage Vcc. Therefore, as is shown in FIG. 9, the standby current decreases as the power-off time increases. Those portions of the solid line (b) of FIG. 9, which are denoted by 16M, 64M, 256M and 1G, indicate the pause time specifications of a 16 Mb DRAM, a 64 Mb DRAM, a 256 Mb DRAM, and a 1 Gb DRAM, respectively. This proves that the invention is effective also in the usual specification levels.

Figure 10:
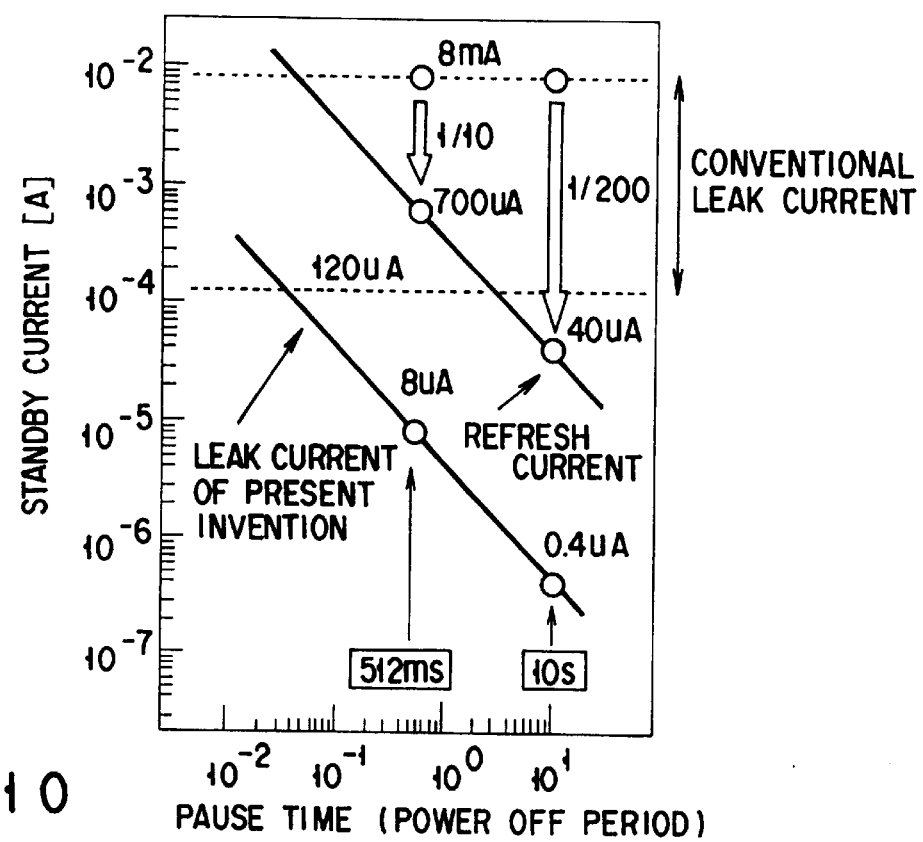
FIG. 10 is a graph, showing the effect of the invention obtained when it is applied to a 1 Gbit DRAM.

FIG. 10 shows the effective results of the invention obtained when it is applied to a 1 Gb DRAM.

In the conventional case, the amount of the leak current of transistors at standby is larger in a 1 Gb DRAM (120 $\mu$A–8 mA) than in a 16 Mb DRAM. This value is obtained where Vcc=1.5 V, the threshold value=0.2 Vcc and the threshold value variation range $\Delta$Vt±0.1 V. The threshold voltage decreases as the integration of memory cells increases. The leak current varies in accordance with a variation in threshold value, and becomes as large as 8 mA in a worst case. Further, a great amount of standby leak current is generated because of defective short-circuiting, which may well occur between a word line and a bit line in a highly integrated memory. A leak current per one defect in the memory is about 120 $\mu$A. If there are sixty defects in a memory chip, the sum of the leak currents of the defects is substantially equal to the leak current of the transistors of the chip.

On the other hand, the refresh current decreases in inverse proportion to the pause time. As is evident from FIG. 10, in the 1 Gb DRAM, the leak current is larger than the refresh current. The leak current of the present invention is, in the case of a pause time of 10 seconds, about 4.5 figures of the conventional leak current. In the case of including the refresh current, the standby current of the present invention is about 2.5 figures of the conventional one.

Further, there are experimental results, which proves that in the SOI transistor, the impact ionization factor of the channel is lower and the cut-off characteristics is better in the case of the nMOS type than in the case of the pMOS type. In light of this, it is considered to change nMOS memory cell transistors to pMOS ones. This change can be easily performed by forming the source, channel and drain of the transistor of a p-n-p junction as shown in parentheses in FIGS. 7A and 7B. The DRAM core circuit can also be realized with ease by reversing the conductivity types.

Such an inverted example is shown in FIG. 22A, etc., which will be referred to later. Moreover, since the memory cell transistor does not need a high driving function, various manners are considered to enhance only the cut-off characteristics, as will be explained later with reference to FIGS. 28A and 28B, etc.

In the memory cell transistor shown in FIG. 7B, it is desirable to use a p-type gate in the nMOS transistor, and an n-type gate in the pMOS transistor, so as to increase the threshold voltage mainly by the difference in working function between the gate and the channel.

In addition, the depletion type transistors shown in FIGS. 5A and 5B may have substrate contacts or not. When the SOI transistors are used, there is a case where a leak current increases due to a tunnel current between bands when the voltage Vgs has a negative value, as indicated by the current lines B and D shown in FIG. 8. In this case, the leak current can be reduced even at the time of standby by the Vss precharge method employed in case (A) of FIG. 6.

Second Embodiment

FIG. 11 shows the operation of the second embodiment. The structure of the second embodiment is the same as that of the first embodiment, and hence is not shown and explained. In the second embodiment, the turn-on and -off of the power supply is notified from the outside to the DRAM chip by inputting a signal through a pin, so as to protect memory cell data from noise which will occur at the time of turn-on and -off of the power supply.

As is shown in FIG. 6, a control signal VHH is set to high level after a set-up time passes from the start of the supply of the power voltage Vcc, and set to low level at the time of standby. Then, after a chip halt time passes, the power supply is turned off.

Third Embodiment

Figure 12A:
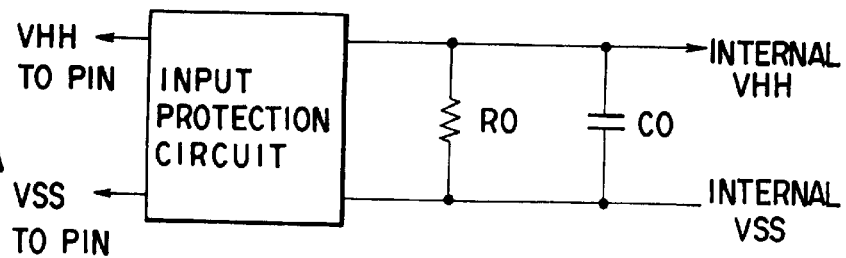
FIGS. 12A and 12B are circuit diagrams, showing a third embodiment of the invention.
Figure 12B:
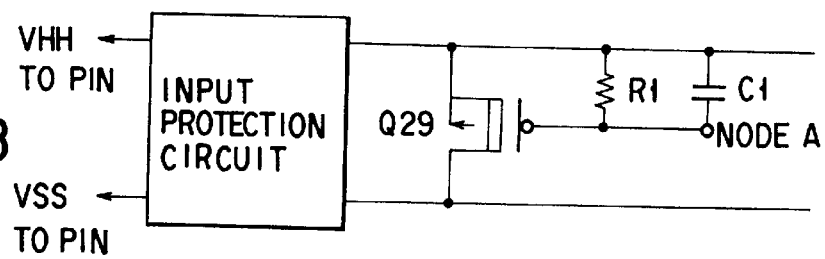

FIGS. 12A and 12B show the circuit structure of a third embodiment of the invention.

It is possible that noise will enter the circuit through the pin employed in the second embodiment for notifying the set-up and halt state of a chip, and hence that the signal relationship between the plate, noise or the like enters the bit lines and the word lines will vary and accordingly cell data will leak from the circuit. Such data leak must be avoided. Moreover, also at the time of detaching the DRAM chip from a socket, the circuit must be protected from entrance of noise such as static electricity through the pin, in order to protect cell data for 10 years.

FIGS. 12A and 12B show a circuit for protecting a DRAM chip from noise.

As is shown in FIG. 12A, a capacitor C0 and a resistor R0 are connected between the terminals, in addition to the usual input protect circuit, so that a low level noise pulse input from an external VHH pin can be reduced to the potential Vss through the resistor R0, thereby fixing the internal VHH signal to the potential Vss. The capacitor C0 is provided to prevent the VHH signal level from easily varying even when a high level pulse is temporarily applied thereto.

FIG. 12B shows an input circuit which has a higher resistance against noise. Unless a long signal pulse enters the VHH terminal and passes a resistor R1, and the potential of a node A is shifted to high level at a time point determined by the time constants of the resistor R1 and a capacitor C1, noise input from the VHH terminal is guided to the Vss terminal through a depletion type transistor Q29 which has a threshold voltage slightly higher than 0. At the time of intentionally setting the VHH signal to high level, the threshold voltage of the transistor Q29 is reduced to a slightly negative value as a result of a substrate bias effect, and hence the transistor Q29 is cut off.

Fourth Embodiment

FIGS. 13A to 13D are block diagrams, showing a fourth embodiment of the invention.

Figure 13A:
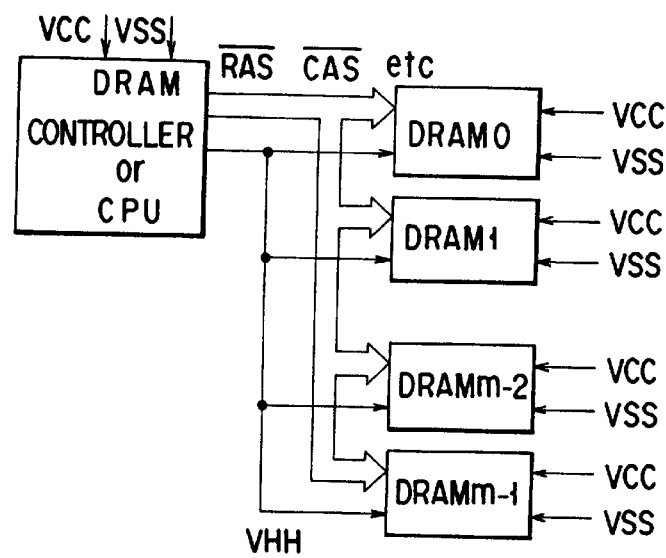
Figure 13B:
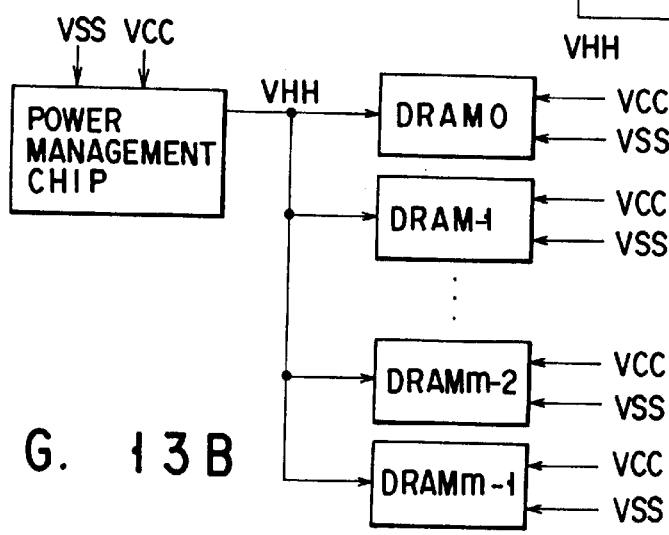

The above-described VHH signal may be generated by a DRAM controller chip or a CPU chip as shown in FIG. 13A, or by a power management chip as shown in FIG. 13B. Alternatively, the signal may be generated by a power management circuit including a power supply as shown in FIG. 13C.

The power management circuit or chip may incorporate a circuit for detecting the turn on of the power supply, as well as circuits for generating the VHH signal and detecting the turn off of the power supply, so as to set the VHH terminal to low level. In addition, to generate the VHH signal, the power management chip, etc. may be turned on and off by manually operating a computer, etc., more specifically by supplying a command signal thereto or by operating a switch. It is a matter of course that the VHH signal may be generated by sensing a reduction in the voltage of the battery or sensing the interruption of the external power voltage. Furthermore, a command or the like may be used in place of the signal VHH.

In addition to the above-described method for completely turning off the system power supply or the DRAM power supply, a method for turning off the power supply in a sleep mode is considered. FIG. 13D shows the method for turning off the power supply in the sleep mode.

In the conventional sleep mode, the power supply of the CPU is turned off by the power management circuit, while the DRAM controller and the DRAM power supply are kept on. In a first method of the invention, the power supplies of the DRAM controller and the DRAM are turned off with keeping the power supply of the CPU in an on state in the sleep mode. This is because the refresh operation is not necessary in the sleep mode, and accordingly a refresh signal is not necessary, which consist of a refresh signal REF or a signal combination of /RAS and /CAS, such as /CAS before /RAS.

Furthermore, in the case of a DRAM with a built-in refresh circuit, only the power supply of the refresh circuit is also turned off in the sleep mode.

In a second method of the invention, all the power supplies of the CPU, the DRAM controller, and the DRAM are kept off in the sleep mode.

As a third method, a method of turning off the power of only DRAM is considered with keeping the CPU and the DRAM controller in an on state.

Fifth Embodiment

Figure 14A:
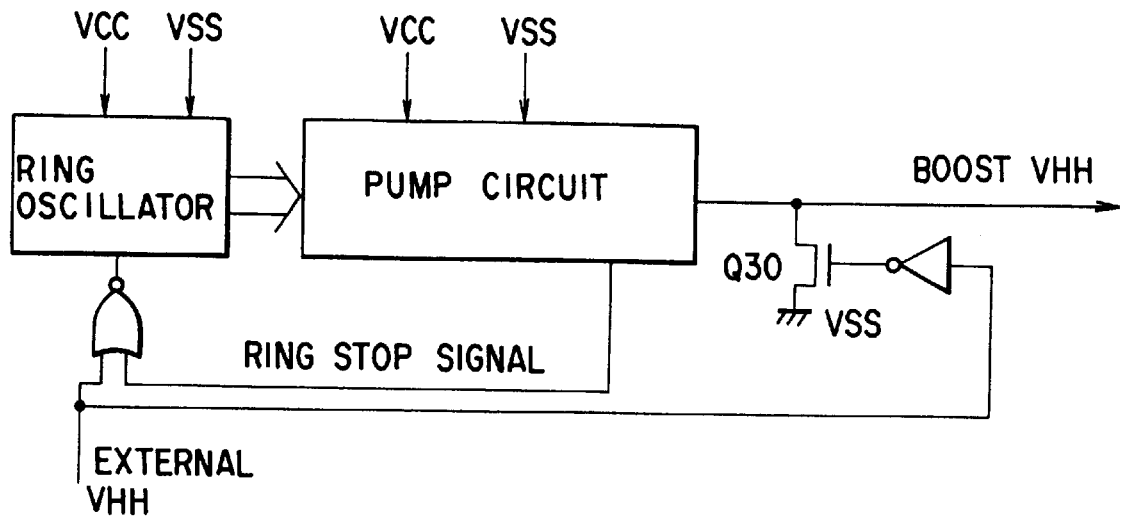
FIGS. 14A and 14B are a circuit diagram and a signal waveform view, respectively, showing a fifth embodiment of the invention.
Figure 14B:
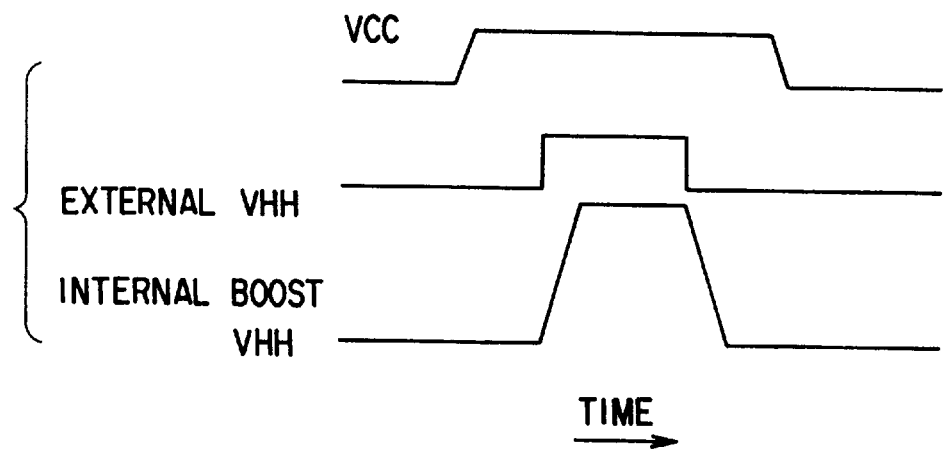

FIGS. 14A and 14B show a fifth embodiment of the invention. FIG. 14A is a circuit diagram, while FIG. 14B is a view of signal waveforms.

Practically, it is preferable that the external VHH signal has the same amplitude as the power voltage Vcc. However, since the invention employs depletion type transistors Q0 to Q3 as shown in FIGS. 5A and 5B, a voltage of a higher level than the power voltage Vcc is necessary to cut off the transistors. To this end, an external signal which has a higher level than the power voltage Vcc may be used as the external VHH signal, or the external VHH signal may have its level boosted in the chip as shown in FIGS. 14A and 14B.

In the circuit as shown in FIGS. 14A and 14B, the level of the external VHH signal which has the same amplitude as the power voltage Vcc is boosted by a pump circuit employed therein. The level of the internal VHH signal increases a little after the supply of the power voltage Vcc is started, and decreases before the supply of the power voltage Vcc is stopped. This means that the level of the VHH signal becomes high during supply of the power voltage Vcc, and hence Vcc or Vss may be used as the power voltage of the internal VHH signal generating circuit.

In the circuit of FIG. 14A, while the external VHH signal is at low level, the level of the internal VHH signal is reduced to Vss by means of a transistor Q30, and an oscillator employed therein is kept inoperative, thereby keeping the internal VHH signal at Vss. When the external VHH signal is set to high level, the oscillator is operated to cause a pump circuit (booster circuit) to boost the internal VHH signal. When the internal VHH signal has been increased to a predetermined level, an oscillator stop signal is shifted to low level to stop the operation of the oscillator.

Sixth Embodiment

Figure 15A:
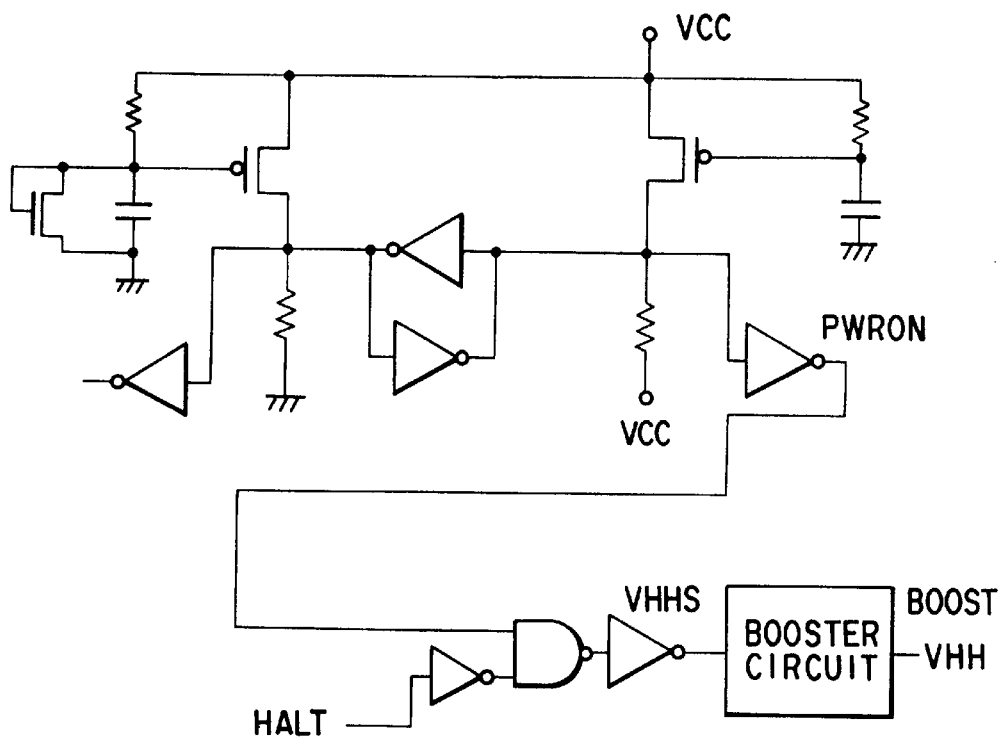
FIGS. 15A and 15B are a circuit diagram and a signal waveform view, respectively, showing a sixth embodiment of the invention.
Figure 15B:
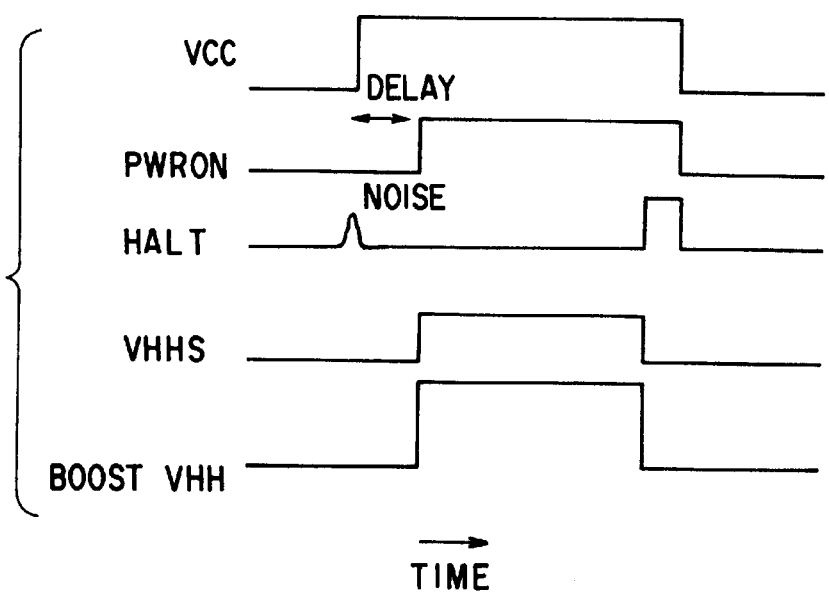

FIGS. 15A and 15B show a sixth embodiment of the invention. FIG. 15A is a circuit diagram, while FIG. 15B is a view of signal waveforms.

After the power supply is turned on, a PWRON signal is shifted from low level to high level. Where a power-on detecting circuit is incorporated in the DRAM chip for shifting the internal VHH signal to high level, the external VHH signal is not necessary at the time of turning on the power supply.

A signal output from the power-on detecting circuit can be also used to reset various circuits. In the sixth embodiment, to minimize erroneous operations of various circuits, they are reset at the time of turning on the power supply by means of the reset signal as well as the VHH signal. Further, in order to prevent erroneous operations, internal signals /RAS, /CAS, /WE of main circuits in the chip are reset by the VHH signal such that the signals can constitute the same logic circuit at the time of turning on and off the power supply as at the time of standby.

At the time of turning off the power supply, a halt signal may be input from the outside as shown in FIG. 15B, or as shown in FIGS. 16A and 17A.

FIGS. 16A and 17A are views of halt signal generating circuits. FIGS. 16B and 17B are timing charts concerning halt signals generated by the circuits shown in FIGS. 16A and 17A, respectively.

In the case of FIG. 16B, a halt signal is generated using a predetermined program so that signals /CAS and /WE can be set to low level before setting a signal /RAS to low level, and then the signal /WE can be shifted from high to low levels and vice versa four times. In the cases of FIG. 17B, the halt signal is shifted to high level, when the power supply has been turned off and the power has been reduced to a value lower than a constant value of Vcc−min.

In the logic circuit shown in FIGS. 15A and 15B, the VHH signal can operate correctly even if the halt signal is influenced by noise at the time of turning on the power supply. Thus, in both the cases (A) and (B) of FIG. 17B where different halt signals are generated, a desired VHH signal is generated.

As explained above, a signal indicative of power-on or -off may be input to the DRAM chip from the outside. Alternatively, signals indicative of both power-on and -off may be input to the DRAM chip and detected by a circuit employed therein for detecting them. In the latter case, the power-on and -off can be easily performed as in other non-volatile memories.

Seventh Embodiment

Figure 18:
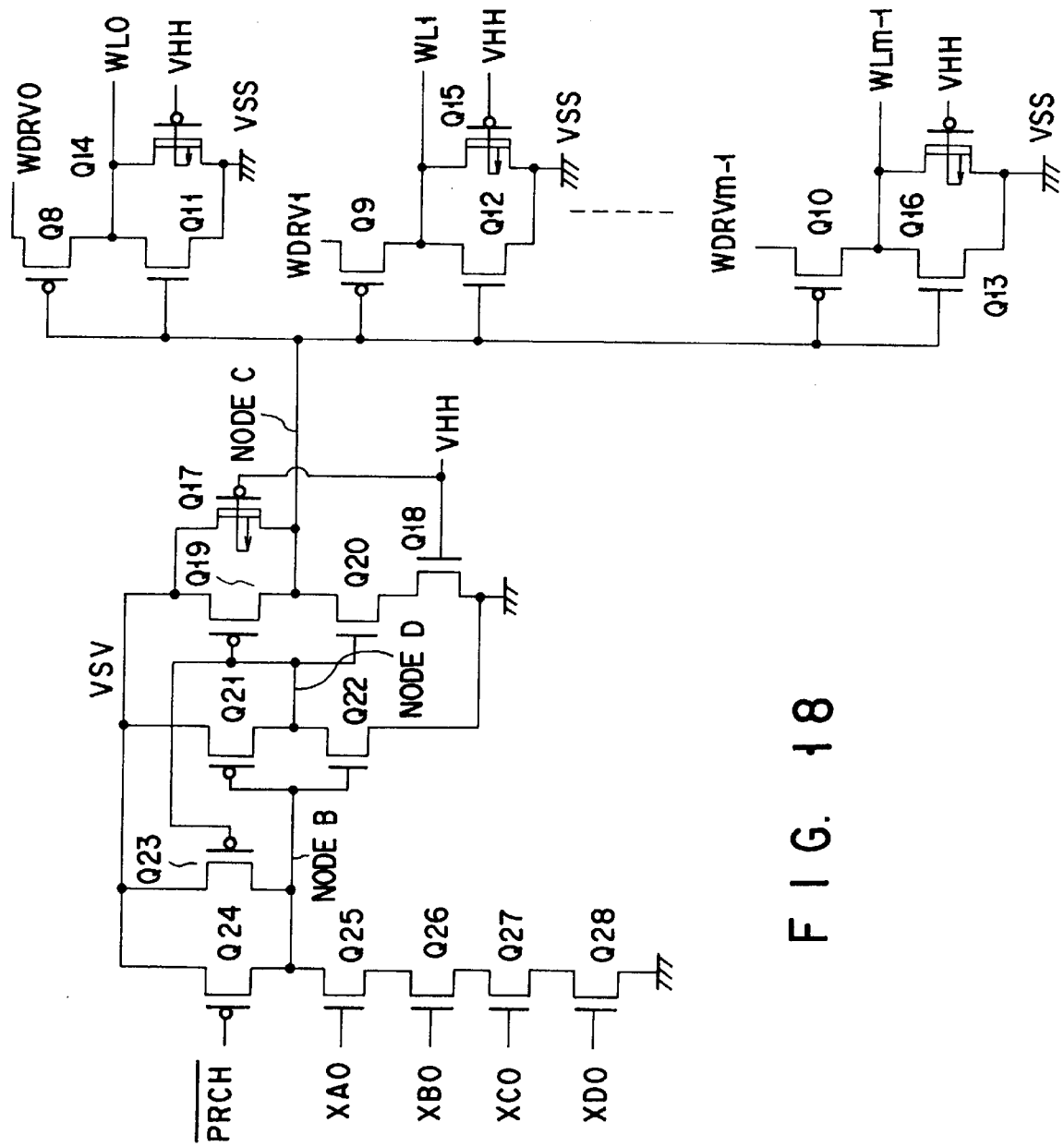
FIG. 18 is a view, showing a row decoder according to a seventh embodiment of the invention.

FIG. 18 is a circuit diagram, showing a row decoder circuit according to a seventh embodiment of the invention.

In this embodiment, noise which adversely affects the word lines and occurs when the power supply is turned on or off, or is in the off state is restrained by adding, to a conventional row decoder circuit, a circuit including depletion type transistors.

In general, when the mode is shifted from the standby mode to the active mode, a /PRCH signal is shifted from low level to high level, and only the row decoder is selected by address inputs XA0, XB0, XC0 and XD0, thereby shifting the node B to low level. Then, a node C is shifted to low level, thereby shifting that one of word lines WL0 to WLm−1 to high level, which corresponds to a high level one of word line driving signals WDRV0 to WDRVm−1. As a result, a corresponding memory cell is selected.

In the above circuit, in the standby mode, the node C must be set at high level, and the word line driving signals WDRV0 to WDRVm−1 and the word lines WL0 to WLm−1 must be set at Vss. Further, when the power supply is turned on or off, or is in the off state, the word lines WL0 to WLm−1 must be fixed at Vss.

In the seventh embodiment, depletion type pMOS transistors Q14 to Q16 are added to enable the VHH signal to be set at Vss when the power supply is turned on or off, or is in the off state, and to enable the Vss line and the word lines WL0 to WLm−1 to be conductive, in order to prevent the erroneous operations of circuits in the row decoder due to noise.

On the other hand, in the standby mode and the active mode, the VHH signal is set to high level, thereby keeping the transistors Q14 to Q16 in the off state so as not to adversely affect the active mode. Moreover, to prevent current leak to the word lines WL0 to WLm−1 through the transistors Q8 to Q10, the potential of the node C0 must be kept higher than those of the signals WDRV0 to WDRVm−1. To this end, transistors Q17 and Q18, an address node D and a NAND circuit for the VHH signal (constituted by transistors Q17 to Q20) are incorporated in the row decoder, such that a boosted potential VSV line can always be short-circuited with the node C irrespective of the potential of the node D when the VHH signal is at low level, thereby preventing turn on of transistors Q8 to Q10.

In the case where the VHH signal is at high level, when the node D is at low level, the node C is kept at high level, while when the node D is at high level, the node C is kept at low level. Thus, normal DRAM operations can be performed. It should be noted that the high level of the VHH signal must be higher than the boosted potential VSV.

Eighth Embodiment

FIG. 19 shows an eighth embodiment of the invention.

This embodiment is an example of a driving circuit for driving the word line driving signals WDRV0 to WDRVm−1 to be input to the transistors Q8 to Q10 shown in FIG. 18.

Even when current leak has occurred because of noise through the transistors Q8 to Q10, it suffices if the word line driving signals WDRV0 to WDRVm−1 are set at the potential Vss when the power supply is turned on and off, and is in the off state. Therefore, also in the WDRV driving circuit, the WDRV line can be fixed to the potential Vss when the power supply is turned on and off and is in the off state, by providing a NAND circuit for the VHH signal and a cell array activating signal in a stage before the driving circuit.

Ninth Embodiment

FIG. 20 shows a ninth embodiment of the invention.

In the ninth embodiment, no word line driving signals WDRV0 to WDRVm−1 are applied and only the boost potential VSV is applied to a word line driving transistor Q103. In this embodiment, the boosted potential VSV is reduced to the potential Vss by means of a transistor Q104, and a NAND circuit (constituted by transistors Q99 to Q101) is used to connect a node E to the boosted potential VSV line so as to prevent the level of the word line WL0 from exceeding the potential Vss when the power supply is turned on and off and is in the off state.

If the driving ability of the word line may be degraded, this embodiment may be modified as follows:

A plurality of nMOS transistors are inserted between the transistors Q8 to Q10 and the word lines WL0 to WLm−1 and between the transistor Q103 and the word line WL0 shown in FIGS. 18 and 20, thereby applying the VHH signal to the gates of the transistors and turning on the transistors in the active mode and the standby mode. The VHH signal is shifted to Vss to turn off the transistors when the power supply is turned on and off and is in the off state. Only the transistors Q14 to Q16 and Q104 may be set to Vss and turned off.

Tenth Embodiment

Figure 21A:
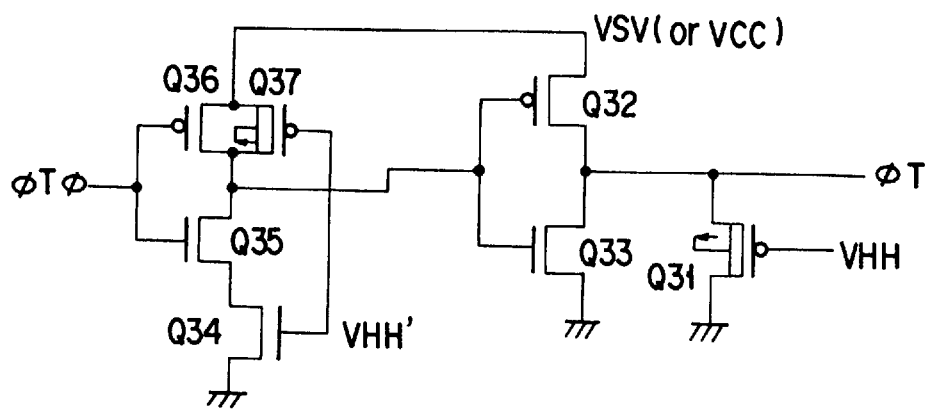
FIGS. 21A to 21C are circuit diagrams and a signal waveform view, respectively, showing a tenth embodiment of the invention.
Figure 21B:
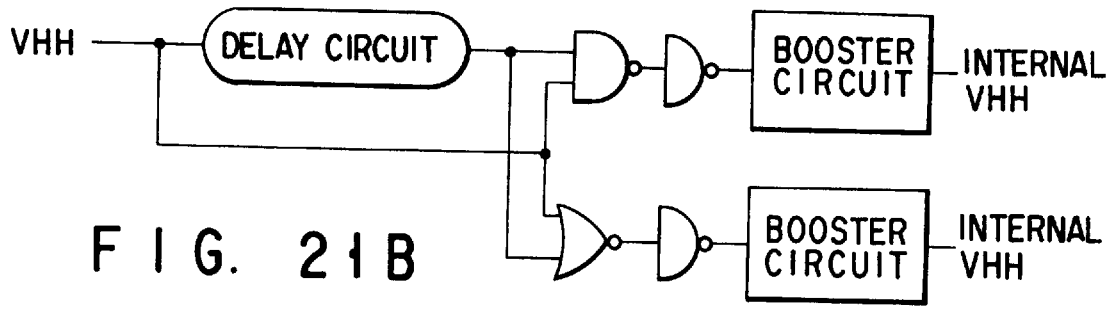
Figure 21C:
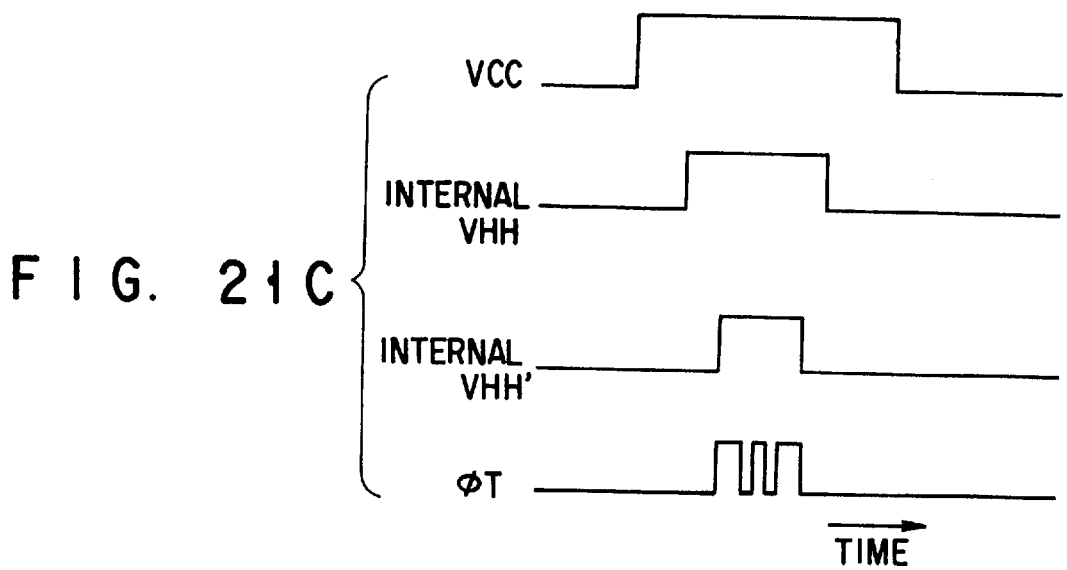

FIGS. 21A to 21C show a tenth embodiment of the invention. FIG. 21A is a circuit diagram, FIG. 21B a block diagram, and FIG. 21C a view of signal waveforms. The circuit of the tenth embodiment is necessary to generate the signal φT shown in the case (B) of FIG. 6.

In the circuit shown in FIG. 21A (and FIG. 21B), a VHH' signal is generated, which is shifted to high level after the VHH signal is shifted to high level, in order to increase the level of the φT signal after relieving the short-circuiting state between the bit lines and the potential Vss with the use of the internal VHH signal, thereby precharging the bit lines with Vcc/2.

At the time of turning off the power supply, the VHH signal is set to low level after the VHH' signal is set to low level, so as to prevent short-circuiting between the Vcc/2 precharge circuit and the potential Vss.

Eleventh Embodiment

Figure 22B:
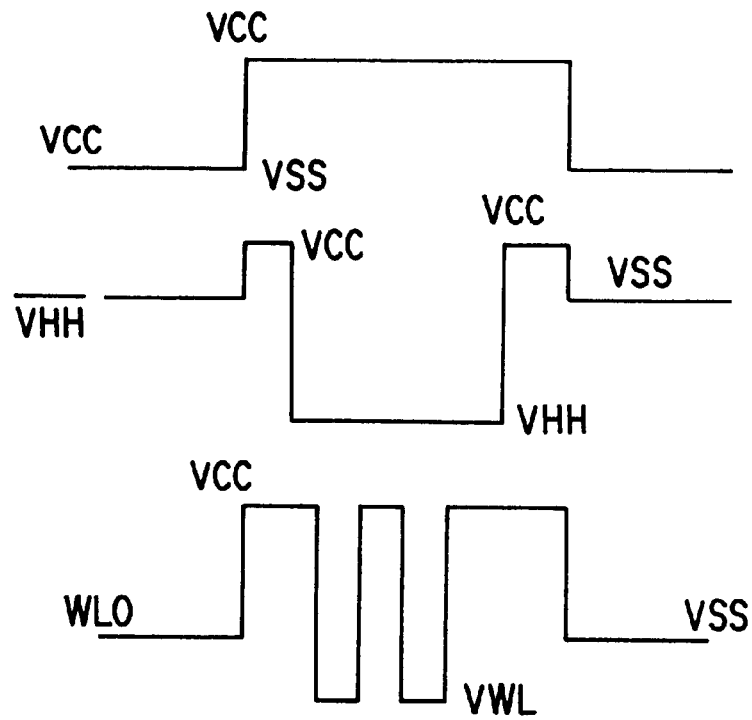
Figure 22B:
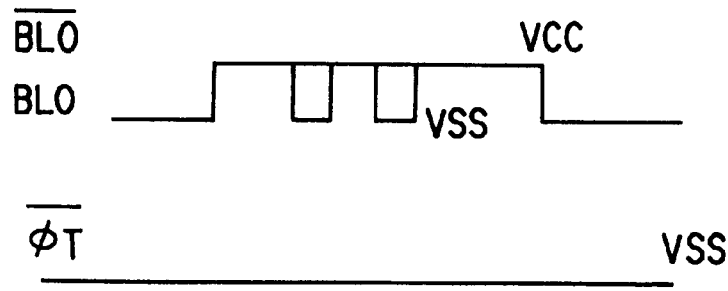
Figure 22B:
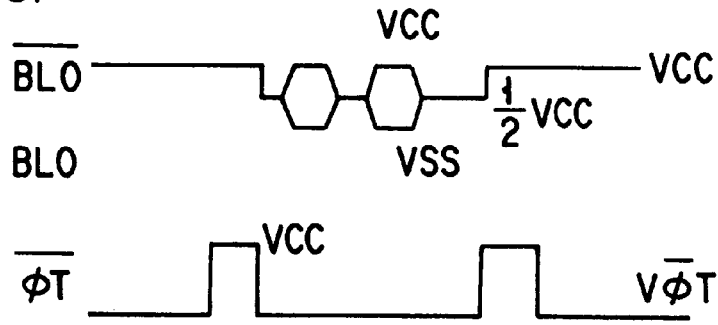

FIGS. 22A and 22B show an eleventh embodiment of the invention. FIG. 22A is a circuit diagram, while FIG. 22B is a view of signal waveforms. This embodiment is an example of a core circuit which is obtained by replacing the nMOS transistors shown in FIGS. 5A and 5B with pMOS transistors.

The pMOS transistors employed in this embodiment are obtained by inverting the respective conductivity types (p and n) of the regions which constitute each of the transistors shown in FIGS. 5A and 5B. The plate is connected to the power voltage Vcc, and the word lines turn on the memory cell transistors with a voltage lower than Vcc. As regards the bit line precharge voltage, too, Vcc and Vcc/2 are used as precharge voltages in the cases (A) and (B), respectively, inversely to the cases (A) and (B) of FIG. 6. When the power supply is turned on and off, and is in the off state, current will not leak from the memory cells by controlling such that the plate is set to Vss, the word lines are set not less than Vss, and the bit lines are set not more than Vss.

If the memory cell transistor of the SOI structure is formed of a pMOS transistor as in the eleventh embodiment, the cut-off characteristics thereof are further enhanced. Further, a /VHH signal is used in place of the VHH signal, inversely to FIG. 6. The level of the /VHH signal is kept at Vcc for a predetermined period of time after the power-on, and set to a value lower than Vss immediately before the operation mode enters the standby mode. At the time of power-off, the signal is set to Vcc and then to Vss.

Twelfth Embodiment

FIGS. 23A and 23B show a twelfth embodiment of the invention. FIG. 23A is a circuit diagram, while FIG. 23B is a view of signal waveforms. This embodiment is a circuit obtained by removing the depletion type pMOS transistors for short-circuiting the bit lines with the potential Vss from the circuit of FIGS. 5A and 5B.

In general, as in the case (B) of FIG. 23B, since the bit lines are precharged with Vss/2, it is hard to make the level of the bit lines lower than Vss at the time of power-on and off. Furthermore, since the bit lines BL0, /BL0, BL1 and /BL1 have large capacities, the levels of them are hard to vary.

Therefore, it is rather possible that the levels of the word lines will float at the time of power-on or -off. In light of this, it suffices if the VHH signal is input to the row decoder. Further, if correct measurements against noise are taken in the DRAM chip, cell charge can be prevented from leaking only from the Vss plate by increasing the threshold voltage of the cell transistors. FIG. 23A shows a case in which measurements are taken only for the word lines.

As is shown in case (C) of FIG. 23B, the level of the $\phi T$ signal can be increased at the time of power-on, since there are no depletion type transistors for connecting the bit lines to the potential Vss. In this case, if the bit lines are precharged at the same time as the power-on, charge leak does not occur. On the other hand, at the time of power-off, cell charge will not leak to the bit lines through the transistors since they have large capacities and the bit line potential is reduced from Vss/2 to Vss in a long time.

Thirteenth Embodiment

Figure 24B:
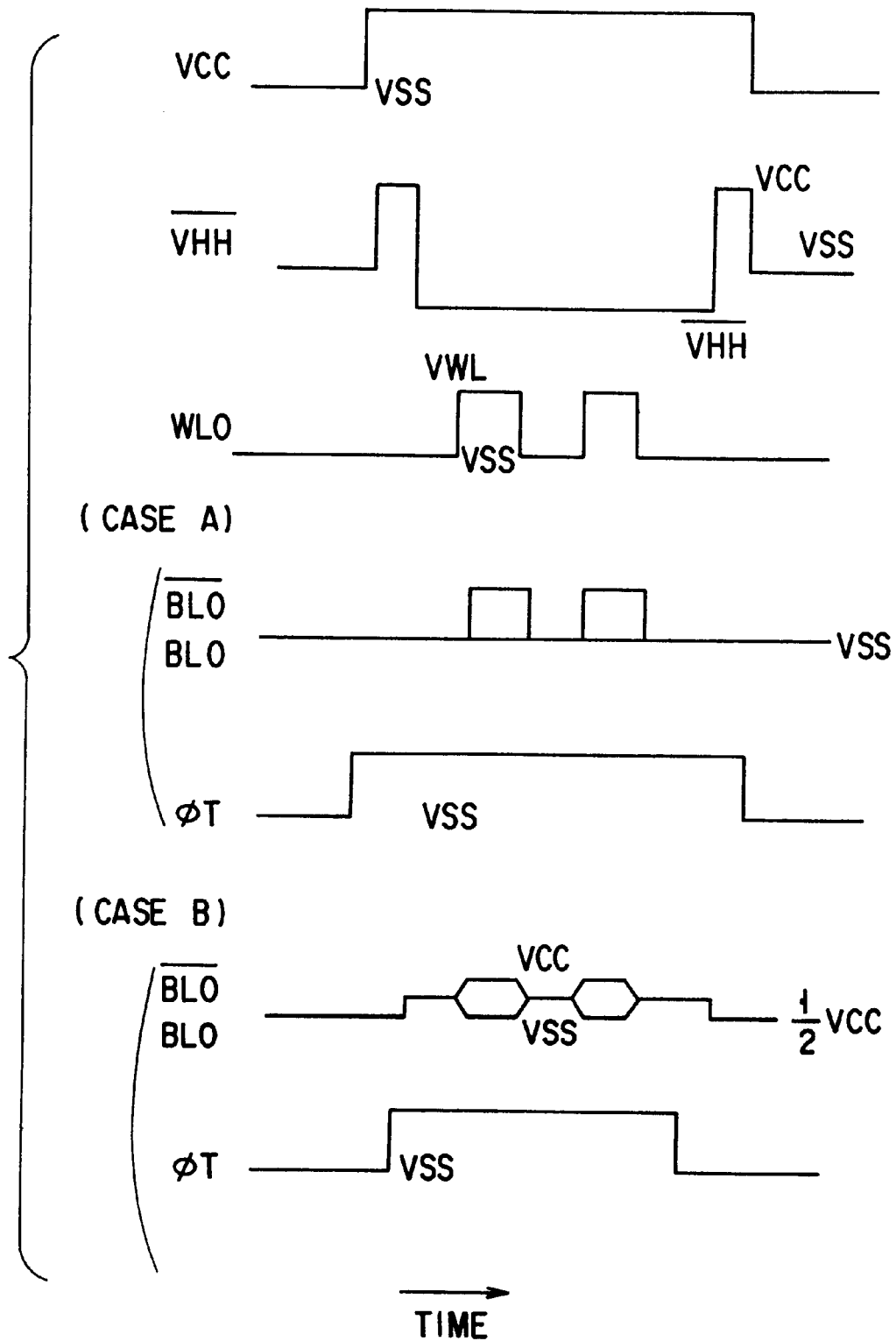

FIGS. 24A and 24B show a thirteenth embodiment of the invention. FIG. 24A is a circuit diagram, while FIG. 24B is a view of signal waveforms. This embodiment is an example obtained by replacing the depletion type pMOS transistors shown in FIGS. 5A and 5B with depletion type nMOS transistors. This embodiment can perform the same operation as the circuit shown in FIGS. 5A and 5B if the /VHH signal is used in place of the VHH signal.

Fourteenth Embodiment

Figure 25:
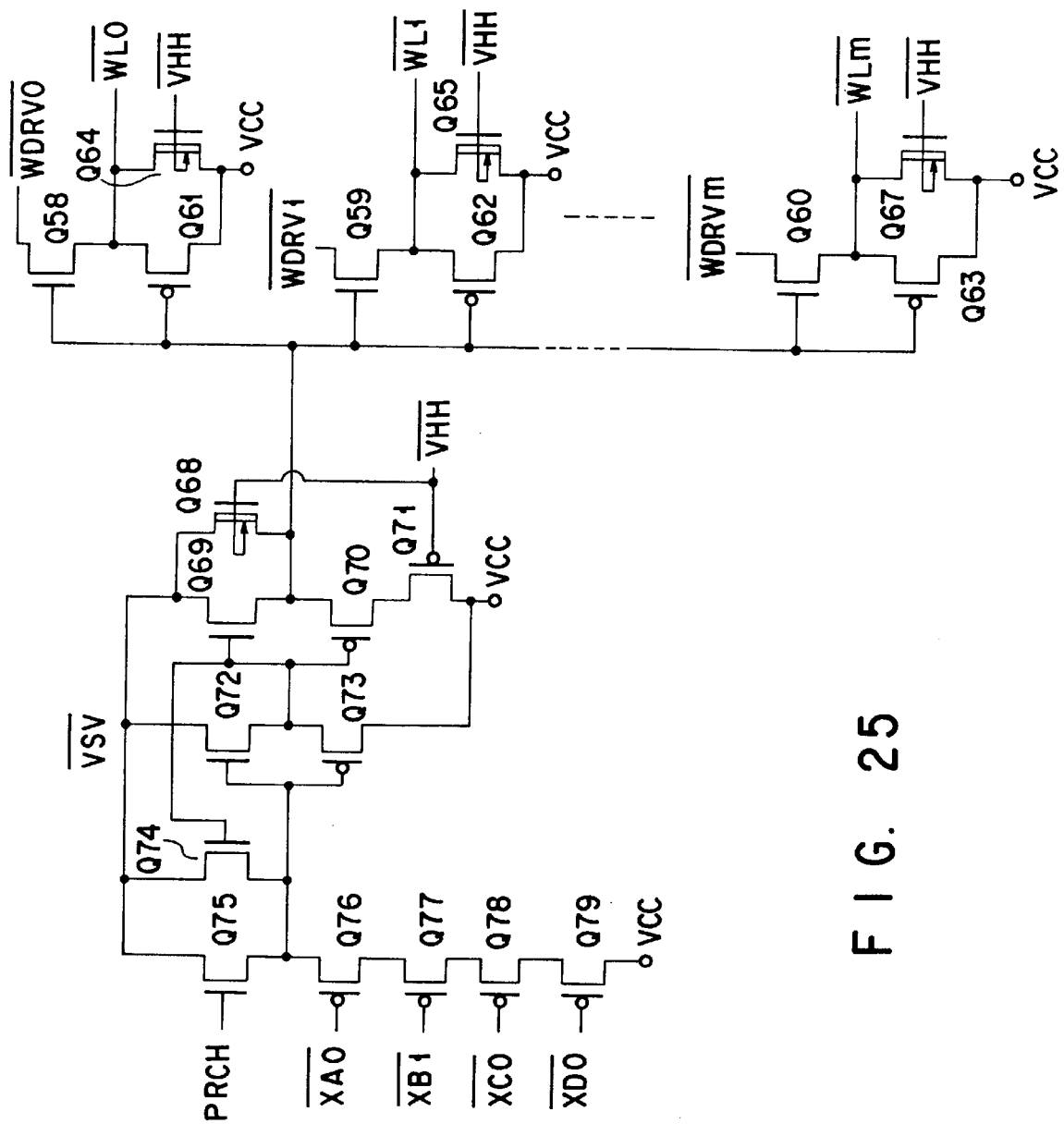
FIG. 25 is a circuit diagram, showing a fourteenth embodiment of the invention.

FIG. 25 shows a row decoder applied to a circuit similar to the circuit FIG. 22A except that pMOS transistors are used in place of the nMOS transistors. This decoder can easily be realized by modifying the decoder of FIG. 18 such that the nMOS transistors are exchanged with pMOS transistors and vice versa, Vss is shifted to Vcc, and the boost voltages such as VHH, VSV, WDRV0 to WDRVm−2 are changed to /VHH, /VSV, /WDRV0 to /WDRVm−2, respectively.

Fifteenth Embodiment

Figure 26A:
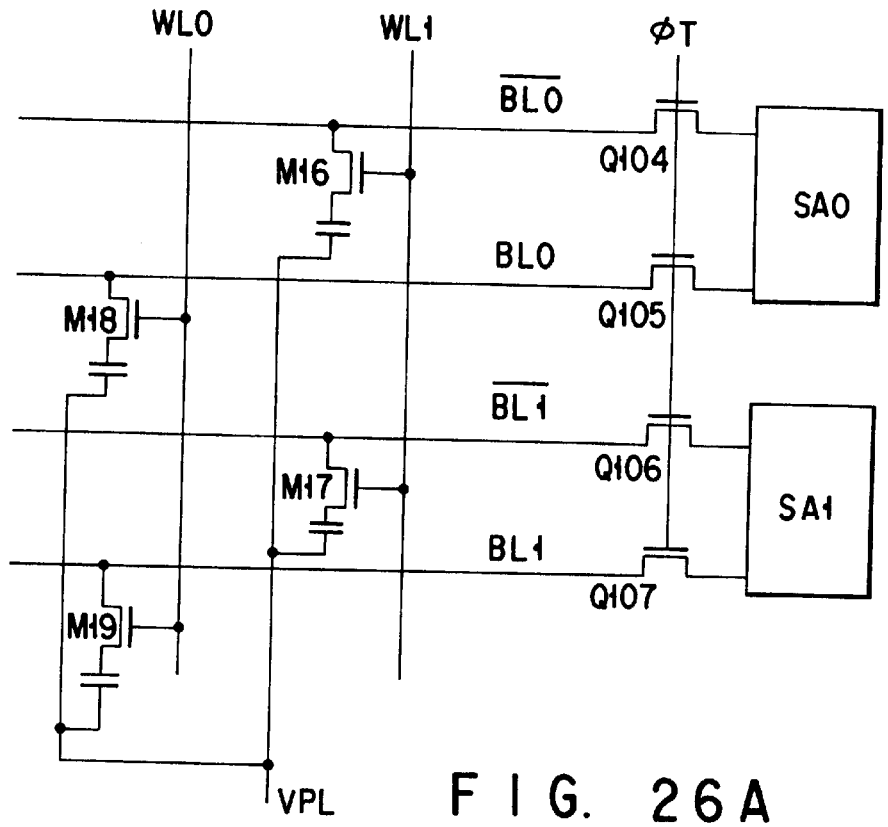
FIGS. 26A and 26B are a circuit diagram and a view of driving signals, showing a fifteenth embodiment of the invention.
Figure 26B:
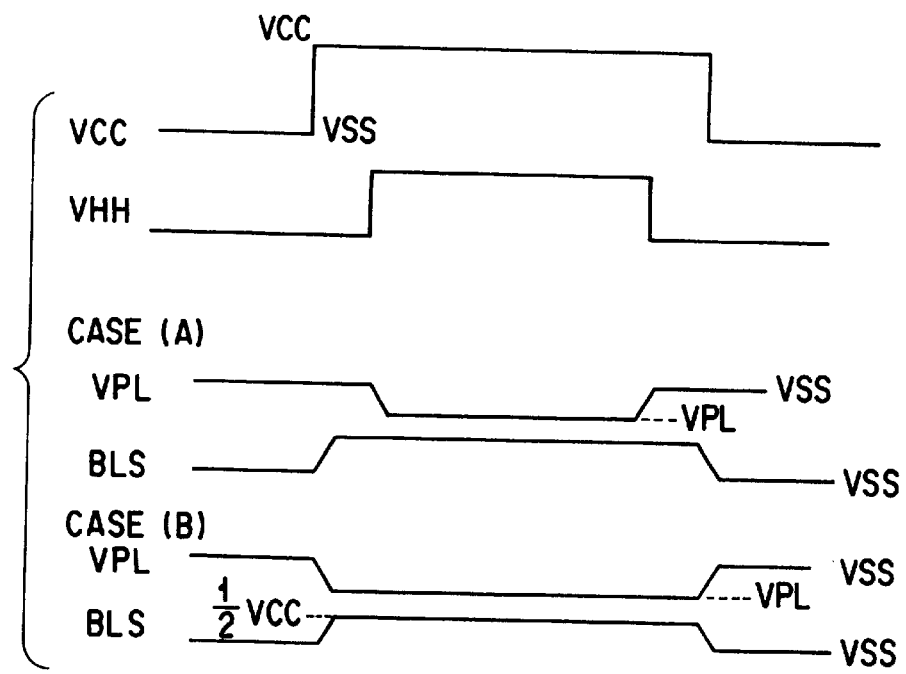

FIGS. 26A and 26B show a fifteenth embodiment of the invention. FIG. 26A is a circuit diagram, while FIG. 26B is a view of signal waveforms.

In this embodiment, the plate (see FIG. 23A) is reduced to a level lower than Vss a little after the power supply is turned on, to thereby operate the DRAM, and is returned to Vss before the power supply is turned off.

With this structure, the potential of the storage node is shifted to the positive side as a result of data writing in the memory cell at the time of power-on and -off. Therefore, if low noise enters the word lines, the source of the memory cell transistor floats. When the drain of the memory cell transistor increases to Vcc/2 in accordance with an increase in Vss, no cell data leaks from the memory cell transistor, and the transistor is kept off.

In case (B) of FIG. 26B, the same effect can be obtained without applying the VHH signal when the level of the plate slowly increases, since the plate has a large capacity. At the time of power-off, however, it is necessary to quickly reduce the plate level to Vss. Further, in the case (B), no VHH signal is necessary even if there is slight word line noise. Thus, a DRAM which can hold data even after power-off can be realized with a simple structure.

As aforementioned, setting the threshold voltage of the cell transistor to a value higher than the value set in the FIG. 8 case enables such a DRAM as can hold data even after power-off, to be realized with the plate level kept at Vss without the VHH signal.

Sixteenth Embodiment

Figure 27A:
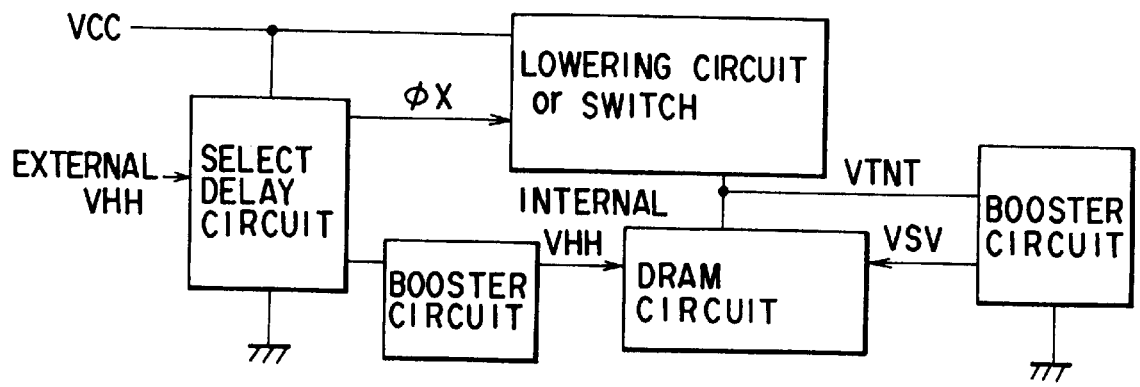
FIGS. 27A and 27B are a circuit diagram and a signal waveform view, respectively, showing a sixteenth embodiment of the invention.
Figure 27B:
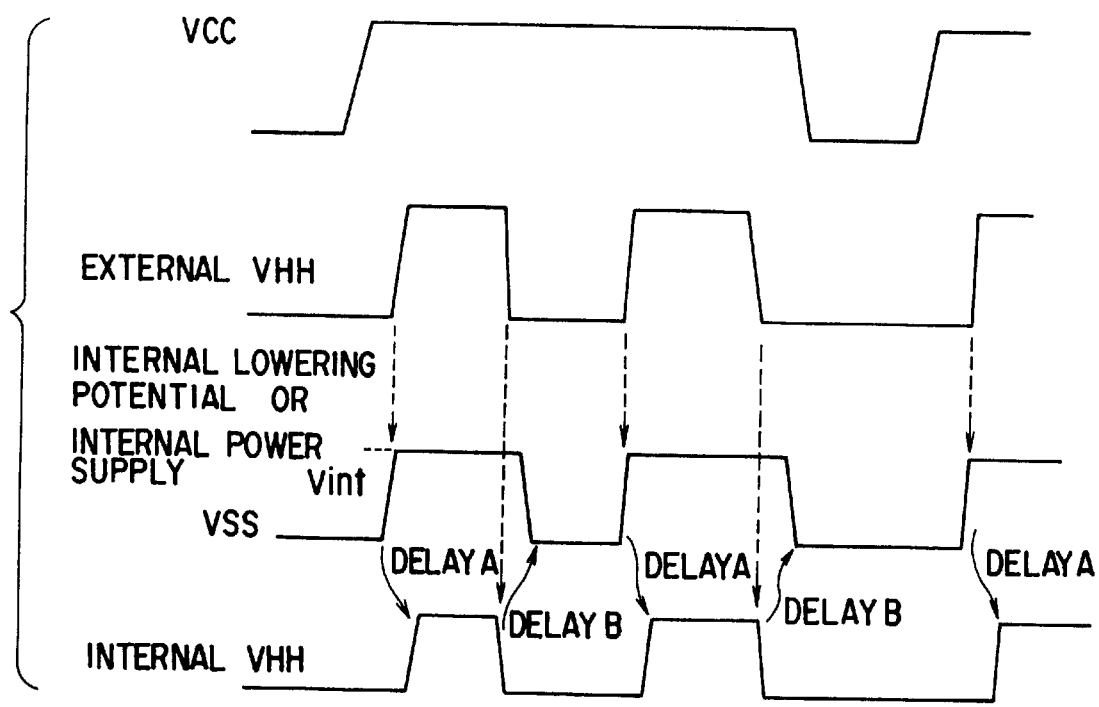

FIGS. 27A and 27B show a sixteenth embodiment of the invention. FIG. 27A is a circuit diagram, while FIG. 27B is a view of signal waveforms.

This embodiment aims to minimize the power consumption in a long sleep mode in a state where the supply of the external power voltage Vcc is not stopped. To this aim, an internal power voltage Vint is provided. When the external VHH signal is input, a switch for connecting the internal power voltage Vint to the potential Vss is turned off, thereby completely reducing the potential of the internal circuit to Vss in the sleep mode. Thus, the power consumption of the internal circuit becomes 0.

In this case, an internal VHH signal which has a pulse width smaller than that of the internal power voltage Vint (used in place of the external power voltage Vcc) is generated by a selection delaying circuit shown in FIGS. 27A and 27B, and the bias conditions for the memory cell transistor is controlled so as to prevent leakage of cell data when the internal power supply is turned on and off and is in the off state.

The internal power voltage Vint may be equal to the external power voltage Vcc, or may be lower than Vcc in order to enhance the reliability and reduce the power consumption in the active mode.

Seventeenth Embodiment

FIGS. 28A and 28B are sectional views, showing an element structure according to a seventeenth embodiment of the invention.

If in the case of using memory cells with SOI transistors, the transistor has excellent cut-off characteristics, the time for which the power supply can be kept in the off state can be increased and accordingly the power consumption can be reduced.

FIG. 28A shows a method for reducing the cut-off leak current, in which the amount of leak current is minimized by reducing the thickness of only the channel through which the current leaks.

FIG. 28B shows a method for reducing the cut-off leak current by inserting an insulator or a semi-insulator in part of the channel. In this case, the power-on current may be reduced together with the cutoff leak current. However, since it is not necessary to increase the driving ability of each memory cell transistor of the DRAM at the time of power-on, it is important to reduce the cut-off leak current even if the power-on current is reduced together.

Eighteenth Embodiment

FIGS. 29A and 29B show an eighteenth embodiment of the invention. FIG. 29A is a circuit diagram, while FIG. 29B is a view of signal waveforms.

To fix the word line power voltage itself to 0 V when the power supply is turned on or off or is in the off state, there is another method for preventing non-selected word lines from floating or exceeding 0 V because of an erroneous operation then.

To this end, the external VHH signal is shifted to high level after power-on, and to low level before power-off. As a result, an internal VHH0 signal and an internal VHH1 signal are created. The internal VHH0 signal is shifted to high level slightly after the internal VHH1 signal is shifted to high level, and is shifted to low level slightly before the internal VHH1 signal is shifted to low level.

The power supply is turned on before the VHH0 and VHH1 signals are shifted to high level, and the block selecting address and the row address are settled in the standby mode, thereby preventing erroneous operations. When the VHH0 signal is shifted to high level, the internal booster circuit operates to boost the word line driving power voltage VSV. To prevent an increase in the level of the non-selected word lines because of an erroneous operation at the time of power-off, the potential VSV is reduced to Vss by the external VHH signal before the turn off of the power supply, and then the power supply is turned off. It is a matter of course to keep VSV at Vss in the off state of the power supply. As a result, an increase in the levels of the non-selected word lines is avoided, and accordingly loosing of cell data is avoided.

A transistor Q111 is provided for setting VSV to Vss when the power supply is in the on state and the VHH0 signal is at low level. Thus, VSV can quickly be set to Vss when the VHH0 signal is set to low level before turn off of the power supply.

The above operation can prevent the potential VSV from leaking to the word lines WL because of erroneous operations in the VSV potential line of VSV, WDRV0 and WL0. However, if a transistor Q108 is turned on and a transistor Q109 is turned off because of an erroneous operation, of if both the transistors Q108 and Q109 are turned off, the word lines WL may float. At this time, it is possible that the levels of the word lines WL become higher than 0 V because of noise generated from the cell array, etc. at the time of power-on or -off. A depletion type nMOS or pMOS transistor as used in FIG. 18 can prevent the above.

Nineteenth Embodiment

FIGS. 30A and 30B show a nineteenth embodiment of the invention. Although depletion type nMOS transistors are used in FIG. 29A, depletion type pMOS transistors are used in the nineteenth embodiment. FIG. 30A is a block diagram, while FIG. 30B is a view of signal waveforms.

FIGS. 29A and 30A differ from each other only in gate signals /VHH1 and VHH1' and their control circuits. In the FIG. 29A circuit, the gate signal /VHH1 is set to the potential Vss when the power supply is turned on or off, or is in the off state, and to a negative potential lower than Vss only when the internal VHH1 signal is at high level. Further, the depletion type nMOS transistors are turned off. In this state, the DRAM operates normally. At times other than the above, the gate signal /VHH1 is set to Vss or Vcc (in case A or B shown in FIG. 29B), thereby preventing the floating states of the non-selected word lines WL.

The FIG. 29A circuit employs a circuit consisting of transistors Q110 to Q114, and a negative voltage generator, for promptly returning the /VHH1 signal from the negative potential to the potential Vss before power-off and when the internal VHH1 is shifted from high level to low level. When the power supply is in the on state, a /VB line generates a negative voltage. Using this negative voltage, the VHH1 signal is converted to a potential with an amplitude between Vss and /VB, thereby to control the transistor Q110. As a result, when the VHH1 signal is shifted to low level, the gate potential of the transistor Q110 is reduced to the potential /VB, and the /VHH1 signal is increased to Vss. Also at the time of power-on, the /VHH1 signal is kept at Vss or Vcc unless the VHH1 signal is shifted to high level.

Further, to reliably keep the /VHH1 signal at Vss when the power supply is turned on or off, or is in the off state, a stabilizing capacitor C2 and a resistor R2 are provided. By virtue of them, the /VHH1 signal can be returned to Vss even if noise occurs. If the resistance of the resistor R2 is low, the /VHH signal can easily be set to Vss. In this case, however, the amount of leak current increases in the power-on state, and an effective result cannot be obtained. In light of this, the resistance of the resistor R2 must be set to an appropriate value. The time delay in the generation of the VHH0 signal and the VHH1 signal is provided for eliminating a through current. Preferably, the degree of time delay is set to a minimum value which will not cause the through current.

The FIG. 30A circuit employs substantially the same principle as the FIG. 29A circuit. The former differs from the latter only in that the former uses the VHH1' signal of a positive potential and depletion type pMOS transistors. Although in the FIG. 30A circuit, the VHH1" signal must be reduced to the potential Vss when the VHH signal is shifted to low level, this operation can be realized by simple control using a transistor Q119. This is because no power conversion is necessary in the FIG. 30A circuit, which differs from the FIG. 29A circuit. In addition, the FIGS. 29A and 30A circuits do not require all transistors Q103, Q104, Q105, Q115, Q116 and Q117. It suffices if the lines to be fixed to Vss are controlled to Vss.

The internal VHH1" signal and the internal /VHH1 signal, etc. corresponding to the external VHH signal are generated by some circuits, and show high resistance against noise input through the external VHH pin. For example, if a ring circuit or the pump circuit, such as the booster circuit, does not operate a long time after power-on, the internal VHH1" and /VHH1 signals will not be generated. Further, there are provided stabilizing capacitors C2 and C3, stabilizing resistors R2 and R3, and stabilizing transistors Q103, Q110, Q118 and Q119.

The FIGS. 29A and 30A circuits are disadvantageous in that the VHH1 signal, which has a negative value, makes it difficult to handle a conversion circuit, etc. On the other hand, they are advantageous in that the /VHH1 signal may have an amplitude smaller than the VHH1 signal. This is because a potential higher than the boosted potential VSV is necessary to turn off the transistors Q103, Q104 and Q105, where the boosted potential VSV higher than the potential Vss is applied. On the other hand, the lower limit of the lines VSV, WPRV0, WL, etc. is Vss, and therefore those transistors can be turned off by setting the /VHH1 to a value lower than Vss.

In FIGS. 29A and 22A, address input signal circuits for an array block selector and a row decoder may be formed of a general circuit or that NAND circuit consisting of depletion type transistors, which is similar to that located in front stages of the circuits shown in FIGS. 18 to 20 and 25. Although the FIGS. 18 to 20 circuits employ depletion type pMOS transistors, they may employ depletion type nMOS transistors in place of the pMOS ones, using the /VHH1 signal as the input signal, as in the FIG. 29A circuit.

Twentieth Embodiment

Figure 31A:
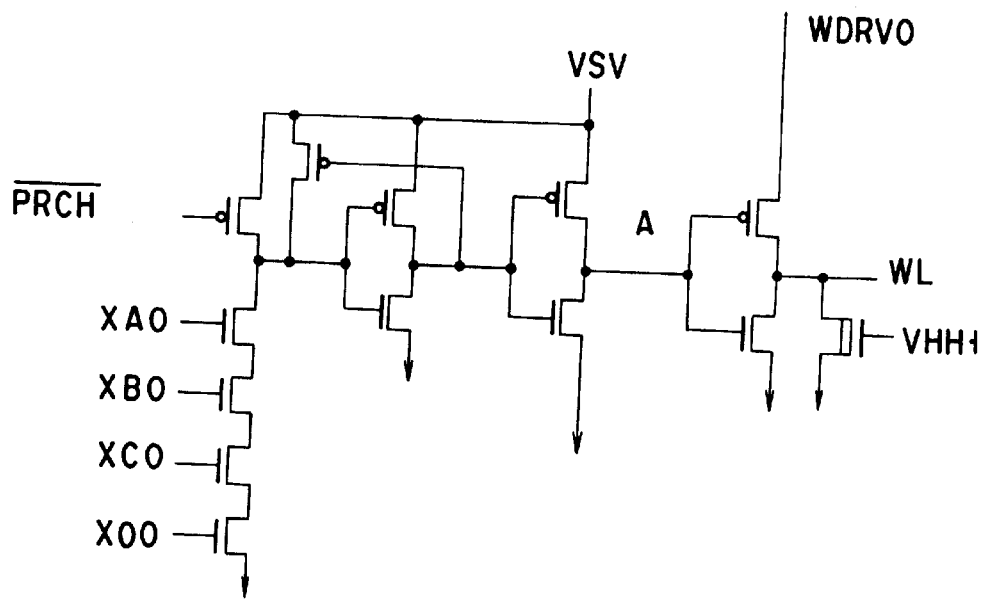
FIGS. 31A to 31C are circuit diagrams and a signal waveform view, respectively, showing a twentieth embodiment of the invention.
Figure 31B:
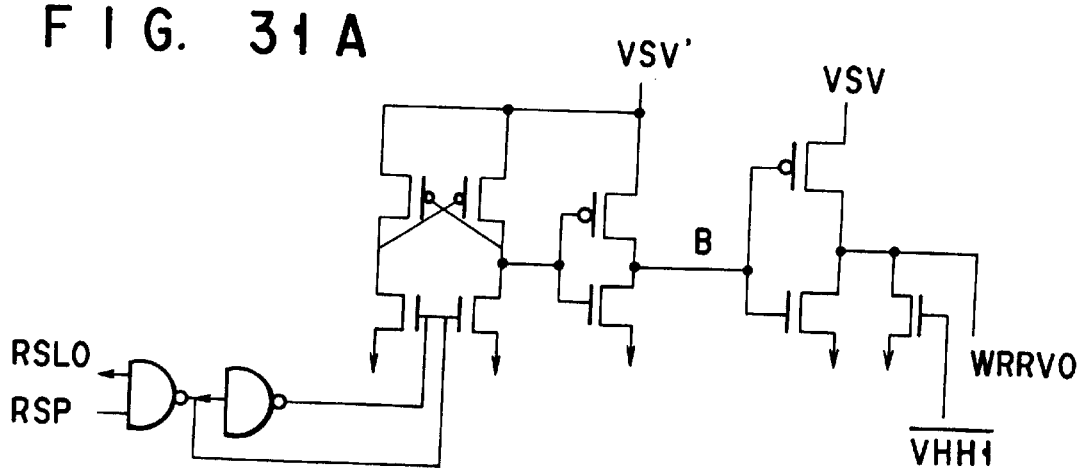
Figure 31C:
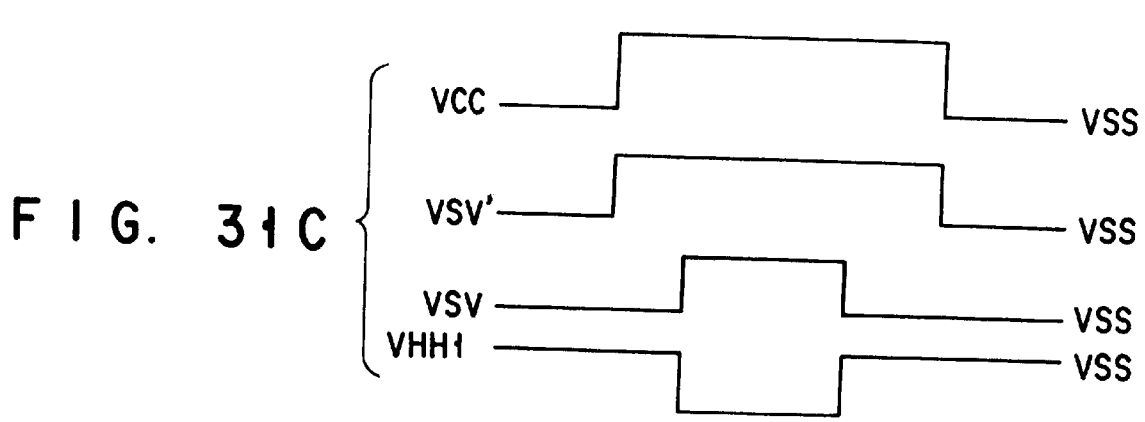

FIGS. 31A through 31C show a twentieth embodiment of the invention. FIGS. 31A and 31B are circuit diagrams, while FIG. 31C is a view of signal waveforms. In this embodiment, no depletion type transistors are employed, and two boosted potentials VSV and VSV' generated from different circuits are used. The boosted potential VSV' is shifted between high and low levels in synchronism with the turn-on and -off of the power supply, and the other boosted potential VSV is shifted to high level after the voltage VSV' is shifted to high level, and VSV is shifted to low level before VSV' is shifted to low level.

Since VSV' is shifted to high level before VSV is shifted to high level, nodes A and B are set at VSV' before VSV is shifted to high level, and accordingly do not receive noise which will occur when VSV is shifted to high level. On the other hand, in a case where VSV=VSV', it is possible that circuits located in front stages will erroneously operate at the time of shifting VSV to high level. Since VSV' is kept at high level at the time of shifting VSV to low level, the circuits in the front stages are set at VSV' and no erroneous operation will occur at the time of shifting VSV to low level.

As described above, erroneous operations can be prevented in circuits located in front stages by using two types of boosted potentials VSV and VSV', or providing depletion type nMOS or pMOS transistors in front stages.

Twenty First Embodiment

Figure 32B:
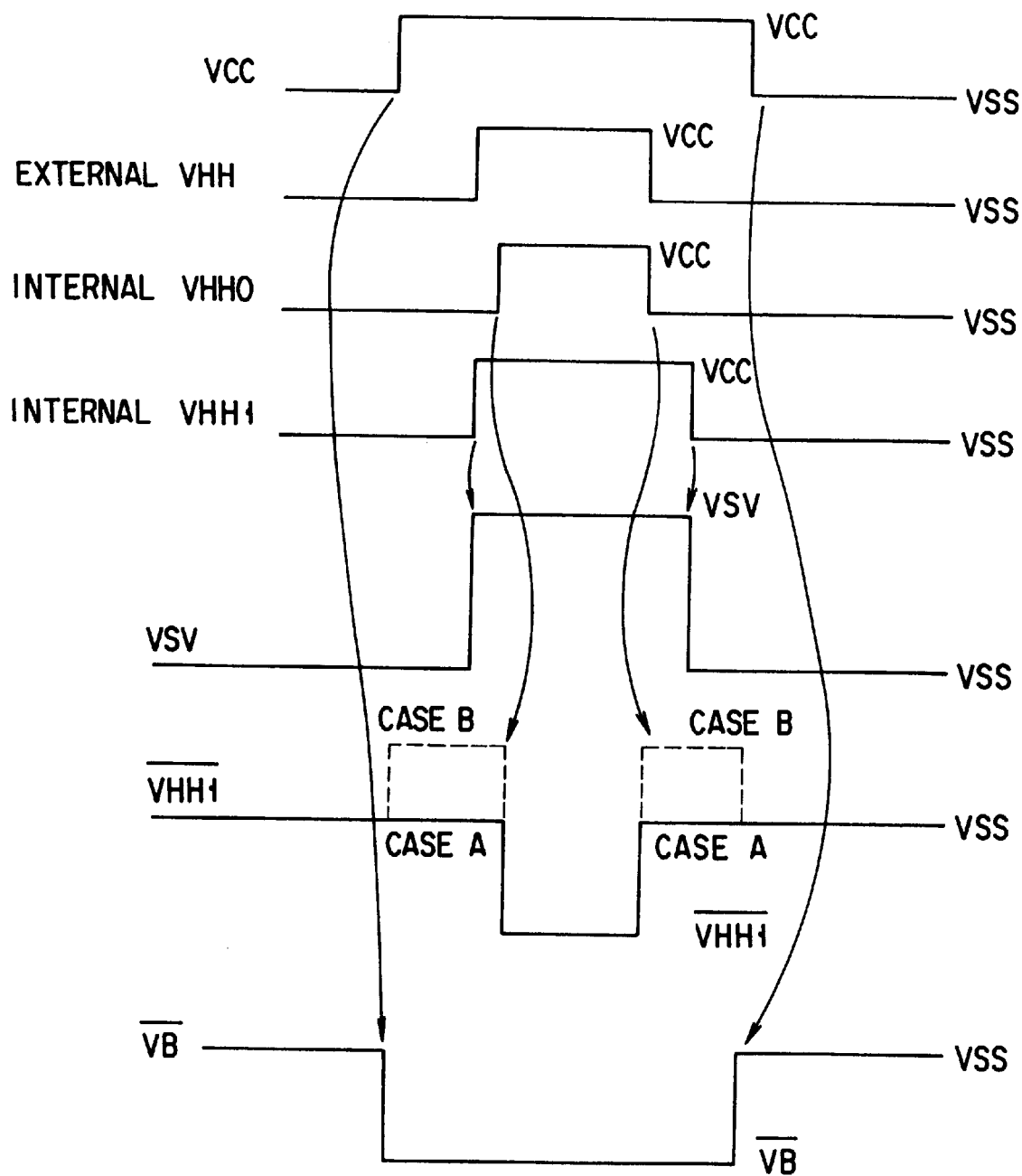

FIGS. 32A and 32B show a twenty first embodiment of the invention. FIG. 32A is a circuit diagram, while FIG. 32B is a view of signal waveforms.

In this embodiment, depletion type transistors are used in place of two types of boosted potentials VSV and VSV' and a NAND circuit, in order to reduce the scale of the circuits located in the front stages. The time points, at which the VSV, /VHH1 and VHH1 signals are shifted between high and low levels, are reverse to those in the case shown in FIGS. 29A and 29B.

Even if control signals for driving the lines WDRV0 and WL erroneously operate at the times of shifting VSV to high and low, thereby allowing the potential VSV to leak to the word lines WL, the level of the lines WL is forced to Vss by the depletion type transistors. However, the transistor Q103 is left to prevent the leakage. If necessary, the VHH1' and /VHH1 signals supplied at different time points may be used.

Twenty Second Embodiment

FIGS. 33A and 33B show a twenty second embodiment of the invention. FIG. 33A is a circuit diagram, while FIG. 33B is a view of signal waveforms.

In this embodiment, depletion type transistors are used in place of two types of boosted potentials VSV and VSV' and a NAND circuit, in order to reduce the scale of the circuits located in the front stages. The time points, at which the VSV, /VHH1 and VHH1 signals are shifted between high and low levels, are reverse to those in the case shown in FIGS. 30A and 30B.

Even if control signals for driving the word line driving signals WDRV0 and the word lines WL erroneously operate at the times of shifting VSV to high and low, thereby allowing the potential VSV to leak to the word lines WL, the level of the lines WL is forced to Vss by the depletion type transistors. However, the transistor Q115 is left to prevent the leakage. If necessary, the VHH1' and /VHH1 signals supplied at different time points may be used.

As explained above with reference to FIGS. 29A to 33B, the external VHH signal is used to set the word line driving voltage VSV to 0 V before power-off, and the voltage VSV is boosted after the power supply is turned on and then a long time passes, in order to prevent non-selected word lines from shifting to a level higher than 0 V at the time of power-on or -off because of an erroneous operation, thereby destructing cell data. Moreover, as shown in FIGS. 5A, 22A and 23A, etc., the plate potential is set to 0 V irrespective of whether the power supply is turned on or off, in order to prevent destruction of "0" data due to reduction of the plate potential from Vcc/2 to 0 V after power-off.

To prove the above, experiments were performed using a 64 Kb DRAM test device. FIGS. 34 to 37 show the experimental results.

Figure 34:
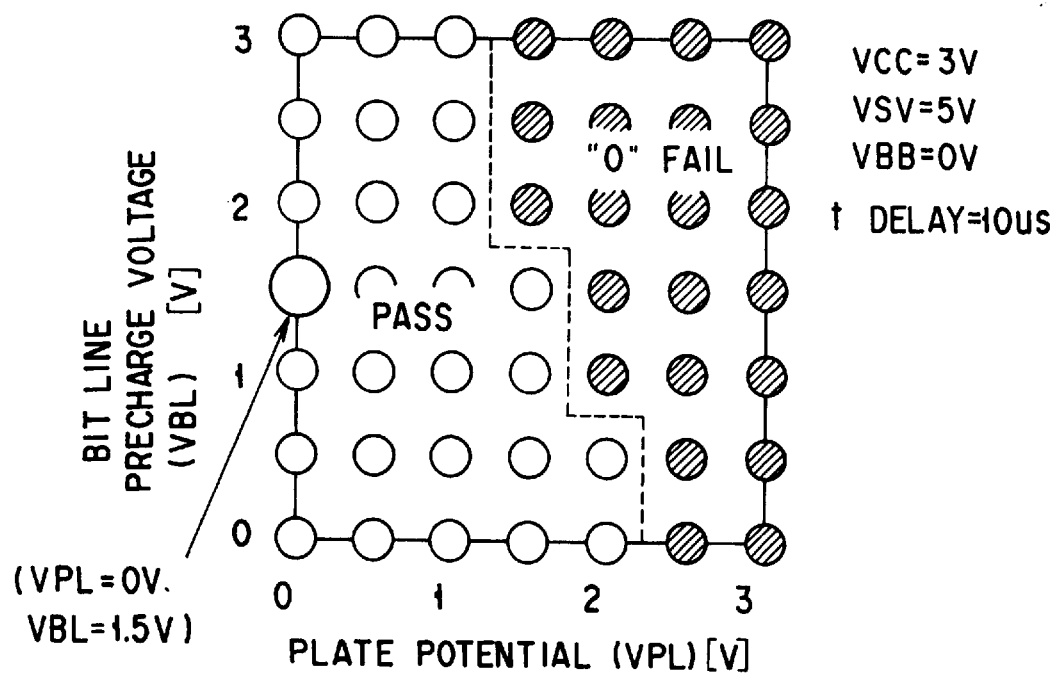
FIG. 34 is a view, showing results of experiments concerning the dependency of the pause characteristics of the invention upon the plate potential.

FIG. 34 shows a result obtained by turning off the power supply after cell data is written, turning on the same 0.4 second after, and then reading the data. In this case, in accordance with the conditions of the invention, the word line driving voltage VSV is set to 0 V tDELAY (10 μS) before power-off, and increased to high level tDELAY (10 μS) after power-on. The plate potential (VPL) and the bit line precharge voltage (VBL) are used as parameters. The result proves that cell data can be held even after the power supply is turned off by setting the word line driving voltage VSV to 0 V before power-off, then increasing the voltage VSV to high level after the power supply is turned on and a predetermined time period passes, and setting the plate electrode to 0 or a value near 0.

Figure 35:
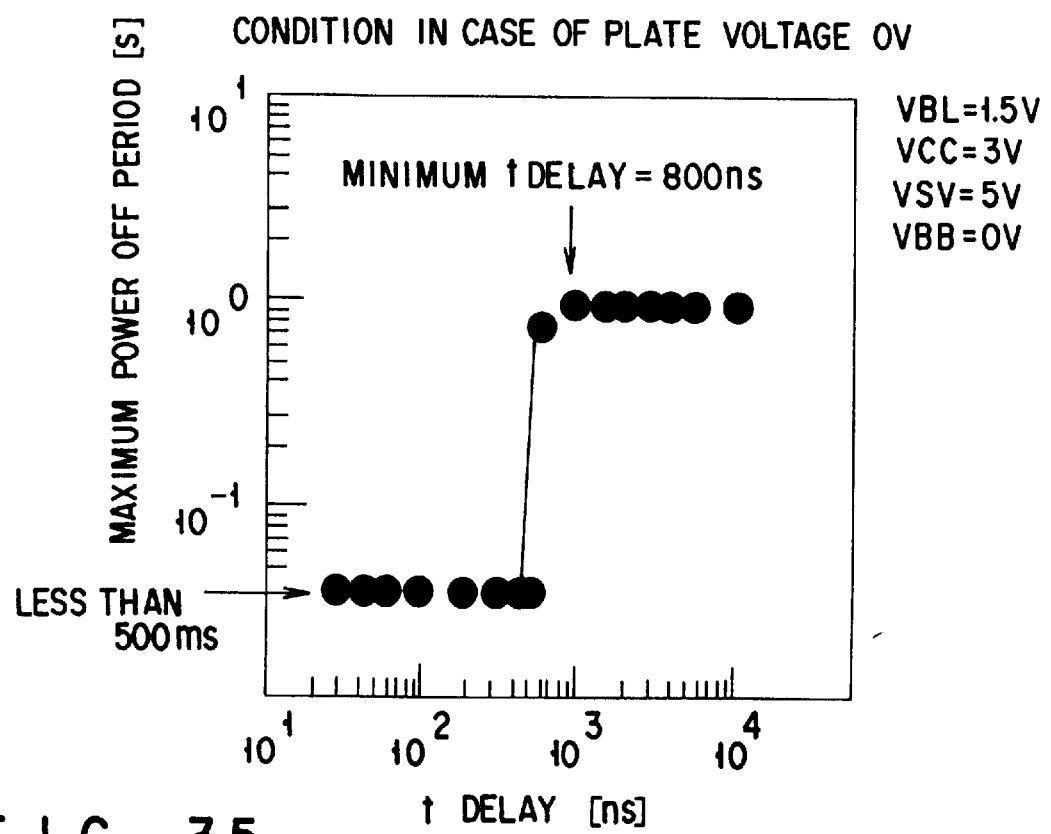
FIG. 35 is a view, showing results of experiments concerning the relationship between the pause characteristics of the invention and a time delay between turn on/off of a word line voltage and that of a power voltage Vcc.

FIG. 35 shows power-off time periods obtained when the plate potential is set to 0 V and the tDELAY is used as a parameter. As is evident from FIG. 35, the word line floating, which may occur because of erroneous selection of a word line when the power supply is turned on and off, can be avoided by keeping the word line driving voltage VSV at 0 V for a tDELAY period of 800 ns or more.

Figure 36:
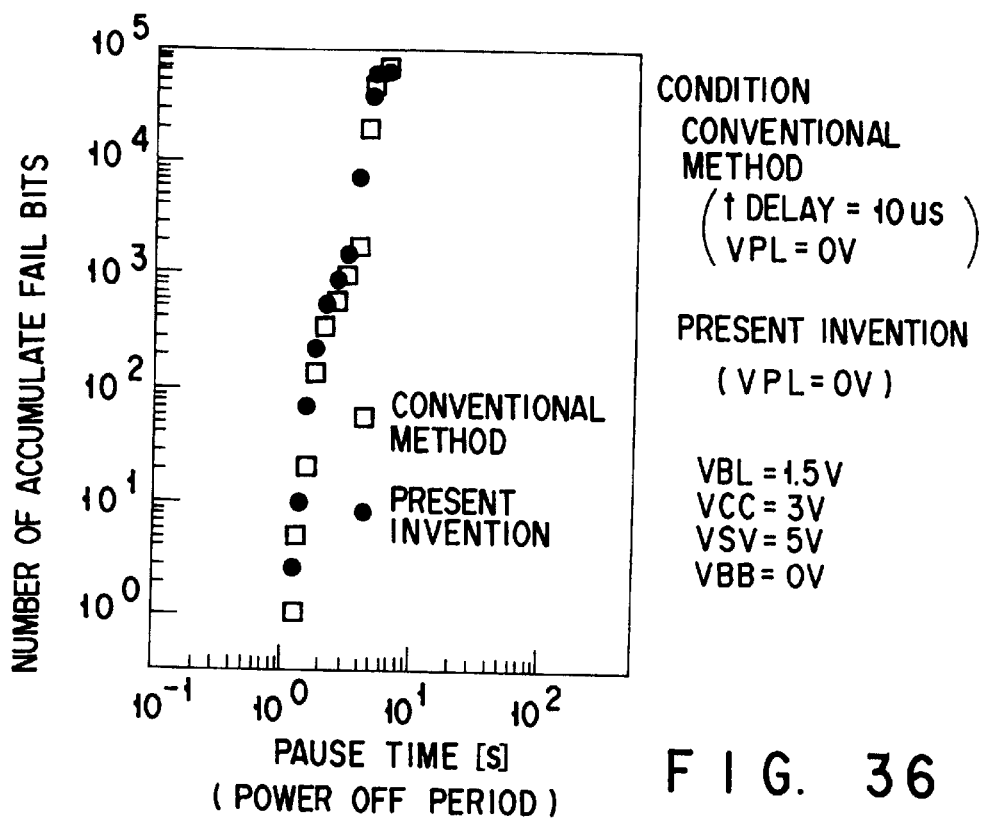
FIG. 36 is a view, showing results of comparative experiments concerning the power-off time periods in the present invention and the pause time periods with the power kept on in the conventional case.

FIG. 36 shows the number of accumulated defective bits contained in data read from the 64 Kb test DRAM, which were obtained under the conditions of VPL=0 V and tDELAY=10 S based on the results of FIGS. 34 and 35, using, as parameters, the data holding time period in the standby mode in the ON-state of the DRAM power supply in the conventional case, and the power-off time period set in the present invention. As is evident from FIG. 36, the defective bit numbers obtained in the conventional case and the present invention are substantially equal to each other.

This means that the present invention can hold cell data to the same degree as the conventional device, although the power supply is turned on and off in the present invention.

Figure 37:
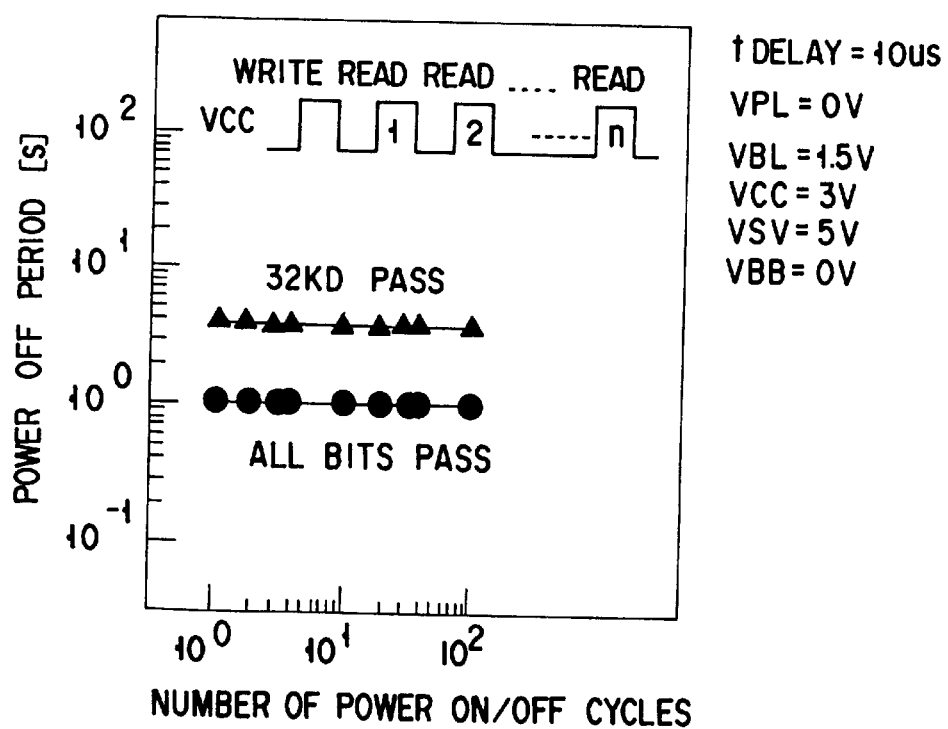
FIG. 37 is a view, showing experimental results obtained when the power supply is turned on and off repeatedly in the present invention.

FIG. 37 shows the results of harder experiments than the above. In this case, the power supply is turned off after data is written in the DRAM, the power supply is then turned on, the data is read, the power supply is turned off and then on, and the data is again read. These operations were repeated such that the power supply was turned on and off 100 times. As can be understood from FIG. 37, during 100 times repetitions of the turn on and off of the power supply, the DRAM can operate in a reliable manner, free from unintentional data destruction or shortening of the power-off time period. Thus, in the present invention, cell data will not be lost even when the power supply is turned on and off. Further, the power-off time period can be elongated if SOI transistors are employed in the memory device. As a result, the present invention can provide a memory device superior to the conventional non-volatile memory devices in that data can be written therein at high speed an infinite number of times.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of word lines;
   a plurality of bit lines intersecting the word lines; and
   memory cells selectively arranged at intersection of the word lines and the bit lines, and each consisting of a transistor and a capacitor, the transistor having a gate connected to a corresponding one of the bit lines, and a source connected to an end of the capacitor and serving as a memory node, in which said memory cells are destructive memory cells whose data are destroyed when the transistor is turned on, the capacitor having another end thereof connected to a plate electrode;
   wherein;
      in an active mode assumed when a power supply is in an on state, the transistor of a memory cell which is connected to a selected one of the word lines is turned on, and those transistors of the other memory cells which are connected to non-selected word lines are in an off state; and
      in a standby mode assumed when the power supply is in the on state, when the power supply is in an off state, and when the power supply is turned on and off, the transistors of all the memory cells are in an off state.

2. The semiconductor memory device according to claim 1, wherein the difference in potential between the word lines and the plate electrode is constant when the transistors are in the off state, irrespective of whether the power supply is in the on state or in the off state, while the potential of the bit lines is equal to or higher than the potential of the word lines when the transistors are nMOS transistors, and is equal to or lower than the potential of the word lines when the transistors are pMOS transistors.

3. The semiconductor memory device according to claim 1, wherein the plate electrode is connected to a potential Vss, in a case where the transistors are nMOS transistors, irrespective of whether the power supply is in the on state or in the off state, and is connected to a power voltage Vcc, in a case where the transistors are pMOS transistors, irrespective of whether the power supply is in the on state or in the off state.

4. The semiconductor memory device according to claim 1, wherein in the off state of the power supply, a node of the word line is connected to a ground potential by means of depletion type pMOS or nMOS transistors, such that the word line is set at the ground potential.

5. The semiconductor memory device according to claim 1, wherein in the off state of the power supply, a node of the bit line is connected to a ground potential by means of depletion type pMOS or nMOS transistors, such that the bit line is set at the ground potential.

6. The semiconductor memory device according to claim 1, wherein a word line driving voltage is equal to the ground potential when the power supply is turned on and off, and is in the off state.

7. The semiconductor memory device according to claim 1, wherein a word line driving power voltage is shifted from low level to high level after the power supply is turned on, and shifted from high level to low level before the power supply is turned off.

8. The semiconductor memory device according to claim 1, wherein the potential of the plate electrode is set, in the on state of the power supply, to a value higher than the ground potential and lower than a threshold voltage VT of the transistor of each memory cell.

9. The semiconductor memory device according to claim 1, wherein each of the transistors is a pMOS transistor or an nMOS transistor formed on an insulating layer.

10. The semiconductor memory device according to claim 9, wherein the difference in potential between the word lines and the plate electrode is constant when the transistors are in the off state, irrespective of whether the power supply is in the on state or in the off state, while the potential of the bit lines is equal to or higher than the potential of the word lines when the transistors are nMOS transistors, and is equal to or lower than the potential of the word lines when the transistors are pMOS transistors.

11. The semiconductor memory device according to claim 9, wherein the plate electrode is connected to a potential Vss, in a case where the transistors are nMOS transistors, irrespective of whether the power supply is in the on state or in the off state, and is connected to a power voltage Vcc, in a case where the transistors are pMOS transistors, irrespective of whether the power supply is in the on state or in the off state.

12. The semiconductor memory device according to claim 9, wherein in the off state of the power supply, a node of the word line is connected to a ground potential by means of depletion type pMOS or nMOS transistors, such that the word line is set at the ground potential.

13. The semiconductor memory device according to claim 9, wherein in the off state of the power supply, a node of the bit line is connected to a ground potential by means of depletion type pMOS or nMOS transistors, such that the bit line is set at the ground potential.

14. The semiconductor memory device according to claim 9, wherein an Si layer which constitutes at least part of a channel portion of each transistor is thinner than the thickness of an Si layer which constitutes the source or drain of the transistor.

15. The semiconductor memory device according to claim 9, wherein a word line driving voltage is equal to the ground potential when the power supply is turned on and off, and is in the off state.

16. The semiconductor memory device according to claim 9, wherein a word line driving power voltage is shifted from low level to high level after the power supply is turned on, and shifted from high level to low level before the power supply is turned off.

17. The semiconductor memory device according to claim 9, wherein the potential of the plate electrode is set, in the on state of the power supply, to a value higher than the ground potential and lower than a threshold voltage VT of the transistor of each memory cell.

18. A semiconductor memory device comprising a semiconductor memory chip which includes:

a plurality of word lines;

a plurality of bit lines intersecting the word lines; and memory cells selectively arranged at intersections of the word lines and the bit lines, and each consisting of a transistor and a capacitor, in which said memory cells are destructive memory cells whose data are destroyed when the transistor is turned on, wherein the semiconductor memory chip has means for receiving, from the outside of the memory chip, a predetermined signal or a predetermined command before turn-on of a power supply, or for detecting the turn-off of the power supply, so that data stored in the memory cells before the turn-off of the power supply can be held even when the power supply is again turned on after the turn-off thereof.

19. A semiconductor memory device comprising:

a memory cell array including a plurality of memory cells selectively arranged at intersections between a plurality of word lines and a plurality of bit lines, each of the memory cells comprising a transistor and a capacitor, in which said memory cells are destructive memory cells whose data are destroyed when the transistor is turned on;

means for reducing the voltage of an external power supply, or a switch interposed between the external power supply, irrespective of whether Vcc is supplied from the external power supply.

20. A semiconductor memory device comprising:

a memory cell array including a plurality of memory cells each having a transistor and a capacitor, in which said memory cells are destructive memory cells whose data are destroyed when the transistor is turned on;

a controller for controlling the memory cell array; and means for turning off a power supply for the controller, while holding data written in the memory cell array.

21. A semiconductor memory device comprising:

a memory cell array including a plurality of memory cells each having a transistor and a capacitor, in which said memory cells are destructive memory cells whose data are destroyed when the transistor is turned on;

a controller for controlling the memory cell array; and means for turning off a power supply for the controller and a power supply for the memory cell array, while holding data written in the memory cell array.

* * * * *